US007572555B2

(12) United States Patent
Takizawa et al.

(10) Patent No.: US 7,572,555 B2
(45) Date of Patent: *Aug. 11, 2009

(54) HOLOGRAM RECORDING MATERIAL, HOLOGRAM RECORDING METHOD AND OPTICAL RECORDING MEDIUM

(75) Inventors: Hiroo Takizawa, Kanagawa (JP); Noriko Inoue, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 553 days.

This patent is subject to a terminal disclaimer.

(21) Appl. No.: 11/237,986

(22) Filed: Sep. 29, 2005

(65) Prior Publication Data
US 2006/0078803 A1 Apr. 13, 2006

(30) Foreign Application Priority Data
Sep. 30, 2004 (JP) ............ P. 2004-286247

(51) Int. Cl.
*G03H 1/02* (2006.01)
*G03C 1/76* (2006.01)

(52) U.S. Cl. .................. 430/1; 430/2; 430/280.1; 430/281.1; 359/3

(58) Field of Classification Search ............ None
See application file for complete search history.

(56) References Cited

U.S. PATENT DOCUMENTS

| 3,615,454 | A | * | 10/1971 | Cescon et al. ............ 430/292 |
| 5,151,520 | A | * | 9/1992 | Gottschalk et al. .......... 126/638 |
| 5,202,221 | A | * | 4/1993 | Imai et al. ............ 430/283.1 |
| 5,665,494 | A | * | 9/1997 | Kawabata et al. ........... 430/2 |
| 6,140,384 | A | * | 10/2000 | Sorori et al. ........... 522/12 |
| 6,482,551 | B1 | * | 11/2002 | Dhar et al. .......... 430/1 |
| 6,740,466 | B1 | * | 5/2004 | Matsumoto et al. ...... 430/270.1 |
| 7,112,616 | B2 | * | 9/2006 | Takizawa et al. ........... 522/8 |
| 2001/0026381 | A1 | * | 10/2001 | Shirakura et al. ........... 359/35 |
| 2004/0086803 | A1 | * | 5/2004 | Takizawa et al. ...... 430/270.18 |
| 2004/0091816 | A1 | * | 5/2004 | Matsumura et al. ...... 430/281.1 |
| 2004/0197670 | A1 | * | 10/2004 | Takeyama ............ 430/1 |
| 2004/0245432 | A1 | * | 12/2004 | Takizawa ........... 250/208.1 |
| 2005/0003133 | A1 | * | 1/2005 | Akiba et al. ............ 428/64.2 |
| 2005/0019711 | A1 | * | 1/2005 | Takizawa ............ 430/561 |
| 2005/0046915 | A1 | * | 3/2005 | Takizawa et al. ............ 359/3 |
| 2005/0058910 | A1 | * | 3/2005 | Takizawa et al. ............ 430/1 |
| 2005/0068593 | A1 | * | 3/2005 | Hayase et al. ............ 359/1 |
| 2005/0214650 | A1 | * | 9/2005 | Takizawa et al. ........... 430/1 |
| 2005/0221198 | A1 | * | 10/2005 | Takizawa et al. ........... 430/1 |
| 2006/0057467 | A1 | * | 3/2006 | Takizawa ............ 430/1 |
| 2006/0083890 | A1 | * | 4/2006 | Takizawa ............ 428/64.1 |

(Continued)

FOREIGN PATENT DOCUMENTS

JP 74015490 * 4/1974

(Continued)

*Primary Examiner*—Martin J Angebranndt
(74) *Attorney, Agent, or Firm*—Sughrue Mion, PLLC

(57) ABSTRACT

A hologram recording material is provided and includes at least a sensitizing dye capable of absorbing light having a hologram recording wavelength to generate an excited state thereof, and an interference fringe-recording component capable of recording interference fringes providing a refractive index modulation by an electron transfer or an energy transfer from the excited state, in which the sensitizing dye in the hologram recording material has a molar absorption coefficient within a range of 1 to 10,000 at the hologram recording wavelength.

17 Claims, 1 Drawing Sheet

U.S. PATENT DOCUMENTS

| | | | |
|---|---|---|---|
| 2006/0188789 A1* | 8/2006 | Takizawa et al. | 430/1 |
| 2006/0188790 A1* | 8/2006 | Takizawa | 430/1 |
| 2006/0194122 A1* | 8/2006 | Takizawa | 430/1 |
| 2007/0047038 A1* | 3/2007 | Takizawa | 359/3 |
| 2007/0048666 A1* | 3/2007 | Takizawa | 430/281.1 |
| 2007/0207390 A1* | 9/2007 | Takizawa et al. | 430/1 |

FOREIGN PATENT DOCUMENTS

| | | | |
|---|---|---|---|
| JP | 02-003082 A | | 1/1990 |
| JP | 03-050588 A | | 3/1991 |
| JP | 05-046061 | * | 2/1993 |
| JP | 05-107999 A | | 4/1993 |
| JP | 6-043634 A | | 2/1994 |
| JP | 06-202543 | * | 7/1994 |
| JP | 08-016078 A | | 1/1996 |
| JP | 11-512847 A | | 11/1999 |
| JP | 2001-523842 A | | 11/2001 |
| WO | WO 97/44365 A1 | | 11/1997 |

* cited by examiner

HOLOGRAM RECORDING MATERIAL, HOLOGRAM RECORDING METHOD AND OPTICAL RECORDING MEDIUM

FIELD OF THE INVENTION

The present invention relates to a hologram recording material and a hologram recording method applicable to a high-density optical recording medium, a three-dimensional display, and a holographic optical element and the like.

BACKGROUND OF THE INVENTION

A general principle of hologram preparation are described in certain literatures and publishings, such as Junpei Tsujiuchi, "*Holographic Display*", published by Sangyo Tosho, chapter 2. In such principle, one of two coherent laser beams irradiates an object to be recorded, and a hologram recording material is placed in a position capable of receiving a total reflected light therefrom. The hologram recording material is irradiated, in addition to the reflected light from the object, directly by the other coherent light beam which arrives without going through the object. The reflected light from the object is called an object light, while the light directly irradiating the recording material is called a reference light, and interference fringes of the reference light and the object light are recorded as image information. Then, when a light (reproducing illumination light) same as the reference light irradiates the processed recording material, it is so diffracted by the hologram as to reproduce a wave front of the reflected light when it at first reaches the recording material from the object at the recording, whereby an object image, substantially same as the real image of the object, can be viewed three-dimensionally.

A hologram prepared by introducing the reference light and the object light from a same direction into the hologram recording material is called a transmission hologram. The interference fringes are formed perpendicularly or almost perpendicularly to the film surface of the recording material, with a pitch of 1000-3000 fringes per millimeter.

On the other hand, a hologram prepared by introducing the reference light and the object light mutually from opposite sides of the hologram recording material is called a reflective hologram. The interference fringes are formed parallel or almost parallel to the film surface of the recording material, with a pitch of 3000-7000 fringes per millimeter.

The transmission hologram can be prepared by a known method described for example in JP-A-6-43634. Also the reflective hologram can be prepared by a known method described for example in JP-A-2-3082 and JP-A-3-50588.

Also, a hologram having a film thickness sufficiently larger than the pitch of the interference fringes (usually a film thickness of about 5 times or more of the pitch of the interference fringes or of about 1 µm or larger) is called a volume hologram.

On the other hand, a hologram having a film thickness of 5 times or less of the pitch of the interference fringes or of about 1 µm or less is called a planar or surface type hologram.

Also a hologram which records interference fringes by an absorption of a dye or silver is called an amplitude hologram, and a hologram which performs a recording by a surface relief formation or a refractive index modulation is called a phase hologram. The amplitude hologram is unfavorable in the efficiency of light utilization because the light absorption significantly decreases a diffraction efficiency or a reflection efficiency of light, and a phase hologram is advantageously employed.

A volume phase hologram can modulate a phase of light without light absorption, by forming a plurality of interference fringes different in the refractive index, instead of the optical absorption, in the hologram recording material.

In particular, the volume phase hologram of reflective type is also called Lippman hologram, and is capable, by a wavelength-selective reflection by Bragg's diffraction, of achieving a full-color image, a reproduction with white light and a high resolution, whereby a high-resolution full-color three-dimensional display can be realized.

Also utilizing the wavelength-selective reflection, it is widely applied to holographic optical elements (HOE) such as a head-up display (HUD) for an automobile, a pickup lens for an optical disk, a head-mount display, a color filter for a liquid crystal display, and a reflecting plate for a reflective liquid crystal display.

In addition, it is commercially practiced or investigated in a lens, a diffraction grating, an interference filter, a coupler for an optical fiber, a photodeflector for a facsimile, a window pane material for a building and the like.

On the other hand, the recent progress of so-called information society rapidly promotes pervasiveness of networks such as Internet and the high-vision TV. Also the broadcasting of the HDTV (high definition television) is planned shortly, and there is anticipated an increasing demand, also in consumer applications, for a high-density recording medium capable of recording image information of 100 GB or more inexpensively and easily.

Also the progress of the computers toward a higher capacity is promoted, also in business applications such as computer backup or broadcasting backup, a demand for an ultra high-density recording medium capable of inexpensively recording information of a large capacity of about 1 TB or more, at a high speed.

In such trends, a compact and inexpensive optical recording medium, being flexible and capable of random access, is considered promising in comparison with a magnetic tape incapable of random access or a hard disk which is not exchangeable and often causes failures. However, in an existing two-dimensional optical recording medium such as DVD-R, a storage capacity is limited to about 25 GB on one side at maximum because of the physical principle even if a short wavelength is employed for recording and reproduction, and a sufficiently large recording capacity capable of meeting the future demand cannot be anticipated.

Therefore, as an ultimate high-density recording medium, a three-dimensional optical recording medium which performs recording in the direction of thickness is recently attracting attention. Promising candidates for such a purpose include a method utilizing a two-photon absorbing material and a method utilizing holography (interference), and the volume phase hologram recording material is being investigated actively as a three-dimensional optical recording medium (holographic memory).

A holographic memory utilizing a volume phase hologram recording material records a plurality of two-dimensional digital information (also called signal light) utilizing a spatial light modulator (SLM) such as DMD or LCD, instead of an object light reflected from a three-dimensional object. At the recording, there are performed multiplex recording such as an angular multiplexing, a phase multiplexing, a wavelength multiplexing or a shift multiplexing, thereby realizing a capacity as high as 1 TB. Also a readout operation is performed with a CCD or a CMOS sensor, and a transfer rate as high as 1 Gbps can be realized by parallel writing and readout.

However, requirements for the hologram recording material for such holographic memory are even stricter than those for application for a three-dimensional display or an HOE, as indicated in the following:

(1) a high sensitivity;
(2) a high resolution;
(3) a high diffraction efficiency of hologram;
(4) a dry and rapid processing at the recording;
(5) an ability for multiplex recording (a wide dynamic range);
(6) a low shrinkage after recording; and
(7) a satisfactory storability of hologram.

In particular, the requirement of (1) high sensitivity is chemically contradictory to those of (3) high diffraction efficiency, (4) dry process, (6) low shrinkage after recording and (7) satisfactory storability, and it is difficult to satisfy these requirements at the same time.

The known recording materials for the volume phase hologram include, as a write-once type, a bichromate gelatin system, a bleached silver halide system and a photopolymer system, and, as a rewritable type, a photorefractive system and a photochromic polymer system.

However, among these known recording materials for the volume phase hologram, particularly for the application for a high sensitivity optical recording medium, there has not been known a material that can satisfy all the requirements and an improvement is being desired.

More specifically, for example the bichromate gelatin system has the advantages of a high diffraction efficiency and low noise characteristics, but is associated with drawbacks of an extremely poor storability and a low sensitivity and requiring a wet process, thus being unsuitable for use in the holographic memory.

The bleached silver halide system has an advantage of a high sensitivity, but requires a wet process with a cumbersome bleaching process and is associated with drawbacks of a large scattering and a poor light fastness, thus being generally unsuitable for use in the holographic memory.

The photorefractive material has an advantage of being rewritable, but has drawbacks of requiring an application of a high electric field at the recording and of a poor storability of record.

Also a photochromic polymer system represented by an azobenzene polymer material has an advantage of rewritability, but is associated with drawbacks of an extremely low sensitivity and a poor storability of record. For example WO 97/44365 A1 discloses a rewritable hologram recording material utilizing an anisotropy in refractive index and an alignment control in an azobenzene polymer (photochromic polymer), but such material is far from practical use because of an extremely low sensitivity as it has a low quantum yield in the isomerization of azobenzene and involves an alignment control, and also of a poor storability of record as a trade-off of rewritability.

Among these, a dry process photopolymer system disclosed in JP-A-6-43634, JP-A-2-3082 and JP-A-3-50588 employs a basic composition of a binder, a radical polymerizable monomer and a photopolymerization initiator and creates a difference in the refractive index by employing a compound having an aromatic ring, chlorine or bromine in either of the binder and the radical polymerizable monomer in order to increase the refractive index modulation, whereby the polymerization proceeds with a concentration of the monomer in light parts of the interference fringes and a concentration of the binder in dark parts of the interference fringes, formed at the holographic exposure, thereby genrating a difference in the refractive index. Therefore, it can be considered as a relatively practical system in which a high diffraction efficiency and a dry process can be realized at the same time.

However, such a system involves drawbacks of a poor sensitivity of about $\frac{1}{1000}$ in comparison with the bleached silver halide system, a necessity for a heat fixing treatment as long as almost 2 hours for improving the diffraction efficiency, an inhibition by oxygen of the involved radical polymerization, and a shrinkage of the recording material after exposure and fixation thereby resulting in a change in diffraction wavelength and angle at the reproducing operation, and is hardly usable in the application for a holographic memory.

In general, in comparison with a radical polymerization, a cationic polymerization, particularly a ring-opening cationic polymerization of an epoxy compound or the like, shows a smaller shrinkage after polymerization, also is not subjected to an inhibition of polymerization by oxygen, and provides a film with a rigidity. It is therefore pointed out that a cationic polymerization is more suitable for the application as a holographic memory.

For example, JP-A-5-107999 and JP-A-8-16078 disclose a hologram recording material employing a cationic polymerizable compound (monomer or oligomer) instead of a binder, and further combining a sensitizing dye, a radical polymerization initiator, a cationic polymerization initiator and a radical polymerizable compound.

Also JP-T-2001-523842 and JP-T-11-512847 disclose a hologram recording material not utilizing a radical polymerization but employing a sensitizing dye, a cationic polymerization initiator, a cationic polymerizable compound and a binder only.

However, these cationic polymerization systems, though showing an improvement in the shrinkage rate in comparison with the radical polymerization system, show a decreased sensitivity as a trade-off, which will lead to a major drawback in the transfer rate in the practice. These systems also show a lowered diffraction efficiency, which will lead to drawbacks in an S/N ratio and a multiplex recordability.

As the photopolymer system involves a material transfer, in the application to a holographic memory, there results a dilemma as explained in the foregoing that an improved storability and a reduced shrinkage lead to a decreased sensitivity (cationic polymerization system) and an improved sensitivity leads to a loss in the storability and the shrinkage (radical polymerization system).

Also in order to increase the recording density of a holographic memory, there is required multiplex recording of 50 times or more and preferably 100 times or more, and, in the photopolymer system utilizing a polymerization process involving a material transfer for recording, the recording speed becomes lower in a latter stage of the multiplex recording where a large proportion of the compound has already polymerized in comparison with an initial stage of the multiplex recording, and it is practically difficult to regulate the exposure amount and to obtain a wide dynamic range by controlling such difference in the recording speed.

The aforementioned trade-off among a high sensitivity, a satisfactory storability, a low shrinkage and a dry process, and the limitation in the multiplex recordability (high recording density) are difficult to avoid, because of the physical laws, within the related-art photopolymer system. It is also difficult to meet the requirements for the holographic memory in the silver halide system, particularly in principle in achieving dry process.

Therefore, in order to apply a hologram recording material to a holographic memory, it is strongly desired to develop a totally novel recording method capable of fundamentally resolving such drawbacks, particularly attaining a high sensitivity, a low shrinkage, a satisfactory storability, a dry processability and a multiplex recordability at the same time.

Also in the related-art applications of the display hologram or the holographic optical element, a film thickness of the hologram recording material can be several tens of micrometers or less, but, in the holographic memory, there is required a film thickness of 100 μm or larger, and as large as 500 μm to 1 mm in certain cases, in order to attain a multiplicity (recording density). For increasing the multiplicity, the hologram recording light has to be transmitted much even in such film thickness, but the known sensitizing dye generally has a molar absorption coefficient as large as 10,000 to 100,000 at the hologram recording wavelength. Therefore, for attaining a high transmittance at such film thickness, an amount of addition of the sensitizing dye has to be maintained at an extremely low level, thus resulting in a significant loss in the sensitivity.

SUMMARY OF THE INVENTION

An object of an illustrative, non-limiting embodiment of the present invention is to provide a hologram recording material and a hologram recording method capable of attaining a high sensitivity, a high diffraction efficiency, a satisfactory storability, a low shrinkage, a dry processability and a multiplex recording property (high recording density) at the same time and applicable to a high-density optical recording medium, a three-dimensional display, a holographic optical element and the like. It is also to provide, for attaining a high recording density by multiplex recording of a large number especially in a high-density optical recording medium, a sensitizing dye which transmits a large amount of the hologram recording light and can be used with a high sensitivity even in a thick hologram recording material with a film thickness of 100 μm or larger, or 500 μm or larger.

As a result of intensive investigations of the present inventors, the objectives of the present invention have been attained by following means.

(1) A hologram recording material characterized by including at least a sensitizing dye capable of absorbing light having a hologram recording wavelength to generate an excited state thereof, and an interference fringe-recording component capable of recording interference fringes providing a refractive index modulation by an electron or energy transfer from the excited state, and in that the sensitizing dye in the hologram recording material has a molar absorption coefficient within a range of 1 to 10,000 at the hologram recording wavelength.

(2) A hologram recording material described in (1), characterized in that the sensitizing dye in the hologram recording material has a molar absorption coefficient within a range of 1 to 5,000 at the hologram recording wavelength.

(3) A hologram recording material described in (1) or (2), characterized in that the sensitizing dye in the hologram recording material has a molar absorption coefficient within a range of 5 to 2,500 at the hologram recording wavelength.

(4) A hologram recording material described in any one of (1) to (3), characterized in that the sensitizing dye in the hologram recording material has a molar absorption coefficient within a range of 10 to 1,000 at the hologram recording wavelength.

(5) A hologram recording material described in any one of (1) to (4), characterized in that the sensitizing dye in the hologram recording material has an absorption maximum within a region shorter in wavelength than the hologram recording wavelength by 20 to 100 nm.

(6) A hologram recording material described in any one of (1) to (5), characterized in that the sensitizing dye in the hologram recording material has an absorption maximum within a region shorter in wavelength than the hologram recording wavelength by 25 to 50 nm.

(7) A hologram recording material described in any one of (1) to (6), characterized in that the sensitizing dye in the hologram recording material has a molar absorption coefficient equal to or less than ⅕ of the molar absorption coefficient at an absorption maximum thereof (8) A hologram recording material described in any one of (1) to (7), characterized in that the sensitizing dye in the hologram recording material has a molar absorption coefficient equal to or less than 1/10 of the molar absorption coefficient at an absorption maximum thereof.

(9) A hologram recording material described in any one of (1) to (8), characterized in that the sensitizing dye in the hologram recording material has a molar absorption coefficient equal to or less than 1/20 of the molar absorption coefficient at an absorption maximum thereof.

(10) A hologram recording material described in any one of (1) to (9), characterized in that the sensitizing dye in the hologram recording material has a molar absorption coefficient equal to or less than 1/50 of the molar absorption coefficient at an absorption maximum thereof.

(11) A hologram recording material described in any one of (1) to (10), characterized in that the sensitizing dye is a Ru complex dye, a ferrocene derivative, a cyanine dye or a merocyanine dye.

(12) A hologram recording material described in any one of (1) to (11), characterized in that the sensitizing dye is a cyanine dye or a merocyanine dye.

(13) A hologram recording material described in any one of (1) to (12), characterized in that the sensitizing dye is a cyanine dye represented by formula (1):

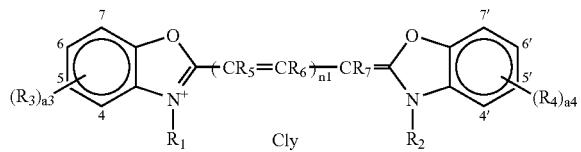

wherein $R_1$ and $R_2$ each independently represents an alkyl group, an alkenyl group, an alkynyl group or a cycloalkyl group; $R_3$ and $R_4$ each independently represents a substituent; and a3 and a4 each independently represents an integer of 0 to 4, and in case a3 or a4 is 2 or larger, plural $R_3$s or $R_4$s may be mutually same or different or may be mutually bonded to form a ring; $R_5$, $R_6$ and $R_7$ each independently represents a hydrogen atom or a substituent, and may be mutually bonded to form a ring; n1 represents an integer of 0 to 2; CI represents a charge neutralizing ion; and y represents a number required for neutralizing the charge.

(14) A hologram recording material described in (13), characterized in that, in the formula (1), $R_5$, $R_6$ and $R_7$ each independently represents a hydrogen atom or an alkyl group.

(15) A hologram recording material described in (13) or (14), characterized in that, in the formula (1), $R_5$, $R_6$ and $R_7$ each independently represents a hydrogen atom, a methyl group or an ethyl group.

(16) A hologram recording material described in any one of (13) to (15), characterized in that, in the formula (1), $R_1$ and $R_2$ each independently represents a an alkyl group.

(17) A hologram recording material described in any one of (13) to (16), characterized in that, in the formula (1), $R_1$ and $R_2$ are mutually same.

(18) A hologram recording material described in any one of (13) to (17), characterized in that, in the formula (1), $R_3$ and $R_4$ each independently represents an alkyl group, an aryl group, an alkoxy group, a halogen atom, a sulfamoyl group, an alkoxycarbonyl group, a carbamoyl group, or a cyano group.

(19) A hologram recording material described in any one of (13) to (18), characterized in that, in the formula (1), a3 and a4 each independently represents an integer of 0-2.

(20) A hologram recording material described in any one of (13) to (19), characterized in that, in the formula (1), a3 and a4 each independently represents 0 or 1.

(21) A hologram recording material described in any one of (13) to (20), characterized in that, in the formula (1), $R_3$ is substituted in 5-position or 6-position and $R_4$ is substituted in 5'-position or 6'-position.

(22) A hologram recording material described in any one of (13) to (21), characterized in that, in the formula (1), $R_3$ is substituted in 5-position and $R_4$ is substituted in 5'-position.

(23) A hologram recording material described in any one of (13) to (20), characterized in that, in the formula (1), a3 and a4 are both 0.

(24) A hologram recording material described in any one of (13) to (23), characterized in that, in the formula (1), n1 represents 0 or 1.

(25) A hologram recording material described in any one of (13) to (24), characterized in that, in the formula (1), n1 is 1; and the hologram recording wavelength is 532 nm.

(26) A hologram recording material described in any one of (13) to (25), characterized in that, in the formula (1), a3 and a4 are both 0; n1 is 1; and the hologram recording wavelength is 532 nm.

(27) A hologram recording material described in any one of (13) to (24), characterized in that, in the formula (1), n1 is 0; and the hologram recording wavelength is within a range of 405-415 nm.

(28) A hologram recording material described in (11) or (12), characterized in that the sensitizing dye is a merocyanine dye having a thiobarbituric or barbituric acid nucleus.

(29) A hologram recording material described in (11), (12) or (28), characterized in that the sensitizing dye is a merocyanine dye represented by formula (2):

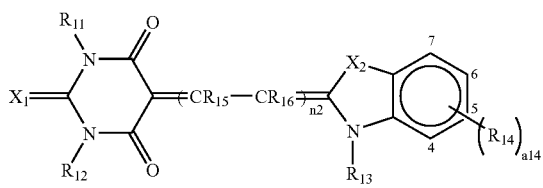

wherein $X_1$ represents O or S; $X_2$ represents —O—, —S—, —$NR_{17}$—, or —$CR_{18}R_{19}$—; $R_{11}$ and $R_{12}$ each independently represents a hydrogen atom, an alkyl group, an alkenyl group, an alkynyl group, a cycloalkyl group, an aryl group or a heterocyclic group; $R_{17}$, $R_{18}$ and $R_{19}$ each independently represents an alkyl group, an alkenyl group, an alkynyl group, a cycloalkyl group, an aryl group or a heterocyclic group; $R_{13}$ represents an alkyl group, an alkenyl group, an alkynyl group, or a cycloalkyl group; $R_{14}$ represents a substituent; a14 represents an integer of 0 to 4, and in case a14 is 2 or larger, plural $R_{14}$s may be mutually same or different or may be mutually bonded to form a ring; $R_{15}$ and $R_{16}$ each independently represents a hydrogen atom or a substituent, and may be mutually bonded to form a ring; and n2 represents an integer of 0 to 2.

(30) A hologram recording material described in (29), characterized in that, in the formula (2), $R_{13}$, $R_{17}$, $R_{18}$ and $R_{19}$ each independently represents an alkyl group.

(31) A hologram recording material described in (29) or (30), characterized in that, in the formula (2), $R_{11}$ and $R_{12}$ each independently represents an alkyl group or an aryl group.

(32) A hologram recording material described in any one of (29) to (31), characterized in that, in the formula (2), $R_{15}$ and $R_{16}$ each independently represents a hydrogen atom or an alkyl group.

(33) A hologram recording material described in any one of (29) to (32), characterized in that, in the formula (2), $R_{14}$ represents an alkyl group, an aryl group, an alkoxy group, a halogen atom, a sulfamoyl group, an alkoxycarbonyl group, a carbamoyl group, or a cyano group.

(34) A hologram recording material described in any one of (29) to (33), characterized in that, in the formula (2), a14 represents an integer of 0-2.

(35) A hologram recording material described in any one of (29) to (34), characterized in that, in the formula (2), a14 represents 0 or 1.

(36) A hologram recording material described in any one of (29) to (35), characterized in that, in the formula (2), a14 is substituted in 5-position or 6-position.

(37) A hologram recording material described in any one of (29) to (36), characterized in that, in the formula (2), a14 is substituted in 5-position.

(38) A hologram recording material described in any one of (29) to (37), characterized in that, in the formula (2), n2 represents 0 or 1.

(39) A hologram recording material described in any one of (29) to (38), characterized in that, in the formula (2), n2 is 1; and a hologram recording wavelength is 532 nm.

(40) A hologram recording material described in any one of (29) to (38), characterized in that, in the formula (2), n2 is 0; and the hologram recording wavelength is within a range of 405-415 nm.

(41) A hologram recording material described in any one of (1) to (40), characterized by having a thickness (film thickness) of 100 μm or larger, and having the sensitizing dye in such an amount as to obtain an optical transmittance of 10 to 99% when the hologram recording material is irradiated with a light of a hologram recording wavelength.

(42) A hologram recording material described in any one of (1) to (41), characterized by having a film thickness of 100 μm or larger, and having the sensitizing dye in such an amount as to obtain an optical transmittance of 20 to 95% when the hologram recording material is irradiated with a light of a hologram recording wavelength.

(43) A hologram recording material described in any one of (1) to (42), characterized by having a film thickness of 100 μm or larger, and having the sensitizing dye in such an amount as to obtain an optical transmittance of 30 to 90% when the hologram recording material is irradiated with a light of a hologram recording wavelength.

(44) A hologram recording material described in any one of (1) to (43), characterized by having a film thickness of 100 μm or larger, and having the sensitizing dye in such an amount as to obtain an optical transmittance of 40 to 85% when the hologram recording material is irradiated with a light of a hologram recording wavelength.

(45) A hologram recording material described in any one of (1) to (44), characterized by having a film thickness of 200 μm or larger.

(46) A hologram recording material described in any one of (1) to (45), characterized by having a film thickness of 500 μm or larger.

(47) A hologram recording material described in any one of (1) to (46), characterized in that the interference fringe-recording component is a component capable of recording interference fringes providing a refractive index modulation by at least one of 1) a polymerization reaction, 2) a color developing reaction, 3) a color developing reaction amplified by a self-sensitization with a color developed substance of a latent image, 4) a polymerization reaction sensitized with a color developed substance of a latent image, 5) an alignment change in a compound having a specific birefringence, 6) a color erasing reaction of a dye, and 7) a latent image-sensitized polymerization reaction sensitized by a latent image of a residual of a color-erasable dye.

(48) A hologram recording material described in (47), characterized in that the interference fringe-recording component is a component capable of recording the interference fringes by 3) the color developing reaction amplified by the self-sensitization with the color developed substance of the latent image, and in that the component records the interference fringes by: a first step of generating a color developed substance as a latent image by holographic exposure, the color developed substance having no absorption in a wavelength of a hologram reproducing light; and a second step of irradiating the latent image of the color developed substance with light of a wavelength region, which is different from that of the holographic exposure and in which the sensitizing dye has a molar absorption coefficient of 5,000 or less, to self-sensitize and self-amplify the color developed substance, in which these steps are performed in dry process.

(49) A hologram recording material described in (47) or (48), characterized by including, as a group of compounds capable of a hologram recording by at least one of 2) the color developing reaction and 3) the color developing reaction amplified by the self-sensitization with the color developed substance of the latent image, described in (47), at least:
  1) a sensitizing dye capable of absorbing light upon holographic exposure thereby generating an excited state thereof; and
  2) an interference fringe-recording component containing a dye precursor capable of forming a color developed substance having an absorption shifted to a longer wavelength than that in an original state and having no absorption in a wavelength of a hologram reproducing light, and capable of recording interference fringes providing a refractive index modulation through a color development by an electron or energy transfer from the excited state of the sensitizing dye or from an excited state of the color developed substance.

(50) A hologram recording material described in (47), characterized in that the interference fringe-recording component is a component capable of recording the interference fringes by 4) the polymerization reaction sensitized with the color developed substance of the latent image, and in that the component records the interference fringes by: a first step of generating a color developed substance as a latent image by holographic exposure, the color developed substance having no absorption in a wavelength of a hologram reproducing light; and a second step of irradiating the latent image of the color developed substance with light of a wavelength region, which is different from that of the holographic exposure, to cause a polymerization reaction, in which these steps are performed in dry process.

(51) A hologram recording material described in (50), characterized by including, as a group of compounds capable of a hologram recording, at least:
  1) a sensitizing dye capable of absorbing light upon holographic exposure in the first step thereby generating an excited state thereof;
  2) a dye precursor capable of forming a color developed substance having an absorption shifted to a longer wavelength than that in an original state, also having an absorption in a wavelength region in which the sensitizing dye has a molar absorption coefficient of 5,000 or less and having no absorption in a wavelength of a hologram reproducing light, by an electron or energy transfer from the excited state of the sensitizing dye in the first step or from an excited state of the color developed substance in the second step;
  3) a polymerization initiator capable of initiating a polymerization of a polymerizable compound by an electron or energy transfer from an excited state of the sensitizing dye in the first step or from an excited state of the color developed substance in the second step;
  4) a polymerizable compound; and
  5) a binder.

(52) A hologram recording material described in (47), characterized by including, as a group of compounds capable of hologram recording by 6) the color erasing reaction of the dye, at least:
  1) a sensitizing dye capable of absorbing light upon holographic exposure thereby generating an excited state; and
  2) a color-erasable dye, or a color-erasing agent precursor and a color-erasable dye, as an interference fringe-recording component;

in which the sensitizing dye generates an excited state thereof by holographic exposure, and performs an energy or electron transfer directly to the color-erasable dye to cause a color erasure thereof or performs an energy transfer or an electron transfer to the color-erasing agent precursor to generate a color-erasing agent which causes a color erasure of the color-erasable dye, thereby forming interference fringes providing a refractive index modulation; and in that the color-erasing agent precursor is at least one of a radical generator, an acid generator, a base generator, a nucleophilic agent generator, an electrophilic agent generator or a triplet oxygen.

(53) A hologram recording material described in (47) or (52), characterized in that the interference fringe-recording component is a component capable of recording the interference fringes by 7) the latent image-sensitized polymerization reaction sensitized by the latent image of the residual of the color-erasable dye, and in that the component records the interference fringes by: a first step in which a sensitizing dye having an absorption at a wavelength of holographic exposure (i.e., a hologram recording wavelength) absorbs light upon the holographic exposure thus generating an excited state thereof, and performs an energy or electron transfer directly to a color-erasable dye to cause a color erasure thereof or performs an energy transfer or an electron transfer to a color-erasing agent precursor described in (52) to generate a color-erasing agent which causes a color erasure of the color-erasable dye, thereby forming a latent image of a residual of the color-erasable dye; and a second step of irradiating the latent image of the residual of the color-erasable dye with light of a wavelength region, which is different from that of the holographic exposure, to activate a polymerization initiator by an energy or electron transfer thereby generating a polymerization reaction.

(54) A hologram recording material described in (53), characterized by including, as a group of compounds capable of a hologram recording, at least:
1) a sensitizing dye capable of absorbing light upon holographic exposure in the first step thereby generating an excited state thereof;
2) a color-erasable dye having a molar absorption coefficient of 1,000 or less at a wavelength of a hologram reproducing light, capable of a color erasure as a result, in the first step, of an energy or electron transfer directly from the excited state of the sensitizing dye or of generation of the color-erasing agent by an energy or electron transfer to the color-erasing agent precursor;
3) a polymerization initiator capable of initiating a polymerization of a polymerizable compound by an electron transfer or an energy transfer in the second step from an excited state of a residual of the color-erasable dye, in which the polymerization initiator may serve as 2) the color-erasing agent precursor;
4) a polymerizable compound; and
5) a binder.

(55) A hologram recording material described in any one of (1) to (54), characterized by including an electron-donating compound capable of reducing a radical cation of the sensitizing dye.

(56) A hologram recording material described in (55), characterized in that the electron-donating compound is an alkylamine, an aniline, a phenylenediamine, a triphenylamine, a carbazole, a phenothiazine, a phenoxazine, a phenazine, a hydroquinone, a cathecol, an alkoxybenzene, an aminophenol, an imidazole, a pyridine, a metallocene, a metal complex, or semiconductor fine particles.

(57) A hologram recording material described in (55) or (56), characterized in that the electron-donating compound is a triphenylamine, a phenothiazine, a phenoxazine, or a phenazine.

(58) A hologram recording material described in any one of (55) to (57), characterized in that the electron-donating compound is a phenothiazine.

(59) A volume phase hologram recording material characterized by performing a volume phase hologram recording with a hologram recording material described in any one of (1) to (58).

(60) A hologram recording material described in any one of (1) to (59), characterized in that the hologram recording in (1) to (59) is an unrewritable recording (the recorded interference fringes is unrewritable).

(61) A hologram recording method, characterized in that an interference fringe-recording component according to any one of (1) to (60) records interference fringes providing a refractive index modulation by at least one of 1) a polymerization reaction, 2) a color developing reaction, 3) a color developing reaction amplified by a self-sensitization with a color developed substance of a latent image, 4) a polymerization reaction sensitized with a color developed substance of a latent image, 5) an alignment change in a compound having a specific birefringence, 6) a color erasing reaction of a dye, and 7) a latent image-sensitized polymerization reaction sensitized by a latent image of a residual of a color-erasable dye.

(62) A hologram recording method by 3) the color developing reaction amplified by the self-sensitization with the color developed substance of the latent image described in (61), characterized by including at least: a first step of generating a color developed substance, having no absorption in a wavelength of a hologram reproducing light, as a latent image by holographic exposure; and a second step of irradiating the latent image of the color developed substance with light of a wavelength region, which is different from that of the holographic exposure and in which the sensitizing dye has a molar absorption coefficient of 5,000 or less, to generate a color developed substance by a self-sensitized amplification thereby recording the interference fringes providing the refractive index modulation, and in that these steps are performed in dry process.

(63) A hologram recording method by 4) the polymerization reaction sensitized with the color developed substance of the latent image described in (61), characterized by including at least: a first step of generating a color developed substance, having no absorption in a wavelength of a hologram reproducing light, as a latent image by holographic exposure; and a second step of irradiating the latent image of the color developed substance with light of a wavelength region, which is different from that of the holographic exposure, to generate a polymerization reaction thereby recording the interference fringes providing the refractive index modulation, and in that these steps are performed in dry process.

(64) A hologram recording method by 7) the latent image-sensitized polymerization reaction sensitized by the latent image of the residual of the color-erasable dye described in (61), characterized by including at least: a first step in which a sensitizing dye having an absorption at a wavelength of holographic exposure absorbs light upon the holographic exposure thus generating an excited state thereof, and performs an energy or electron transfer directly to a color-erasable dye to cause a color erasure thereof or performs an energy or electron transfer to a color-erasing agent precursor described in (52) to generate a color-erasing agent which causes a color erasure of the color-erasable dye, thereby forming a latent image of a residual of the color-erasable dye; and a second step of irradiating the latent image of the residual of the color-erasable dye with light of a wavelength region, which is different from that of the holographic exposure, to activate a polymerization initiator by an energy or electron transfer thereby initiating a polymerization reaction and recording the interference fringes providing the refractive index modulation.

(65) A hologram recording method utilizing a hologram recording material described in any one of (1) to (60) or described in any one of (61) to (64), characterized in that a multiplex recording is performed by effecting the holographic exposure 10 times or more.

(66) A hologram recording method described in (65), characterized in that the multiplex recording are performed under a constant exposure amount in each holographic exposure.

(67) A hologram recording method described in any one of (61) to (66), characterized by not performing the holographic exposure in wet process. A hologram recording material enabling such process.

(68) A hologram recording material described in any one of (1) to (60), characterized in that a light-shielding filter capable of cutting off a part of ultraviolet, visible and infrared wavelength regions other than those of a recording light and a reproducing light is provided on a front surface and/or a rear surface of the hologram recording material described in any one of (1) to (60).
(69) An optical recording medium including a hologram recording material described in any one of (1) to (60) and (66).
(70) An optical recording medium described in (69), characterized in that a hologram recording material described in any one of (1) to (60) and (66) is stored in a light-shielding cartridge.
(71) A three-dimensional display hologram utilizing a hologram recording material described in any one of (1) to (60) and (66), and a producing method for a three-dimensional display hologram utilizing a hologram recording method described in any one of (61) to (65).
(72) A holographic optical element including a hologram recording material described in any one of (1) to (60) and (66). A producing method for a holographic optical element including a hologram recording method described in any one of (61) to (65).

The present invention allows to provide a hologram recording material and a hologram recording method capable of attaining a high sensitivity, a high diffraction efficiency, a satisfactory storability, a low shrinkage, a dry processability and a multiplex recording property (high recording density) at the same time and applicable to a high-density optical recording medium, a three-dimensional display, a holographic optical element and the like. It also provides a hologram recording material capable, by employing a sensitizing dye satisfying requirements of the invention, particularly in a high-density optical recording medium, of a high sensitivity recording even in a thick hologram recording material of a thickness of 100 µm or larger and also attaining a high recording density by a large number of multiplex recording.

BRIEF DESCRIPTION OF THE DRAWING

The sole FIGURE shows an outline view for explaining the two-beam optical system for holographic exposure. The description of numerical references in the FIGURE is set forth below.

| 10 | YAG laser |
| 12 | laser beam |
| 14 | mirror |
| 20 | beam splitter |
| 22 | beam segment |
| 24 | mirror |
| 26 | spatial filter |
| 40 | beam expander |
| 30 | hologram recording material |
| 28 | sample |
| 32 | He-Ne laser beam |
| 34 | He-Ne laser |
| 36 | detector |
| 38 | rotary stage |

DETAILED DESCRIPTION OF THE INVENTION

Figure 1:
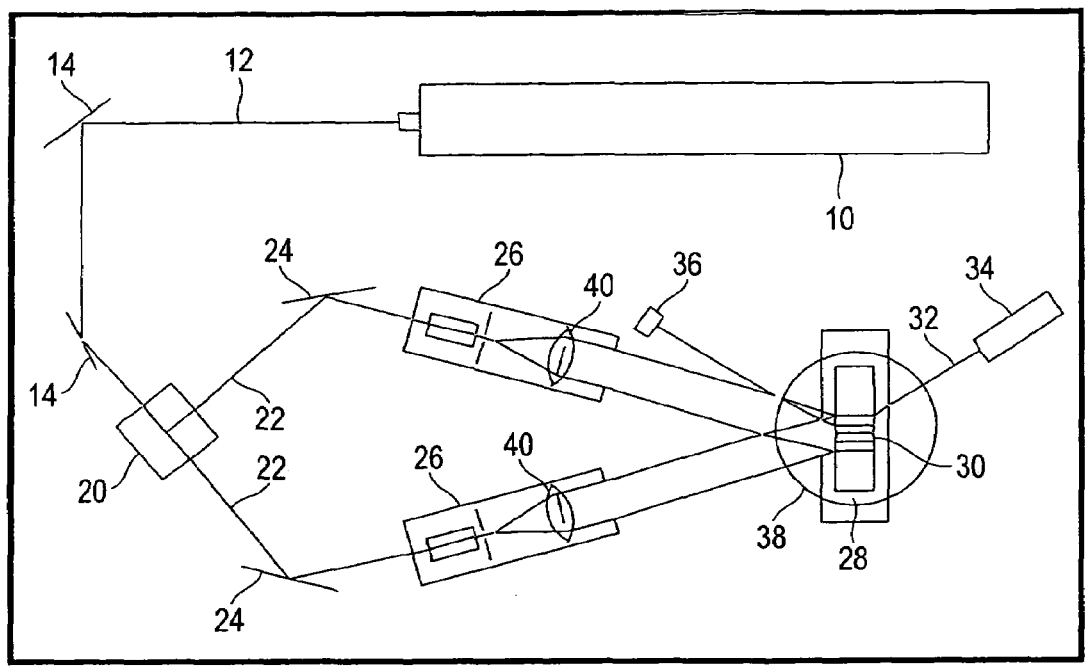

In the following, exemplary embodiments of a hologram recording method and a hologram recording material of the present invention will be explained in detail.

A hologram recording material of the invention is characterized by including at least a sensitizing dye capable of absorbing light having a hologram recording wavelength to generate an excited state thereof, and an interference fringe-recording component capable of recording interference fringes as a refractive index modulation by an electron or energy transfer from the excited state, and in that the sensitizing dye in the hologram recording material has a molar absorption coefficient within a range of 1 to 10,000 at the hologram recording wavelength.

The hologram recording material of the present invention preferably records interference fringes providing a refractive index modulation by any one of 1) a polymerization reaction, 2) a color developing reaction, 3) a color developing reaction amplified by a self-sensitization with a color developed substance of a latent image, 4) a polymerization reaction sensitized with a color developed substance of a latent image, 5) an alignment change in a compound having a specific birefringence, 6) a color erasing reaction of a dye, and 7) a latent image-sensitized polymerization reaction sensitized by a latent image of a residual of a color-erasable dye (a residual color-erasable dye); preferably by any one of 2) a color developing reaction, 3) a color developing reaction amplified by a self-sensitization with a color developed substance of a latent image, 4) a polymerization reaction sensitized with a color developed substance of a latent image, 6) a color erasing reaction of a dye, and 7) a latent image-sensitized polymerization reaction sensitized by a latent image of a residual color-erasable dye; and more preferably by any one of 2) a color developing reaction, 4) a polymerization reaction sensitized with a color developed substance of a latent image, 6) a color erasing reaction of a dye, and 7) a latent image-sensitized polymerization reaction sensitized by a latent image of a residual color-erasable dye, The hologram recording material of the present invention preferably does not is used in wet process.

The hologram recording material of the present invention is preferably an unrewritable system. The unrewritable system indicates a system which is recorded by an irreversible reaction and in which the data once recorded can be stored without being rewritten even in a rewriting operation by overwriting. It is therefore suitable for storage of data that are important and require a prolonged storage. It is however naturally possible to perform a new recording in an area that is not yet recorded. For this reason, it is generally called a "add-on type" or a "write once" type.

Light to be employed in the hologram recording of the invention is preferably any one of an ultraviolet light; a visible light and an infrared light within a wavelength region of 200 to 2,000 nm, more preferably an ultraviolet light or a visible light of a wavelength of 300 to 700 nm, and further preferably a visible light of a wavelength of 400 to 700 nm.

Also a chemically active radiation in the invention is preferably a coherent laser light (aligned in phase and wavelength). The laser to be employed can be a solid-state laser, a semiconductor laser, a gas laser or a liquid laser, and preferred examples of the laser light include a second harmonic wave of 532 nm of a YAG laser, a third harmonic wave of 355 nm of a YAG laser, a light of a GaN laser of about 405-415 nm, a light of an Ar ion laser of 488 or 515 nm, a light of a He—Ne laser of 632 or 633 nm, a light of a Kr ion laser of 647 nm, a light of a ruby laser of 694 nm, and a light of a He—Cd laser of 636, 634, 538, 534 or 442 nm.

Also a pulsed laser of nanosecond or picosecond order can be employed preferably.

In the case of employing the hologram recording material as an optical recording medium, a second harmonic wave of 532 nm of a YAG laser, or a light of a GaN laser of about 405-415 nm is preferably employed.

With respect to the wavelength of the light employed in the holographic exposure (hologram recording), the light for hologram reproduction preferably has a same or longer wavelength, more preferably a same wavelength.

In the hologram recording material of the invention, after the holographic exposure, a fixing step may be performed by light and/or heat.

Particularly in the case of utilizing an acid amplifier or a base amplifier in the hologram recording material of the invention, heating is preferably employed in the fixation also in causing an effective function of the acid amplifier or the base amplifier.

Also in the case of an optical fixation, the entire surface of the hologram recording material is irradiated with an ultraviolet light or a visible light (non-interfering exposure). Preferred examples of a light source to be employed include a visible light laser, an ultraviolet light laser, a carbon arc lamp, a high-pressure mercury lamp, a xenon lamp, a metal halide lamp, a fluorescent lamp, a tungsten lamp, an LED and an organic EL.

In the case of a thermal fixation, the fixing step is preferably performed at 40-160° C., more preferably at 60-130° C.

In the case of performing both an optical fixation and a thermal fixation, the light and the heat may be applied simultaneously or separately.

In the recording of the interference fringes, an amount of refractive index modulation is preferably 0.00001 to 0.5, more preferably 0.0001 to 0.3. The amount of refractive index modulation is preferably smaller for a larger film thickness of the hologram recording material, and is preferably larger for a smaller film thickness of the hologram recording material.

In the hologram recording material, a (relative) diffraction efficiency η is given by a following formula:

$$\eta = I_{diff}/I_0 \quad \text{(equation 1)}$$

wherein $I_0$ is an intensity of an undiffracted transmitted light, and $I_{diff}$ is an intensity of a light diffracted (transmission type) or reflected (reflection type). The diffraction efficiency assumes a value within a range of 0-100%, preferably 30% or higher, more preferably 60% or higher and most preferably 80% or higher.

A sensitivity of the hologram recording material is generally represented by an exposure amount per unit area (mJ/cm²), and a smaller value can be considered to indicate a higher sensitivity. However, a level of the exposure amount selected for representing the sensitivity is variable in various literatures, patents and the like, such as an exposure amount when a recording (refractive index modulation) is initiated, an exposure amount giving a maximum diffraction efficiency (maximum refractive index modulation), an exposure amount giving a diffraction efficiency equal to a half of the maximum diffraction efficiency, or an exposure amount giving a maximum slope of the diffraction efficiency as a function of an exposure amount E.

Also according to Kugelnik's theory, an amount Δn of refractive index modulation for providing a certain diffraction efficiency is inversely proportional to a film thickness d. Therefore a sensitivity for obtaining a certain diffraction efficiency is variable also depending on the film thickness, and a smaller amount Δn of refractive index modulation can be used for a larger film thickness d. Thus, the sensitivity cannot be compared in a simple manner unless conditions such as a film thickness are matched.

In the invention, the sensitivity is defined as "an exposure amount (mJ/cm²) giving a diffraction efficiency equal to a half of the maximum diffraction efficiency". The hologram recording material of the invention, for example of a film thickness of about 10-200 μm, preferably has a sensitivity of 2 J/cm² or less, more preferably 1 J/cm² or less, further preferably 500 mJ/cm² or less, and most preferably 200 mJ/cm² or less.

In the case of utilizing the hologram recording material of the invention as an optical recording medium for a holographic memory, it is preferable to record a plurality of two-dimensional digital information (called signal light), utilizing a spatial light modulator (SLM) such as a DMD or an LCD. For increasing the recording density, the recording is preferably performed by multiplex recording, which can be performed for example by an angular multiplexing, a phase multiplexing, a wavelength multiplexing or a shift multiplexing, among which an angular multiplex recording or a shift multiplex recording is preferably employed. Also for reading the reproduced two-dimensional data, a CCD or a CMOS sensor is preferably employed.

In the case of utilizing the hologram recording material of the invention as an optical recording medium, it is essential to perform multiplex recording for increasing the capacity (recording density). In such a case, it is preferable to perform multiplex recording of 10 times or more (i.e., to effect holographic exposure 10 times or more), more preferably 50 times or more and further preferably 100 times or more. Also it is preferable that the multiplex recording can be performed with a constant exposure amount in any recording, in simplifying the recording system and improving the S/N ratio.

In the case of employing the hologram recording material of the invention for an optical recording medium, the hologram recording material is preferably stored, in a storage state, in a light-shielding cartridge. It is also preferable that the hologram recording material is provided on a front surface and/or a rear surface thereof with a light cut-off filter capable of intercepting a part of the ultraviolet, visible and infrared wavelength regions, excluding the wavelengths of the recording light and the reproducing light.

In the case of employing the hologram recording material of the invention for an optical recording medium, the optical recording medium may have a disk shape, a card shape, a tape shape or any other shape.

In the following there will be explained the hologram recording method of the invention and components of the hologram recording material enabling such a hologram recording method.

1) Interference Fringe-Recording by Polymerization Reaction

This method preferably employs at least a sensitizing dye, a polymerization initiator, a polymerizable compound and a binder, in which the polymerizable compound and the binder have different refractive index and a photopolymerization induced by a light absorption by the sensitizing dye causes an inhomogenization in a composition ratio of the polymerizable compound or a polymerized product thereof and the binder between light parts of the interference fringes and dark parts of the interference fringes, thereby recording interference fringes by a refractive index modulation.

In this case, the polymerization initiator, the polymerizable compound and the binder constitute components for recording the interference fringes.

At first, the sensitizing dye of the invention for absorbing light upon holographic exposure thereby generating an excited state will be explained in detail.

The sensitizing dye of the invention preferably capable of generating an excited state thereof by absorbing any one of an ultraviolet light, a visible light and an infrared light within a wavelength region of 200 to 2,000 nm, more preferably capable of generating an excited state thereof by absorbing an ultraviolet light or a visible light of a wavelength of 300 to 700 nm, and further preferably capable of generating an excited state thereof by absorbing a visible light of a wavelength of 400 to 700 nm.

In the related-art applications of the display hologram or the holographic optical element, a film thickness of the hologram recording material can be several tens of micrometers or less, but, in the holographic memory, there is required a film thickness of 100 μm or larger, and as large as 500 μm to 1 mm in certain cases, in order to attain a multiplicity (recording density). For increasing the multiplicity, the hologram recording light has to be transmitted much even in such film thickness.

Since all the hologram recording methods as explained above rely on an electron or energy transfer from an excited state of the sensitizing dye, a shorter average distance between the sensitizing dye and the interference fringe-recording component is advantageous for achieving a higher sensitivity, and, for this purpose, a molar concentration of the sensitizing dye is preferably as high as possible even by a small amount.

It is therefore preferable, for achieving a high sensitivity, to reduce a molar absorption coefficient of the sensitizing dye at the hologram recording wavelength (holographic exposure wavelength) thereby maximizing the amount of addition of the sensitizing dye.

The sensitizing dye preferably has a molar absorption coefficient at the holographic exposure wavelength of 1 to 10,000, more preferably 1 to 5,000, further preferably 5 to 2,500 and most preferably 10 to 1,000.

Also the sensitizing dye more preferably has $\lambda_{max}$ (absorption maximum) shorter than the hologram recording wavelength, more preferably within a range from a wavelength same as the hologram recording wavelength to a wavelength shorter than the hologram recording wavelength by 100 nm, further preferably within a range shorter than the hologram recording wavelength by 20 to 100 nm. Particularly in case the sensitizing dye is an organic dye such as a cyanine dye or a merocyanine dye, it is more preferably within a range shorter than the hologram recording wavelength by 25 to 50 nm.

Furthermore, in the hologram recording material, the sensitizing dye preferably has a molar absorption coefficient at the hologram recording wavelength equal to or less than ⅕ of the molar absorption coefficient at $\lambda_{max}$ (absorption maximum), more preferably equal to or less than 1/10 (preferably equal to or larger than 1/1000).

Particularly in the case the sensitizing dye is an organic dye such as a cyanine dye or a merocyanine dye, it is more preferably equal to or less than 1/20, further preferably equal to or less than 1/50 and most preferably equal to or less than 1/100.

The hologram recording material of the invention preferably has a thickness (film thickness) of 100 μm or larger, more preferably 200 μm or larger, and most preferably 500 μm or larger. An upper limit of the film thickness is preferably 10 mm or less, more preferably 5 mm or less.

In consideration of a diffraction efficiency, a sensitivity, and a recording density (level of multiplexing) and based on the foregoing, the hologram recording material preferably has a transmittance to the light of the recording wavelength of 10-99% even in a thick film exceeding 100 μn as described above, more preferably 20-95%, further preferably 30-90% and most preferably 40-85%. It is therefore preferable to regulate the molar absorption coefficient of the sensitizing dye at the recording wavelength and the molar concentration thereof according to the thickness of the hologram recording material, so as to attain the aforementioned values.

The sensitizing dye of the invention is preferably a cyanine dye, a squarilium cyanine dye, a styryl dye, a pyrilium dye, a merocyanine dye, an arylidene dye, an oxonol dye, an azulenium dye, a coumarin dye, a ketocoumarin dye, a styrylcoumarin dye, a pyran dye, a xanthene dye, a thioxanthene dye, a phenothiazine dye, a phenoxazine dye, a phenazine dye, a phthalocyanine dye, an azaporphiline dye, a porphiline dye, a condensed-ring aromatic dye, a perylene dye, an azomethine dye, an anthraquinone dye, a metal complex dye, or a metallocene dye, more preferably a cyanine dye, a squarilium cyanine dye, a pyrilium dye, a merocyanine dye, an oxonol dye, a coumarin dye, a ketocoumarin dye, a styrylcoumarin dye, a pyran dye, a xanthene dye, a thioxanthene dye, a condensed-ring aromatic dye, a metal complex dye, or a metallocene dye, and further preferably a cyanine dye, a merocyanine dye, an oxonol dye, a metal complex dye, or a metallocene dye. The metal complex dye is particularly preferably a Ru complex dye, and the metallocene dye is particularly preferably a ferrocene.

Also dyes described in "*Dye Handbook*" (Shinya Ogawara, Kodan-sha, 1986), "*Chemistry of Functional Dyes*" (Shinya Ogawara, CMC, 1981), and "*Special Functional Materials*" (Chuzaburo Ikemori et al., CMC, 1986) may be employed as the sensitizing dye of the invention. The sensitizing dye of the invention is not limited to such examples but can be any dye showing an absorption to the light in the visible region. Such sensitizing dye may be selected so as to match the wavelength of the laser employed as the light source according to the purpose of use, and, depending on the purpose, two or more sensitizing dyes may be employed in combination.

The sensitizing dye to be employed in the hologram recording material of the invention is more preferably a Ru complex dye, a ferrocene derivative, a cyanine dye or a merocyanine dye.

Preferred examples of the Ru complex dye and the ferrocene derivative are those described in Japanese Patent Application No. 2004-91983.

The sensitizing dye to be employed in the invention is further preferably a cyanine dye or a merocyanine dye.

Also in the case the sensitizing dye of the invention is a cyanine dye, it preferably is a cyanine dye having a benzoxazole ring, a benzothiazole ring, a benzimidazole ring, an indolenine ring, or a quinoline ring (preferred examples to be shown later), more preferably a cyanine dye having a benzoxazole ring, a benzothiazole ring, or a benzimidazole ring, and most preferably a cyanine ring having a benzoxazole ring.

The cyanine dye preferred in the invention is represented by formula (1):

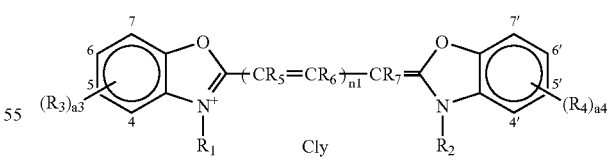

In the invention, when a specified portion is called a "group", it means that such group may be substituted with one or more (up to maximum possible) substituents or may not be substituted, unless specified otherwise. For example an "alkyl group" means a substituted or non-substituted alkyl group. Also a substituent employable in the compound of the invention may be any substituent.

Also in the invention, when a specified portion is called a "ring", or in the case a "ring" is included in a "group", such ring may be a single ring or condensed rings unless specified otherwise, and may be substituted or non-substituted.

For example, an "aryl group" may be a phenyl group or a naphthyl group, or a substituted phenyl group.

In the formula (1), $R_1$ and $R_2$ each independently represents an alkyl group (preferably with 1-20 carbon atoms (hereinafter represented as C number) such as methyl, ethyl, n-propyl, isopropyl, n-butyl, n-pentyl, benzyl, 3-sulfopropyl, 4-sulfobutyl, 3-methyl-3-sulfopropyl, 2'-sulfobenzyl, carboxymethyl, or 5-carboxypentyl), an alkenyl group (preferably with C number of 2-20 such as vinyl, allyl, or 1,3-butadienyl), an alkynyl group (preferably with C number of 2-20, such as 2-propinyl, or 1,3-butadiinyl), or a cycloalkyl group (preferably with C number of 3-20, such as cyclopropyl, cyclopentyl or cyclohexyl), and more preferably an alkyl group.

$R_1$ and $R_2$ may be mutually same or different, but preferably mutually same.

In the formula (1), $R_3$ and $R_4$ each independently represents a substituent, and preferred examples of the substituent include an alkyl group (preferably with C number of 1-20, such as methyl, ethyl, n-propyl, isopropyl, n-butyl, n-pentyl, benzyl, 3-sulfopropyl, 4-sulfobutyl, carboxymethyl, or 5-carboxypentyl), an alkenyl group (preferably with C number of 2-20, such as vinyl, allyl, 2-butenyl or 3-butadienyl), a cycloalkyl group (preferably with C number of 3-20, such as cyclopentyl or cyclohexyl), an aryl group (preferably with C number of 6-20, such as phenyl, 2-chlorophenyl, 4-methoxyphenyl, 3-methylphenyl or 1-naphthyl), a heterocyclic group (preferably with C number of 1-20, such as pyridyl, thienyl, furyl, thiazolyl, imidazolyl, pyrazolyl, pyrrolidino, piperidino or morpholino), an alkynyl group (preferably with C number of 2-20, such as ethinyl, 2-propinyl, 1,3-butadunyl or 2-phenylethinyl), a halogen atom (such as F, Cl, Br or I), an amino group (preferably with C number of 0-20 including an alkylamino, an arylamino or a heterocyclic amino, such as amino, dimethylamino, diethylamino, dibutylamino or anilino), a cyano group, a nitro group, a hydroxyl group, a mercapto group, a carboxyl group, a sulfo group, a phosphonic acid group, an acyl group (preferably with C number of 1-20, such as acetyl, benzoyl, salicyloyl or pivaloyl), an alkoxy group (preferably with C number of 1-20, such as methoxy, butoxy or cyclohexyloxy), an aryloxy group (preferably with C number of 6-26, such as phenoxy or 1-naphthoxy), an alkylthio group (preferably with C number of 1-20, such as methylthio, or ethylthio), an arylthio group (preferably with C number of 6-20, such as phenylthio or 4-chlorophenylthio), an alkylsulfonyl group (preferably with C number of 1-20, such as methanesulfonyl or butanesulfonyl), an arylsulfonyl group (preferably with C number of 6-20, such as benzenesulfonyl or paratoluenesulfonyl), a sulfamoyl group (preferably with C number of 0-20, such as sulfamoyl, N-methylsulfamoyl or N-phenylsulfamoyl), a carbamoyl group (preferably with C number of 1-20, such as carbamoyl, N-methylcarbamoyl, N,N-dimethylcarbamoyl or N-phenylcarbamoyl), an acylamino group (preferably with C number of 1-20, such as acetylamino or benzoylamino), an imino group (preferably with C number of 2-20, such as phthalimino), an acyloxy group (preferably with C number of 1-20, such as acetyloxy, or benzoyloxy), an alkoxycarbonyl group (preferably with C number of 2-20, such as methoxycarbonyl or phenoxycarbonyl), and a carbamoylamino group (preferably with C number of 1-20, such as carbamoylamino, N-methylcarbamoylamino or N-phenylcarbamoylamino), more preferably an alkyl group, an aryl group, a heterocyclic group, a halogen atom, a cyano group, a carboxyl group, a sulfo group, an alkoxy group, a sulfamoyl group, a carbamoyl group and an alkoxycarbonyl group, and further preferably an alkyl group, an aryl group, an alkoxy group, a halogen atom, a sulfamoyl group, an alkoxycarbonyl group, a carbamoyl group and a cyano group.

In the formula (1), a3 and a4 each independently represents an integer of 0-4, more preferably each independently represents an integer of 0-2, and further preferably represents 0 or 1. Also in the case of a hologram recording wavelength of 532 nm, both a3 and a4 represent 0.

a3 and a4 may be mutually same or different, but are preferably same.

In the case a3 and a4 each is 1 or larger, it is preferable that $R_3$ is substituted in 5-position or 6-position and $R_4$ is substituted in 5'-position or 6'-position, and more preferably that $R_3$ is substituted in 5-position and $R_4$ is substituted in 5'-position.

In the case a3 or a4 is 2 or larger, plural $R_3$s or $R_4$s may be mutually same or different or may be mutually bonded to form a ring, which is preferably a benzene ring, a naphthalene ring, a thiophene ring, a furan ring, a benzofuran ring, a pyrrole ring, an indole ring, an imidazole ring, a pyrazol ring, a cyclohexene ring, a dioxaene ring or a pyridine ring.

In the formula (1), $R_5$, $R_6$ and $R_7$ each independently represents a hydrogen atom or a substituent (preferred examples thereof being same as those shown for $R_3$), and more preferably a hydrogen atom, an alkyl group, a halogen atom, a nitro group, an alkoxy group, an aryl group, a nitro group, a heterocyclic group, an aryloxy group, an acylamino group, a carbamoyl group, a sulfo group, a hydroxyl group, a carboxyl group, an alkylthio group, or a cyano group, further preferably a hydrogen atom or an alkyl group, and most preferably a hydrogen atom, a methyl group or an ethyl group.

$R_5$, $R_6$ and $R_7$ may be mutually bonded to form a ring, which is preferably a cyclolhexene ring, a cyclopentene ring, a benzene ring, or a thiophene group.

In the formula (1), n1 represents an integer of 0 to 2, more preferably 0 or 1.

In the case of a hologram recording wavelength of 532 nm, n1 is preferably 1, and more preferably n1 is 1 and both a3 and a4 represent 0.

Also in the case of a hologram recording wavelength of 405-415 nm, n1 is more preferably 0.

In the formula (1), CI represents a charge neutralizing ion, which can preferably be, as an anion, $PF_6^-$, $BF_4^-$, $SbF_6^-$, $B(C_6H_5)_4^-$, $CF_3SO_3^-$, $C_4F_9SO_3^-$, $C_6H_5SO_3^-$, 4-$CH_3C_6H_4SO_3^-$, $CH_3SO_3^-$, $CH_3OSO_3^-$, $CH_3COO^-$, $CF_3COO^-$, $ClO_4^-$, $I^-$, $Br^-$, $Cl^-$, $F^-$ or $OH^-$, or as a cation, $H^+$, $Li^+$, $K^+$, $Cs^+$, $Mg^{2+}$, $Ca^{2+}$, $^+HN(C_2H_5)_3$, $^+N(CH_3)_4$, $^+N(C_4H_9)_4$, $C_5H_5NH^+$, $C_5H_5N^+$—$C_2H_5$ or the like.

In the formula (1), y represents a number required for neutralizing the charge.

Then, in the case the sensitizing dye of the invention is a merocyanine dye, it preferably has, as a basic nucleus, a benzoxazole ring, a benzothiazole ring, a benzoimidazole ring, a quinoline ring, or a benzene ring substituted with an amino group or an alkoxy group, and, as an acidic nucleus, 2-pyrazolon-5-one, pyrazolidine-3,5-dione, rhodanine, indane-1,3-dion, thiophen-3-one, thiophen-3-one-1,1-dioxide, 1,3-dioxane-4,6-dione, barbituric acid, 2-thiobarbituric acid, isooxazolone, coumarin-2,4-ione, ethyl cyanoacetate, methyl cyanoacetate, malononitrile or a derivative thereof.

In particular, it more preferably has, as an acidic nucleus, pyrazolidine-3,5-dione, rhodanine, indane-1,3-dion, 1,3-ioxane-4,6-dione, barbituric acid, or 2-thiobarbituric acid, and further preferably barbituric acid, or 2-thiobarbituric acid.

A merocyanine dye preferred in the invention is represented by formula (2):

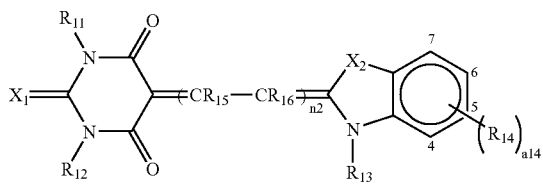

In the formula (2), $X_1$ represents O or S.

In the formula (2), $X_2$ represents —O—, —S—, —$NR_{17}$—, or —$CR_{18}R_{19}$—; $R_{11}$ and $R_{12}$ each independently represents a hydrogen atom, an alkyl group, an alkenyl group, an alkynyl group, a cycloalkyl group, an aryl group or a heterocyclic group (preferred examples thereof being same as those shown for $R_1$ or $R_3$), more preferably a hydrogen atom, an alkyl group or an aryl group and further preferably an alkyl group.

$R_{17}$, $R_{18}$ and $R_{19}$ each independently represents an alkyl group, an alkenyl group, an alkynyl group, a cycloalkyl group, an aryl group or a heterocyclic group (preferred examples thereof being same as those shown for $R_1$ or $R_3$), more preferably an alkyl group or an aryl group, and further preferably an alkyl group.

$R_{18}$ and $R_{19}$ may be mutually bonded to form a ring, which can preferably be a cyclohexane ring or a cyclopentane ring.

In the formula (2), $R_{13}$ represents an alkyl group, an alkenyl group, an alkynyl group, or a cycloalkyl group (preferred examples thereof being same as those shown for $R_1$), more preferably an alkyl group.

In the formula (2), $R_{14}$ represents a substituent (preferred examples thereof being same as those shown for $R_3$), more preferably an alkyl group, an aryl group, an alkoxy group, a halogen atom, a sulfamoyl group, an alkoxycarbonyl group, a carbamoyl group or a cyano group.

In the formula (2), a14 represents an integer of 0 to 4, more preferably 0 to 2 and further preferably 0 or 1.

In the case a14 is 1 or larger, $R_{14}$ is more preferably substituted in 5-position or 6-position, and further preferably in 5-position.

In the case a14 is 2 or larger, plural $R_{14}$s may be mutually same or different, or may be mutually bonded to form a ring, which can preferably be a benzene ring, a naphthalene ring, a thiophene ring, a furan ring, a benzofuran ring, a pyrrole ring, an indole ring, an imidazole ring, a pyrazole ring, a cyclohexene ring, a dioxaene ring or a pyridine ring.

In the formula (2), $R_{15}$ and $R_{16}$ each independently represents a hydrogen atom or a substituent (preferred examples thereof being same as those shown for $R_3$), more preferably a hydrogen atom or an alkyl group, and further preferably a hydrogen atom, a methyl group or an ethyl group.

$R_{15}$ and $R_{16}$ may be mutually bonded to form a ring, which can preferably be a cyclohexene ring, a cyclopentene ring, a benzene ring, a thiophene ring or the like.

In the formula (2), n2 represents an integer of 0 to 2, more preferably 0 or 1, n1 is preferably 1 in the case of a hologram recording wavelength of 532 nm, and more preferably 0 in the case of a hologram recording wavelength of 405-415 nm.

In the following, specific examples of the sensitizing dye of the invention will be shown, but the present invention is not limited to such examples.

<cyanine dye>

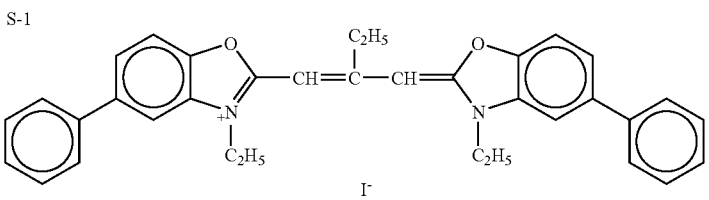

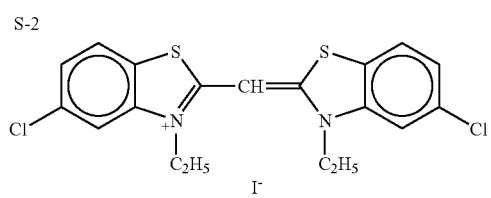

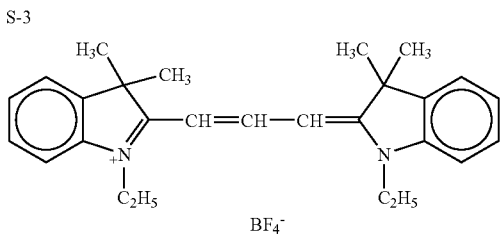

-continued
S-4
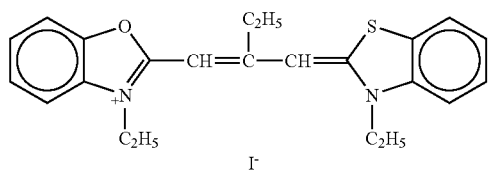
S-5
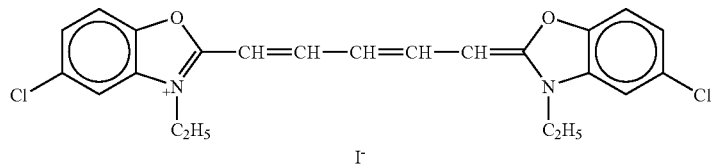
S-6
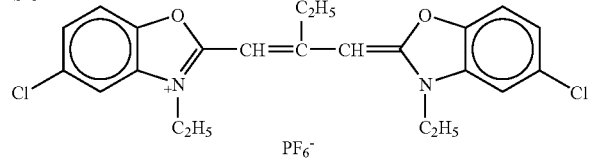
S-7
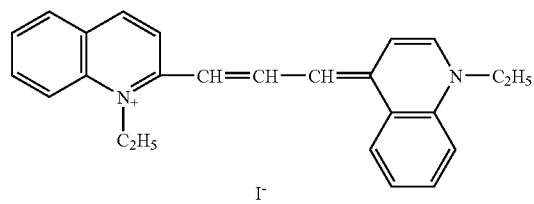
S-8
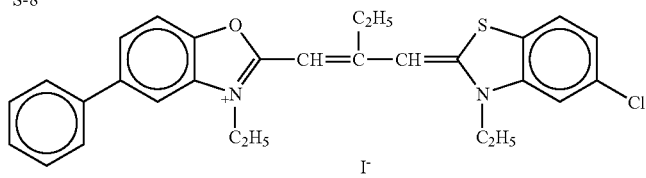
S-9
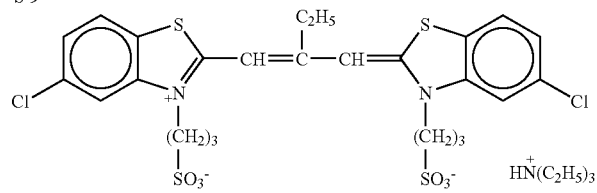
S-10
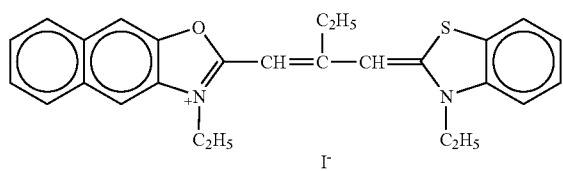

-continued
S-11
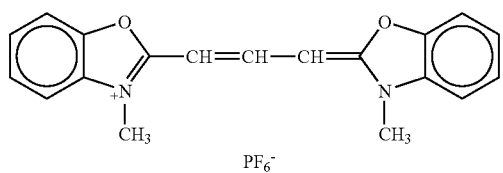
PF$_6^-$
<squarilium cyanine dye>
S-12
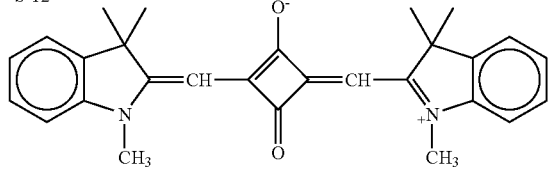
S-13
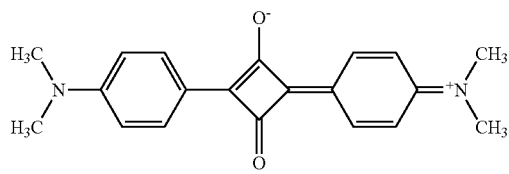
<styryl dye>
S-14
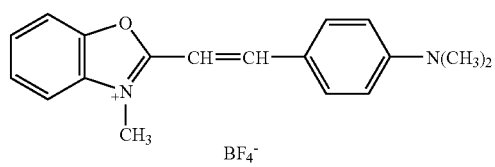
BF$_4^-$
S-15
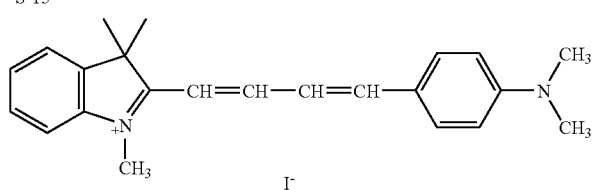
I$^-$
<pyrilium dye>
S-16
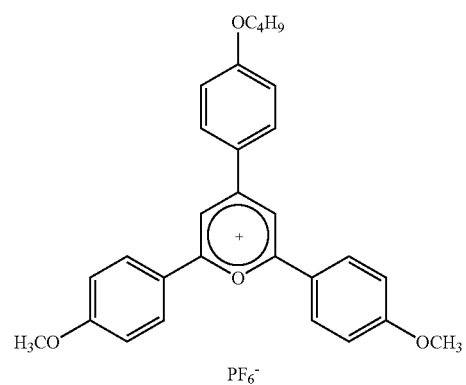
PF$_6^-$ -continued
S-17
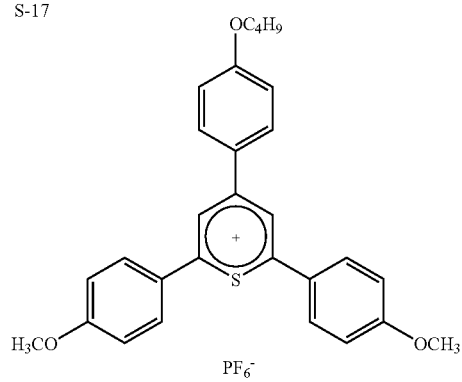
<merocyanine dye>
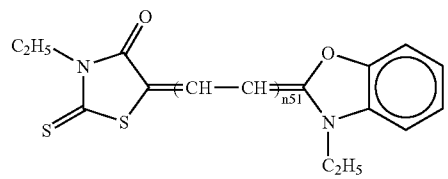
| | n51 |
|---|---|
| S-18 | 0 |
| S-19 | 1 |
| S-20 | 2 |
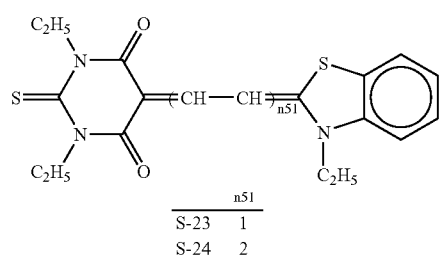
| | n51 |
|---|---|
| S-23 | 1 |
| S-24 | 2 |
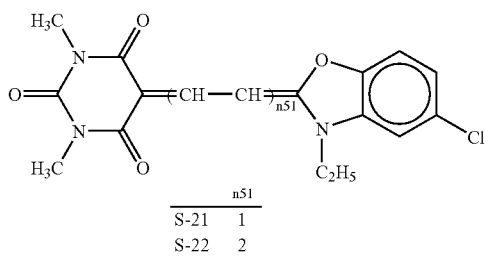
| | n51 |
|---|---|
| S-21 | 1 |
| S-22 | 2 |
$Q_{51}=CH-CH=Q_{52}$
| $Q_{51}$ | $Q_{52}$ |
|---|---|
| S-25 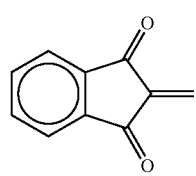 | 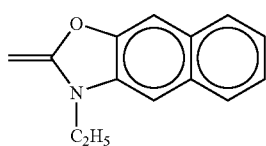 |

-continued
S-26 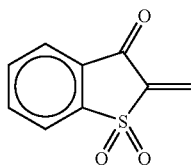 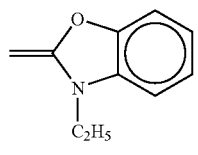
S-27 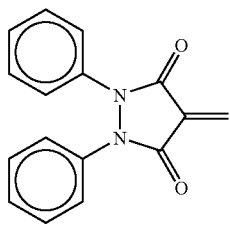 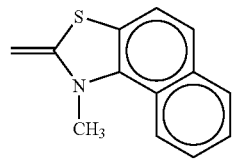
S-28 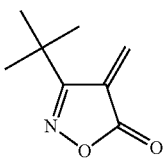 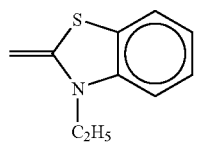
S-29 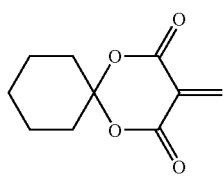 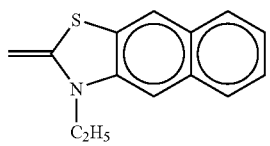
S-30 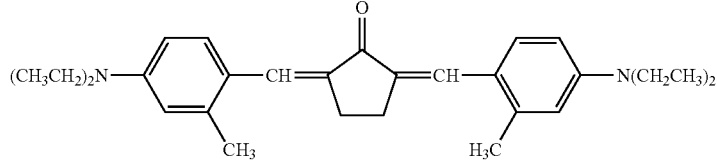
S-31 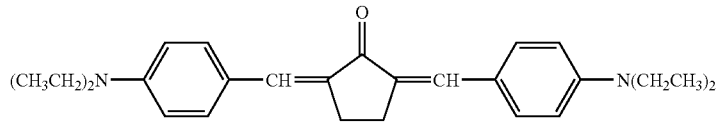
S-32 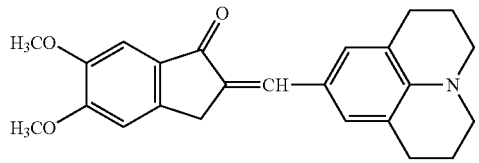
S-33 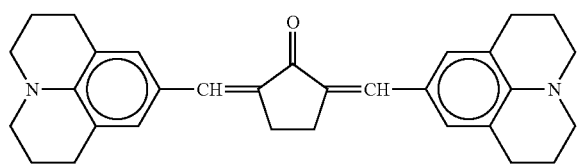

-continued
S-34
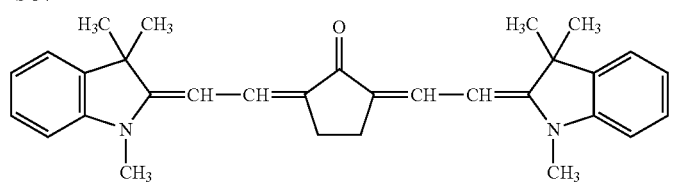
S-35
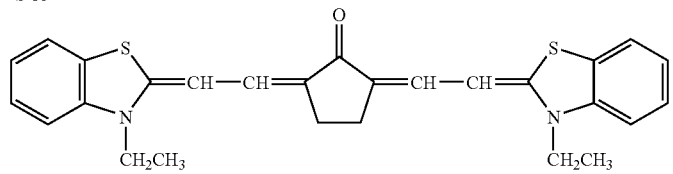
S-36
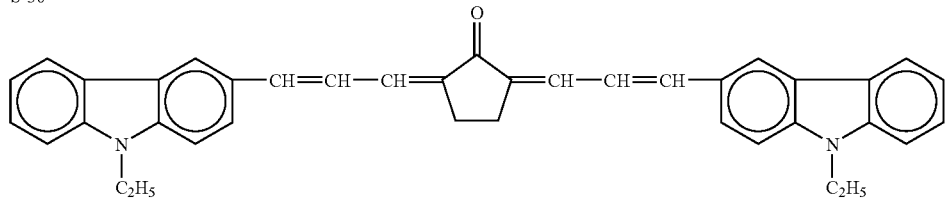
<arylidene dye>
S-37
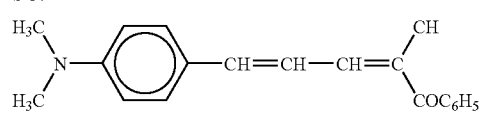
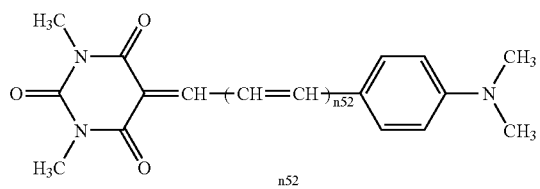
| | n52 |
|---|---|
| S-38 | 0 |
| S-39 | 1 |
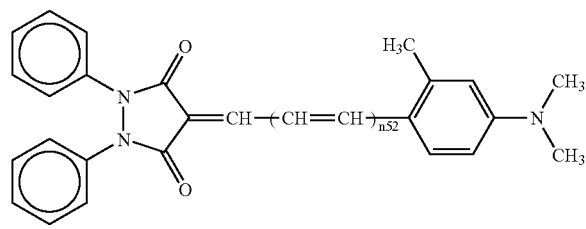
| | n52 |
|---|---|
| S-40 | 0 |
| S-41 | 1 |
<oxonol dye>
SO-3
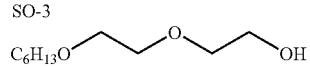

-continued

| | Q$_{52}$ | Q$_{53}$ | n$_{53}$ | Cl |
|---|---|---|---|---|
| S-42 | (structure) | (structure) | 2 | H$^+$ |
| S-43 | (structure) | (structure) | 1 | (pyridinium) |
| S-44 | (structure) | (structure) | 2 | H$^+$ |
| S-45 | (structure) | (structure) | 1 | H$^+$ |
| S-46 | (structure) | (structure) | 1 | HN$^+$(C$_2$H$_5$)$_3$ |

<azulenium dye>

S-47

| -continued |
|---|
| <coumarin dye> |
S-48
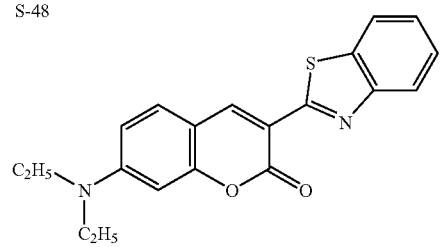
S-49
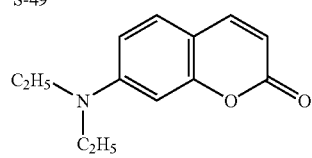
| <ketocoumarin dye> |
|---|
S-50
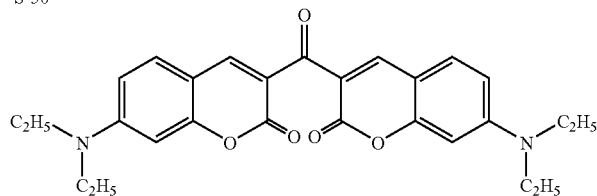
S-51
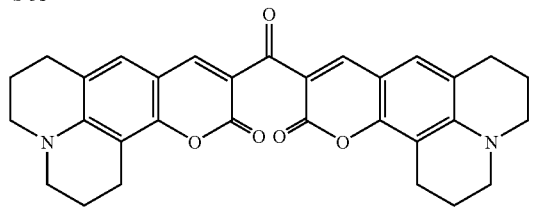
| <styrylcoumarin dye> |
|---|
S-52
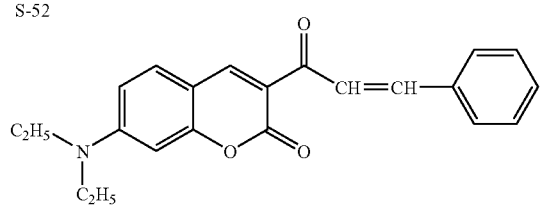
S-53
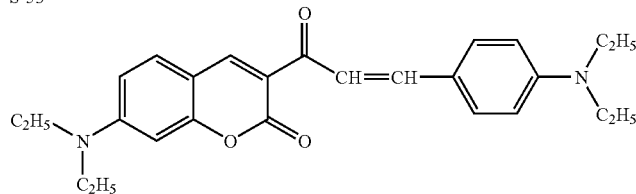

-continued
<pyran dye>
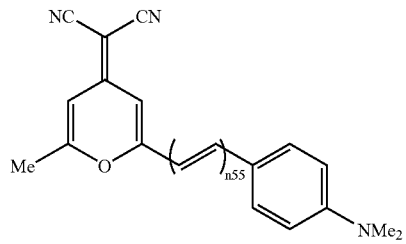
| | n55 |
|---|---|
| S-54 | 1 |
| S-55 | 2 |
| S-56 | 3 |
<xanthene dye>
S-57
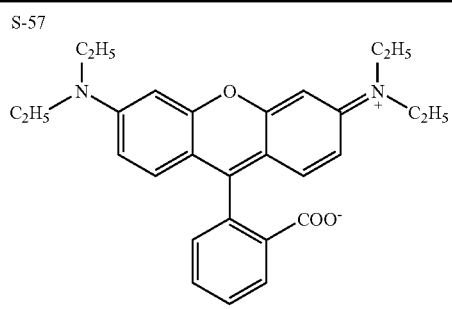
S-58
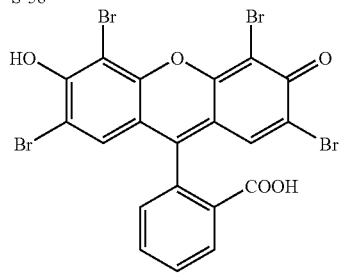
| <thioxanthene dye> | <phenothiazine dye> |
|---|---|
| S-59 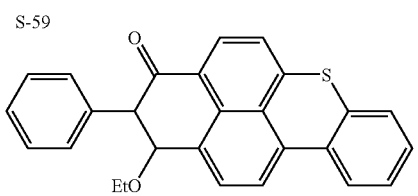 | S-60 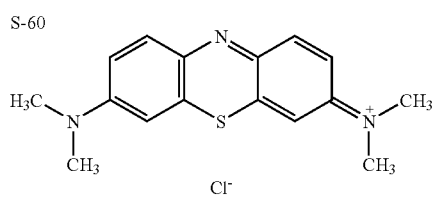 |
| <phenoxazine dye> | <phenazine dye> |
| S-61 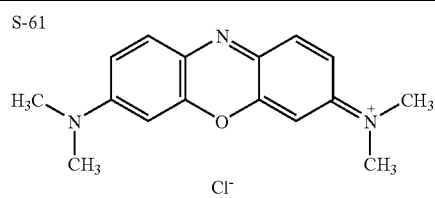 | S-62 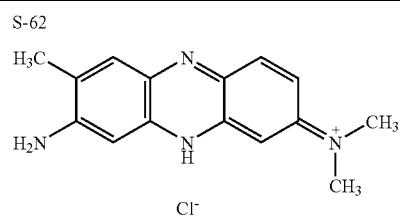 |

-continued
<phthalocyanine dye>
S-63
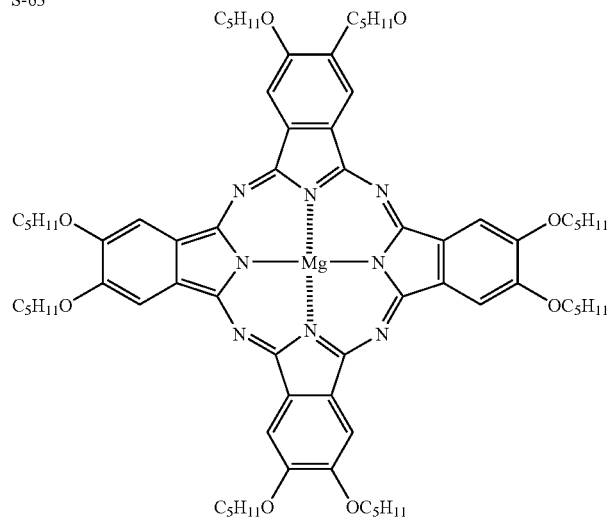
<azaporphiline dye>
S-64
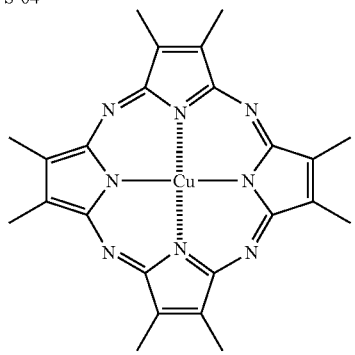
<porphiline dye>
S-65
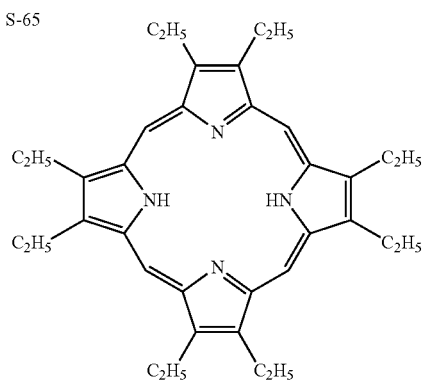

-continued
<condensed-ring aromatic dye>
S-66　　　　S-67
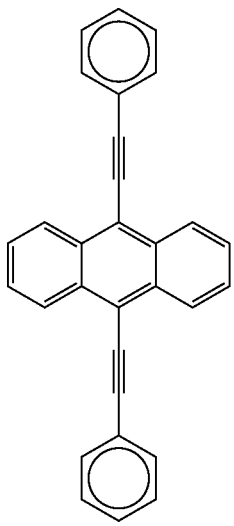 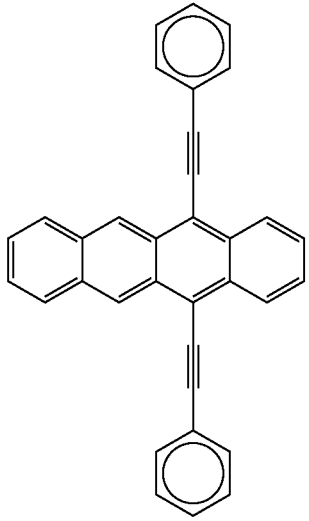
<periline dye>
S-68
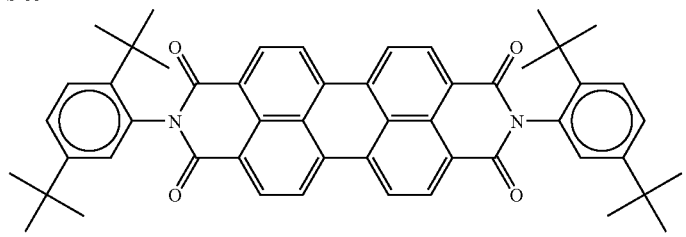
<azomethine dye>
S-69
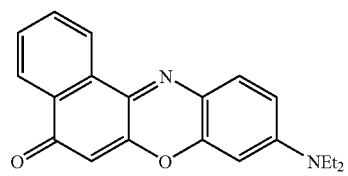
<anthraquinone dye>
S-70
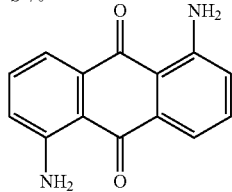

-continued
S-73
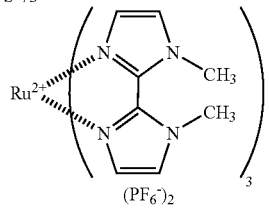
S-76
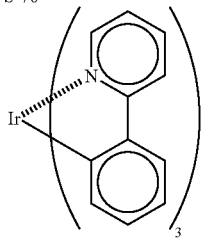
S-79
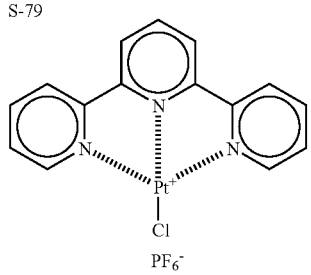
<metal complex dye>
S-71
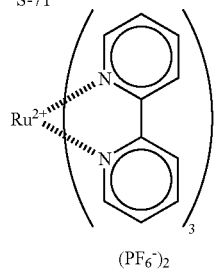
S-72
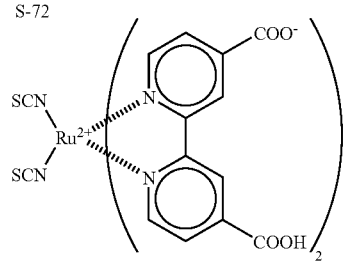
S-74
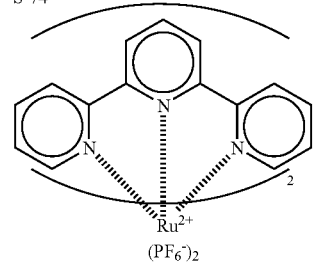
S-75
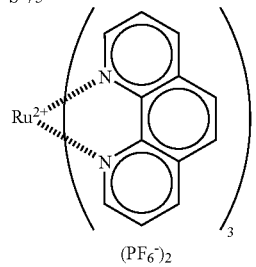

-continued
S-77 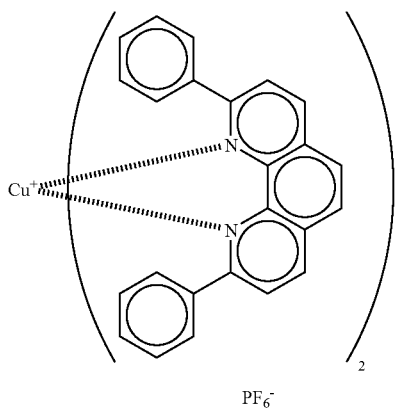
PF$_6^-$
S-78 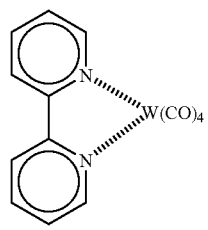
S-80 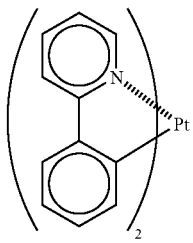
<metallocene dye>
S-81 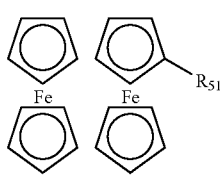
| | R$_{51}$ |
|---|---|
| S-82 | —CHO |
| S-83 | —CH$_2$CH$_2$COOH |
| S-84 | —CH$_2$CH$_2$COOCH$_3$ |
| S-85 | 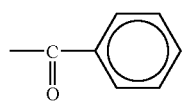 |
| S-86 | —CH$_2$OH |
| S-87 | —COOCH$_3$ |
S-88 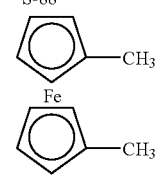   S-89 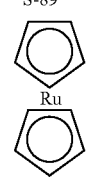   S-90 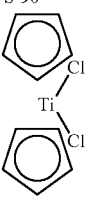

-continued

<cyanine dye>

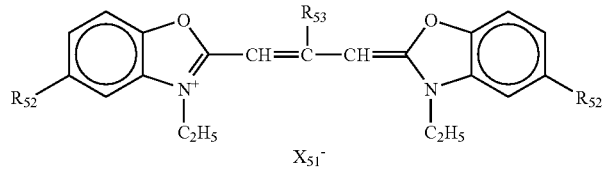

| | R52 | R53 | X51− |
|---|---|---|---|
| S-91 | —Cl | —H | I− |
| S-92 | —H | —C2H5 | I− |
| S-93 | —H | —H | I− |
| S-94 | —H | —H | PF6− |
| S-95 | —Br | —H | BF4− |
| S-96 | —CH3 | —H | I− |
| S-97 | —OCH3 | —C2H5 | PF6− |

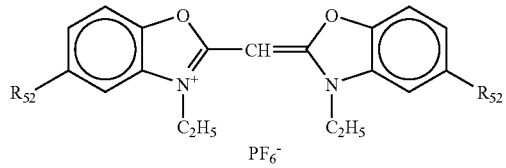

| | R52 |
|---|---|
| S-98 | —H |
| S-99 | —Cl |
| S-100 | —Ph |
| S-101 | —CH3 |
| S-102 | —OCH3 |

S-103

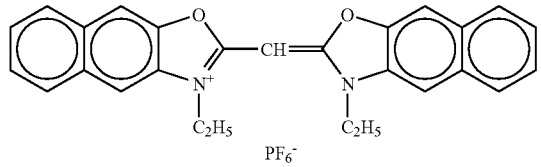

S-104

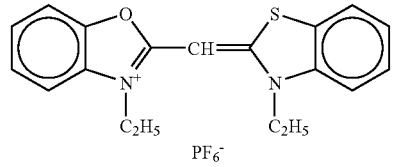

The aforementioned example of the sensitizing dye of the invention can naturally be a sensitizing dye meeting the requirements of the invention for a certain hologram recording wavelength or be a sensitizing dye not meeting the requirements of the invention for another hologram recording wavelength.

Other preferred examples of the sensitizing dye of the invention are described in Japanese Patent Application No. 2004-238427. The sensitizing dye of the invention is commercially available or can be synthesized by a known method.

In the case of a interference fringe recording by a polymerization reaction, the binder and the polymerizable compound are preferably different in the refractive index. In order to increase the refractive index modulation, the polymerizable compound and the binder preferably have a larger difference in the refractive index in a bulk state. The difference in the refractive index is preferably 0.01 or larger, more preferably 0.05 or larger and further preferably 0.1 or larger.

For such purpose, it is preferable that either of the polymerizable compound and the binder contains at least an aryl group, an aromatic heterocyclic group, a chlorine atom, a bromine atom, an iodine atom or a sulfur atom, and the other is free from such component. Also a higher refractive index may be exhibited by the polymerizable compound or by the binder.

A polymerizable compound of the invention means a compound capable of causing an addition polymerization by a radical, an acid (Bronsted acid or Lewis acid) or a base (Bronsted base or Lewis base), which are generated by irradiating the sensitizing dye (or color developed substance) and polymerization initiator with light, thereby forming an oligomer or a polymer.

The polymerizable compound of the invention may be monofunctional or polyfunctional, also may be constituted of a single component or plural components, and may be a monomer, a prepolymer (for example dimer or oligomer) or a mixture thereof, but is preferably a monomer.

Also it may be liquid or solid at the room temperature, but is preferably a liquid having a boiling point of 100° C. or higher, or a mixture of a liquid monomer having a boiling point of 100° C. or higher and a solid monomer.

The polymerizable compound of the invention is roughly classified into a polymerizable compound capable of a radical polymerization and a polymerizable compound capable of a cationic or anionic polymerization.

In the following, there will be explained preferred examples of the polymerizable compound for each of the polymerizable compound capable of a radical polymerization and the polymerizable compound capable of a cationic or anionic polymerization, for each of the cases (A) where refractive index of polymerizable compound>refractive index of binder, and (B) where refractive index of binder>refractive index of polymerizable compound.

Preferred Examples of the Radical Polymerizable Compound for the Case (A) Where Refractive Index of Polymerizable Compound>Refractive Index of Binder In this case, the radical polymerizable compound preferably has a high refractive index, and a high-refractive index radical polymerizable compound of the invention is preferably a compound including at least an ethylenic unsaturated double bond in the molecule and further having an aryl group, an aromatic heterocyclic group, a chlorine atom, a bromine atom, an iodine atom or a sulfur atom by at least a unit and is also preferably a liquid having a boiling point of 100° C. or higher.

Specific examples include following polymerizable monomers and prepolymers (dimer, oligomer and the like) derived therefrom.

Preferred examples of the high refractive index radical polymerizable monomer include styrene, 2-chlorostyrene, 2-bromostyrene, methoxystyrene, phenyl acrylate, p-chlorophenyl acrylate, 2-phenylethyl acrylate, 2-phenoxyethyl acrylate, 2-phenoxyethyl methacrylate, 2-(p-chlorophenoxy) ethyl acrylate, benzyl acrylate, 2-(1-naphthyloxy)ethyl acrylate, 2,2-di(p-hydroxyphenyl)propane diacrylate or dimethacrylate, bisphenol-A di(2-methacryloxyethyl) ether, bisphenol-A di(2-acryloxyethyl) ether, tetrachlorobisphenol-A di(2-methacryloxyethyl) ether, tetrabromobisphenol-A di(2-methacryloxyethyl) ether, 1,4-benzenediol dimethacrylate, and 1,4-diisopropenylbenzene, more preferably 2-phenoxyethyl acrylate, 2-phenoxyethyl methacrylate, 2-(p-chlorophenoxy)ethyl acrylate, p-chlorophenyl acrylate, phenyl acrylate, 2-phenylethyl acrylate, bisphenol-A di(2-acryloxyethyl) ether and 2-(1-naphthyloxy)ethyl acrylate.

The preferable polymerizable compound is a liquid, but it may be employed in a mixture with a second solid polymerizable compound such as N-vinylcarbazole, 2-naphthyl acrylate, pentachlorophenyl acrylate, 2,4,6-tribromophenyl acrylate, bisphenol-A diacrylate, 2-(2-naphthyloxy)ethyl acrylate or N-phenylmaleimide.

Preferred Examples of the Radical Polymerizable Compound for the Case (B) Where Refractive Index of Binder>Refractive Index of Polymerizable Compound In this case, the radical polymerizable compound preferably has a low refractive index, and a low-refractive index radical polymerizable compound of the invention is preferably a compound including at least an ethylenic unsaturated double bond in the molecule and not having at all an aryl group, an aromatic heterocyclic group, a chlorine atom, a bromine atom, an iodine atom or a sulfur atom.

It is also preferably a liquid having a boiling point of 100° C. or higher.

Specific examples include following polymerizable monomers and prepolymers (dimer, oligomer and the like) derived therefrom.

Preferred examples of the low refractive index radical polymerizable monomer include t-butyl acrylate, cyclohexyl acrylate, isobornyl acrylate, 1,5-pentanediol diacrylate, ethylene glycol diacrylate, 1,4-butanediol diacrylate, diethylene glycol diacrylate, hexamethylene glycol diacrylate, 1,3-propanediol diacrylate, decamethylene glycol diacrylate, 1,4-cyclohexyldiol diacrylate, 2,2-methylolpropane diacrylate, glycerol diacrylate, trimethylolpropane diacrylate, pentaerythritol triacrylate, pentaerythritol tetraacrylate, triethylene glycol diacrylate, triethylene glycol dimethacrylate, ethylene glycol dimethacrylate, 1,3-propanediol dimethacrylate, 1,2,4-butanetriol trimethacrylate, 2,2,4-trimethyl-1,3-propanediol dimethacrylate, pentaerythritol trimethacrylate, pentaerythritol tetramethacrylate, trimethylolpropane trimethacrylate, 1,5-pentanediol dimethacrylate, diallyl fumarate, 1H,1H-perfluorooctyl acrylate, 1H,1H,2H,2H-perfluorooctyl methacrylate, 1H,1H,2H,2H-perfluorooctyl acrylate, and 1-vinyl-2-pyrrolidinone, more preferably decanediol diacrylate, isobornyl acrylate, triethylene glycol diacrylate, diethylene glycol diacrylate, triethylene glycol dimethacrylate, ethoxyethoxyethyl acrylate, triacrylate ester of ethoxylated trimethylolpropane, and 1-vinyl-2-pyrrolidine, further preferably decanediol diacrylate, isobornyl acrylate, triethylene glycol diacrylate, diethylene glycol diacrylate, triethylene glycol dimethacrylate, ethoxyethoxyethyl acrylate, 1H, 1H-perfluorooctyl acrylate, 1H,1H,2H,2H-perfluorooctyl methacrylate, 1H,1H,2H,2H-perfluorooctyl acrylate, and 1-vinyl-2-pyrrolidinone.

The preferable polymerizable compound is a liquid, but it may be employed in a mixture with a second solid polymerizable monomer such as N-vinylcaprolactam.

A cationic polymerizable compound of the invention is a compound initiating a polymerization by an acid generated by a light irradiation on a sensitizing dye and a cationic polymerization initiator, and an anionic polymerizable compound of the invention is a compound initiating a polymerization by a base generated by a light irradiation on a sensitizing dye and an anionic polymerization initiator.

The cationic polymerizable compound of the invention is preferably a compound having at least an oxilane ring, an oxetane ring, a vinylether group, or an N-vinylcarbazole site in the molecule, and more preferably a compound having an oxilane ring site.

The anionic polymerizable compound of the invention is preferably a compound having at least an oxilane ring, an oxetane ring, a vinylether group, or an N-vinylcarbazole site, an ethylenic double bond site having an electron attracting substituent, a latcone site, a lactam site, a cyclic urethane site, a cyclic urea site or a cyclic siloxane site in the molecule, and more preferably a compound having an oxilane ring site.

Preferred Examples of the Cationic or Anionic Polymerizable Compound for the Case (A) where Refractive Index of Polymerizable Compound>Refractive Index of Binder In this case, the cationic or anionic polymerizable compound preferably has a high refractive index, and a high-refractive index cationic or anionic polymerizable compound of the invention is preferably a compound including at least an oxilane ring, an oxetane ring, a vinyl ether group, or an N-vinylcarbazole site in the molecule and further having at least an aryl group, an aromatic heterocyclic group, a chlorine atom, a bromine atom, an iodine atom or a sulfur atom and preferably includes at least an aryl group. Also it is preferably a liquid having a boiling point of 100° C. or higher.

Specific examples include following polymerizable monomers and prepolymers (dimer, oligomer and the like) derived therefrom.

The high refractive index cationic or anionic polymerizable monomer having an oxilane ring can preferably be phenyl glycidyl ether, phthalic acid diglycidyl ester, trimellitic acid triglycidyl ester, resorcin diglycidyl ether, dibromophenyl glycidyl ether, dibromoneopentyl glycol diglycidyl ether, 4,4'-bis(2,3-epoxypropoxyperfluoroisopropyl) diphenyl ether, p-bromostyrene oxide, bisphenol-A diglycidyl ether, tetrabromobisphenol-A diglycidyl ether, bisphenol-F diglycidyl ether, or 1,3-bis(3',4'-epoxycyclohexyl)ethyl-1,3-diphenyl-1,3-dimethyl disiloxane.

Specific examples of the high refractive index cationic or anionic polymerizable monomer having an oxetane ring include example compounds of the aforementioned high refractive index cationic or anionic polymerizable monomer having an oxilane ring, in which the oxilane ring is substituted with an oxetane ring.

Specific examples of the high refractive index cationic or anionic polymerizable monomer having a vinyl ether group site include vinyl 2-chloroethyl ether, 4-binyletherstyrene, hydroquinone divinyl ether, phenyl vinyl ether, bisphenol-A divinyl ether, tetrabromobisphenol-A divinyl ether, bisphenol-F divinyl ether, phenoxyethylene vinyl ether, and p-bromophenoxyethylene vinyl ether.

In addition, N-vinylcarbazole is also preferably as a high refractive index cationic polymerizable monomer.

Preferred Examples of the Cationic or Anionic Polymerizable Compound for the Case (B) where Refractive Index of Binder>Refractive Index of Polymerizable Compound In this case, the cationic or anionic polymerizable compound preferably has a low refractive index, and a low-refractive index cationic or anionic polymerizable compound of the invention is preferably a compound including at least an oxilane ring, an oxetane ring, a vinyl ether group, or an N-vinylcarbazole site in the molecule and not having at all an aryl group, an aromatic heterocyclic group, a chlorine atom, a bromine atom, an iodine atom or a sulfur atom. It is also preferably a liquid having a boiling point of 100° C. or higher.

Specific examples include following polymerizable monomers and prepolymers (dimer, oligomer and the like) derived therefrom.

Specific examples of the low refractive index cationic or anionic polymerizable monomer having an oxilane ring include glycerol diglycidyl ether, glycerol triglycidyl ether, pentaerythritol polyglycidyl ether, trimethylolpropane triglycidyl ether, 1,6-hexanediol diglycidyl ether, ethylene glycol diglycidyl ether, ethylene glycol monoglycidyl ether, propylene glycol diglycidyl ether, neopentyl glycol diglycidyl ether, adipic acid diglycidyl ester, 1,2,7,8-diepoxyoctane, 1,6-dimethylol perfluorohexane diglycidyl ether, vinylcyclohexene dioxide, 3,4-epoxycyclohexylmethyl-3',4'-epoxycyclohexane carboxylate, 3,4-epoxycyclohexyloxilane, bis(3,4-epoxycyclohexyl) adipate, 2,2-bis[4-(2,3-epoxypropoxy)cyclohexyl]propane, 2,2-bis[4-(2,3-epoxypropoxy)cyclohexyl]hexafluoropropane, 2-(3,4-epoxycyclohexyl)-3', 4'-epoxy-1,3-dioxane-5-spirocyclohexane, 1,2-ethylenedioxy-bis(3,4-epoxycyclohexylmethane), ethylene glycol-bis(3,4-epoxycyclohexane carboxylate), bis(3,4-epoxycyclohexylmethyl) adipate, di-2,3-epoxycyclopentyl ether, vinyl glycidyl ether, allyl glycidyl ether, 2-ethylhexyl glycidyl ether, and 1,3-bis(3',4'-epoxycyclohexyl)ethyl)-1,1,3,3-tetramethyl disiloxane.

Specific examples of the low refractive index cationic or anionic polymerizable monomer having an oxetane ring include example compounds of the aforementioned low refractive index cationic or anionic polymerizable monomer having an oxilane ring, in which the oxilane ring is substituted with an oxetane ring.

Specific examples of the low refractive index cationic or anionic polymerizable monomer having a vinyl ether group site include vinyl n-butyl ether, vinyl t-butyl ether, ethylene glycol divinyl ether, ethylene glycol monovinyl ether, propylene glycol divinyl ether, neopentyl glycol divinyl ether, glycerol divinyl ether, glycerol trivinyl ether, triethylene glycol divinyl ether, trimethylolpropane monovinyl ether, trimethylolpropane divinyl ether, trimethylolpropane trivinyl ether, allyl vinyl ether, 2,2-bis(4-cyclohexanol)propane divinyl ether, and 2,2-bis(4-cyclohexanol)trifluoropropane divinyl ether.

In the following, there will be explained examples of the binder in the interference fringe recording by the polymerization reaction, for each of the cases where A) refractive index of polymerizable compound>refractive index of binder, and (B) where refractive index of binder>refractive index of polymerizable compound.

Preferred Examples of the Binder for the Case (A) where Refractive Index of Polymerizable Compound>Refractive Index of Binder In this case, the binder preferably has a low refractive index, and preferably does not contain an aryl group, an aromatic heterocyclic group, a chlorine atom, a bromine atom, an iodine atom or a sulfur atom at all.

Specific examples of the preferred low refractive index binder include an acrylate or α-alkylacrylate ester, an acidic polymer or an interpolymer thereof (such as polymethyl methacrylate, polyethyl methacrylate or a copolymer of methyl methacrylate and another alkyl (meth)acrylate), a polyvinyl ester (such as polyvinyl acetate, polyvinyul acetate/acrylate, polyvinyl acetate/methacrylate or hydrolyzed polyvinyl acetate), an ethylene-vinyl acetate copolymer, a saturated or unsaturated polyurethane, a high-molecular polyoxyethylene of a polymer or a copolymer of butadiene or isoprene and a polyglycol having an average molecular weight of about 4,000-1,000,000, an epoxylated substance (such as an epoxylated substance having an acrylate or methacrylate group), a polyamide (such as N-methoxymethyl polyhexamethylene adipamide), a cellulose ester (such as cellulose acetate, cellulose acetate succinate or cellulose acetate butyrate), a cellulose ether (such as methylcellulose, ethylcellulose, or ethylbenzylcellulose), a polycarbonate, a polyvinylacetal (such as polyvinylbutyral or polyvinylformal), a polyvinyl alcohol and a polyvinylpyrrolidone.

Also a fluorine-containing polymer is preferable as a low refractive index binder. A preferred example is a polymer soluble in an organic solvent and constituted of a fluoroolefin as an essential component and a copolymerizing component of one or more unsaturated monomers selected from an alkyl vinyl ether, an alicyclic vinyl ether, hydroxy vinyl ether, an olefin, a haloolefin, an unsaturated carboxylic acid or an ester thereof, and a carboxylic acid vinyl ester. It preferably has a weight-averaged molecular weight of 5,000 to 200,000, and a fluorine atom content of 5-70 mass % (weight %).

A specific example of the fluorine-containing polymer is a Lumiflon series polymer having hydroxyl groups and soluble in organic solvents (for example Lumiflon LF200, weight-averaged molecular weight: ca. 50,000, manufactured by Asahi Glass Co.). Fluorine-containing polymers, soluble in organic solvents, are also commercially available from Daikin Ltd., Central Glass Co., Penwalt Inc. and the like, and such polymer are also usable.

Preferred examples also include a silicon compound such as poly(dimethylsiloxane) and an aromatic-free silicone oil.

Also an aromatic-free epoxy oligomer can be utilized as the low refractive index binder.

Preferred Examples of the Binder for the Case (B) where Refractive Index of Binder>Refractive Index of Polymerizable Compound In this case, the binder preferably has a high refractive index, and preferably contains at least an aryl group, an aromatic heterocyclic group, a chlorine atom, a bromine atom, an iodine atom or a sulfur atom and more preferably contains an aryl group.

Specific examples of the preferred high refractive index binder include a polymer of polystyrene or a copolymer there of with acrylonitrile, maleic anhydride, acrylic acid, methacrylic acid or an ester thereof, a copolymer of vinylidene chloride (such as a vinylidene chloride/acrylonitrile copolymer, a vinylidene chloride/methacrylate copolymer, or a vinylidene chloride/vinyl acetate copolymer), a polyvinyl chloride or a copolymer thereof (such as a polyvinyl chloride/acetate copolymer or a polyvinyl chloride/acrylonitrile copolymer), a polyvinylbenzal synthetic rubber (such as a butadiene/acrylonitrile copolymer), an acrylonitrile/butadiene/styrene copolymer, a methacrylate/acrylonitrile/butadiene/styrene copolymer, a 1,3-polymer of 2-chlorobutadiene, chlorinated rubber, a styrene/butadiene/styrene block copolymer or a styrene/isoprene/styrene block copolymer), a copolyester (such as a mixture of copolyesters prepared from a reaction product of a polymethylene glycol of a formula $HO(CH_2)_nOH$ in which n is an integer of 2-10, and (1) hexahydroterephthalic acid, sebacic acid and terephthalic acid, (2) terephthalic acid, isophthalic acid and sebacic acid, (3) terephthalic acid and sebacic acid, or (4) terephthalic acid and isophthalic acid, and (5) a reaction product of the aforementioned glycol with (i) terephthalic acid, isophthalic acid and sebacic acid or (ii) terephthalic acid, isophthalic acid, sebacic acid and adipic acid), a poly-N-vinylcarbazole or a copolymer thereof, and a polycarbonate formed from a carbonate ester and bisphenol.

Preferred examples also include a silicon compound such as poly(methylphenylsiloxane), or 1,3,5-trimethyl-1,1,3,5,5-pentaphenyltrisiloxane, and an aromatic-rich silicone oil.

Also an epoxy oligomer rich in aromatics can be employed as the high refractive index reactive binder.

A polymerization initiator to be employed in the interference fringe recording by the polymerization reaction of the invention is preferably a radical polymerization initiator (radical generator) selected from a ketone, an organic peroxide, a trihalomethyl-substituted triazine, a diazonium salt, a diaryliodonium salt, a sulfonium salt, a borate salt, a diaryliodonium-organic boron complex, a sulfonium-organic boron complex, a metal allene complex and a sulfonate ester, or a cationic polymerization initiator (acid generator), or a compound having both functions.

Also an acid amplifier can be advantageously employed for achieving a higher sensitivity. Preferred examples of the acid amplifier are described for example in Japanese Patent Application No. 2003-182849.

Also an anionic polymerization and an anionic polymerization initiator (base generator) can be advantageously utilized. In such cases, a base amplifier can be advantageously employed for achieving a higher sensitivity. Preferred examples of the anionic polymerization initiator and the acid amplifier are described for example in Japanese Patent Application No. 2003-178083.

Preferred examples of the polymerization initiator, the polymerizable compound and the binder are described, for example, in Japanese Patent Application No. 2004-238427.

Preferred specific examples of the polymerization initiator are shown in the following, but the present invention is not limited to such examples.

<Radical Polymerization Initiator (Radical Generator), Cationic Polymerization Initiator (Acid Generator)>

I-1
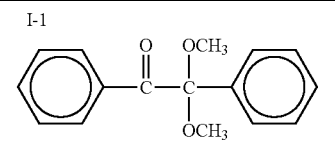

I-2
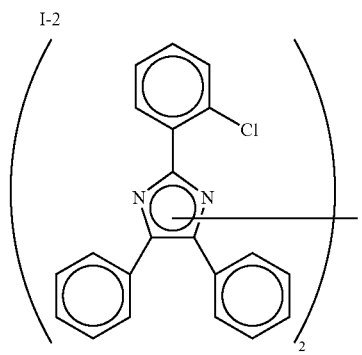

I-3
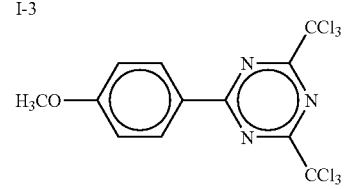

I-4
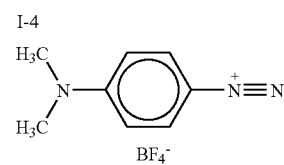

I-5
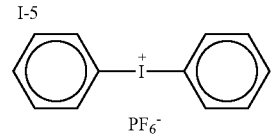

I-6
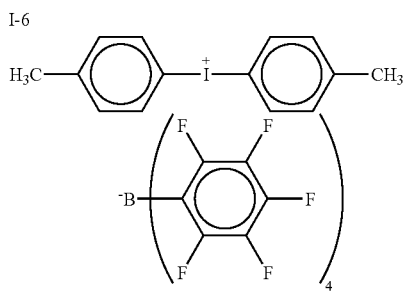

-continued
I-7
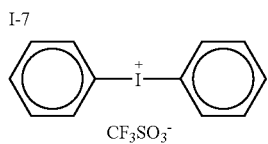
I-8
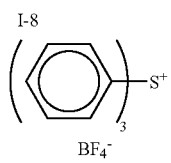
I-9
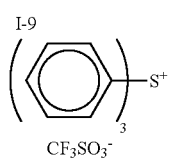
I-10
I-11
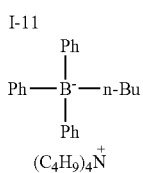
I-12
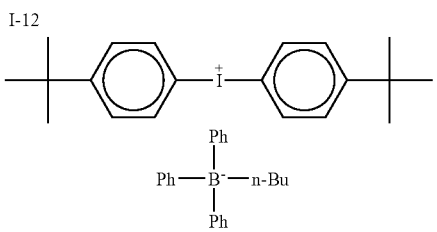
I-13
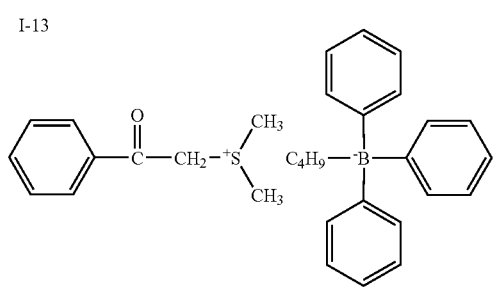
-continued
I-14
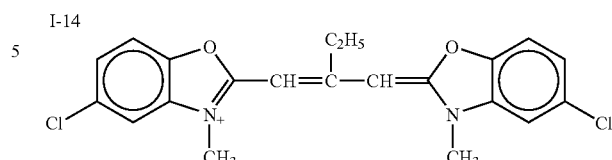
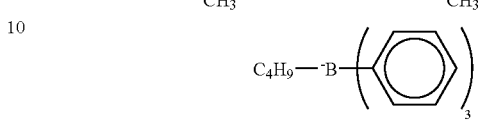
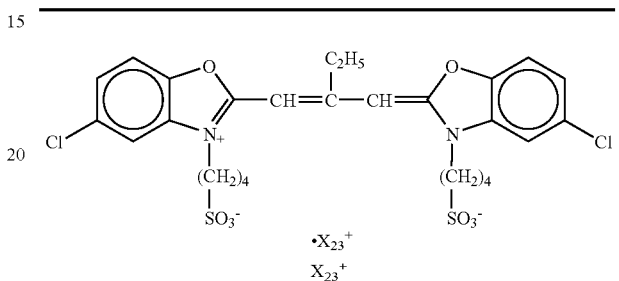
I-15
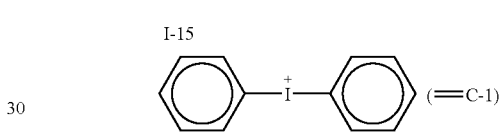
I-16
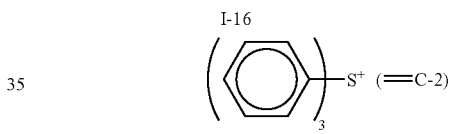
I-17
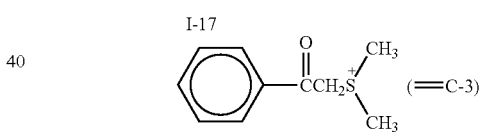
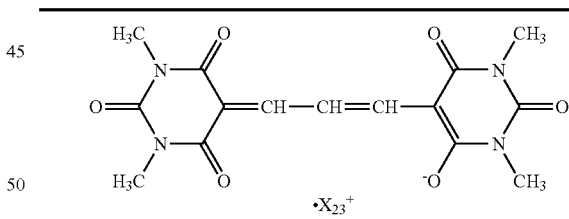
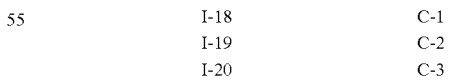
| I-18 | C-1 |
| I-19 | C-2 |
| I-20 | C-3 |
I-21

-continued

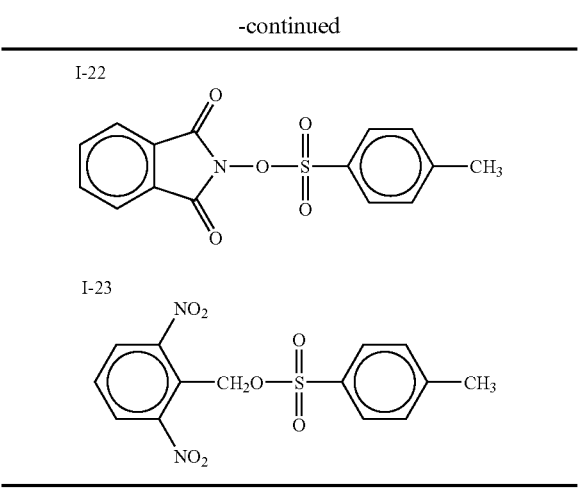

Anionic Polymerization Initiator (Base Generator)

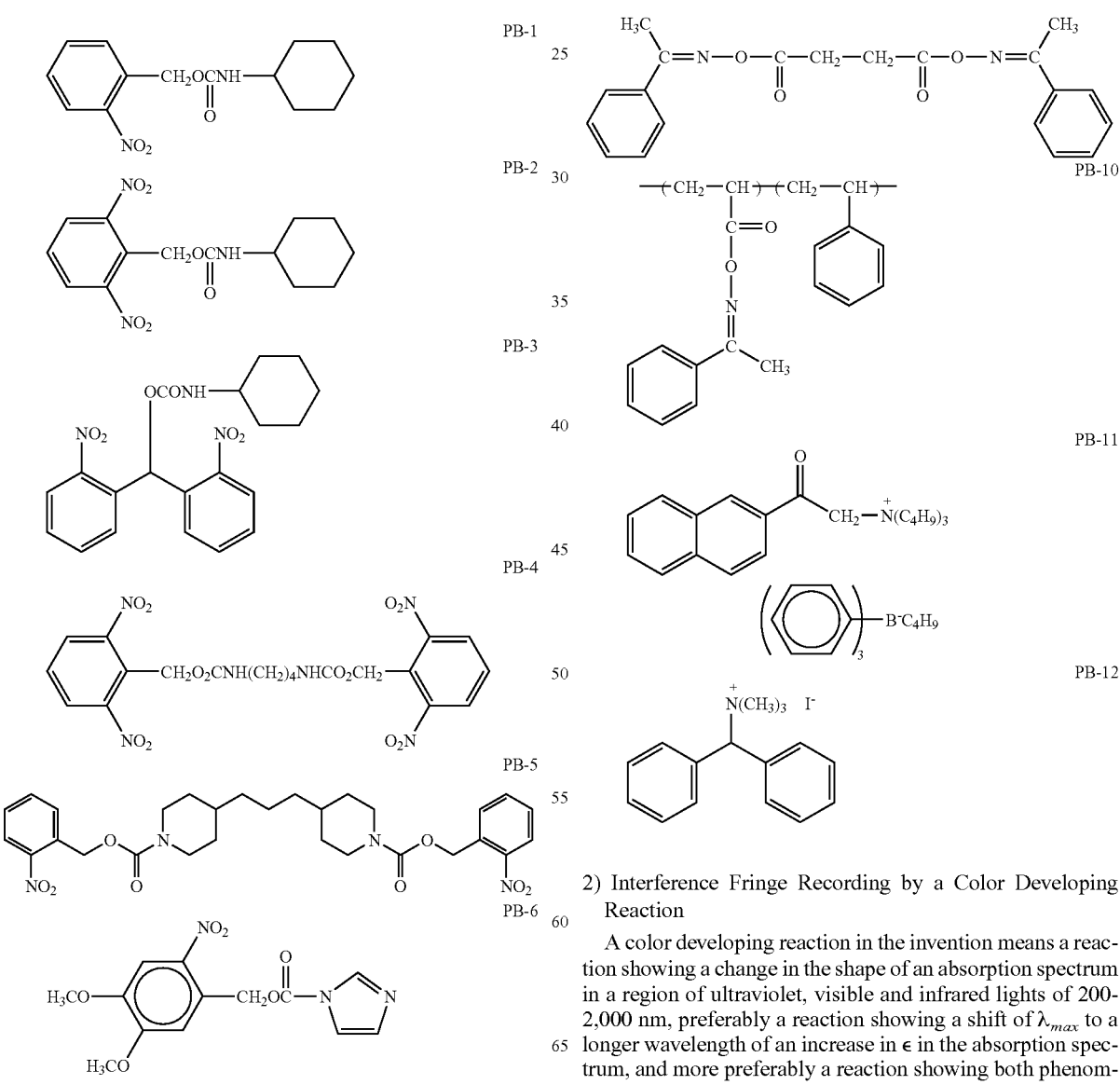

2) Interference Fringe Recording by a Color Developing Reaction

A color developing reaction in the invention means a reaction showing a change in the shape of an absorption spectrum in a region of ultraviolet, visible and infrared lights of 200-2,000 nm, preferably a reaction showing a shift of $\lambda_{max}$ to a longer wavelength of an increase in $\epsilon$ in the absorption spectrum, and more preferably a reaction showing both phenomena. The color developing reaction more preferably takes place within a wavelength region of 200-1,000 nm, and further preferably within a wavelength region of 300-900 nm.

In the case the recording is performed by a color developing reaction, the hologram recording material of the invention preferably includes at least:

1) a sensitizing dye capable of absorbing light upon holographic exposure thereby generating an excited state; and
2) an interference fringe-recording component containing a dye precursor capable of forming a color developed substance having an absorption shifted to a longer wavelength than in an original state and having no absorption in a wavelength of a hologram reproducing light, and capable of recording interference fringes providing a refractive index modulation through a color development by an electron or energy transfer from an excited state of the sensitizing dye or the color developed substance.

A refractive index of a dye generally assumes a high value within a longer wavelength region starting from about a wavelength ($\lambda_{max}$) of a linear absorption maximum, and assumes a very high value particularly in a region from $\lambda_{max}$ to a wavelength longer than λmax by about 200 nm, exceeding 1.8 in certain dyes and also exceeding 2.0 in certain cases. On the other hand, non-dye organic compounds such as a binder polymer generally have a refractive index of about 1.4 to 1.6.

It will therefore be understood that a color development of the dye precursor by the holographic exposure is preferable not only for forming a difference in the absorbance but also for forming a large difference in the refractive index.

In the hologram recording material of the invention, the refractive index of the dye formed from the recording components preferably becomes maximum in the vicinity of a wavelength of a laser to be employed for reproduction.

Preferred examples of the sensitizing dye are same as those described in the foregoing.

Preferred examples of the interference fringe-recording components include following combinations, of which preferred specific examples are shown in Japanese Patent Application No. 2004-238077.

i) A combination including at least an acid color-developable dye precursor capable of color development with an acid, as a dye precursor, and an acid generator, the combination if necessary further including an acid amplifier.

The acid generator is preferably a diaryliodonium salt, a sulfonium salt, or a sulfonate ester, and the acid generator (cationic polymerization initiator) mentioned above can be employed advantageously.

A color developed substance generated from the acid color-developable dye precursor is preferably a xanthene dye, a fluoran dye or a triphenylmethane dye. Particularly preferable examples of the acid color-developable dye precursor are shown in the following, but the present invention is not limited to such examples.

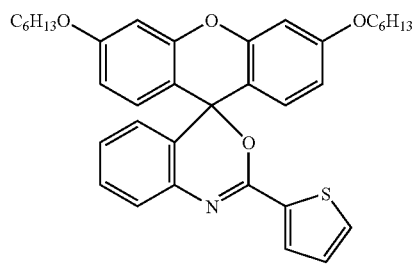

L-1

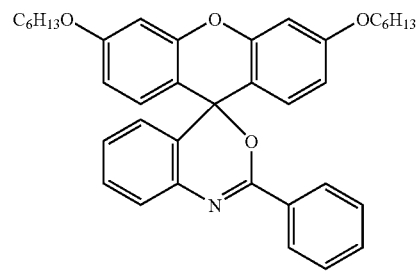

L-2

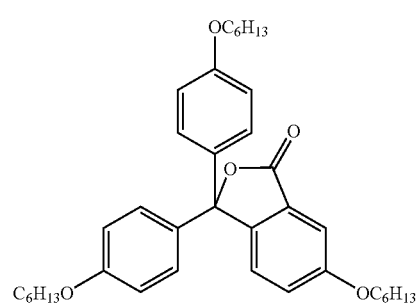

L-3

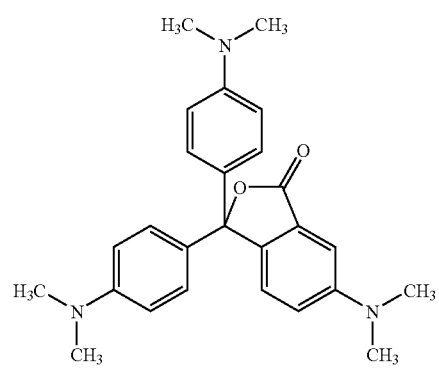

L-4

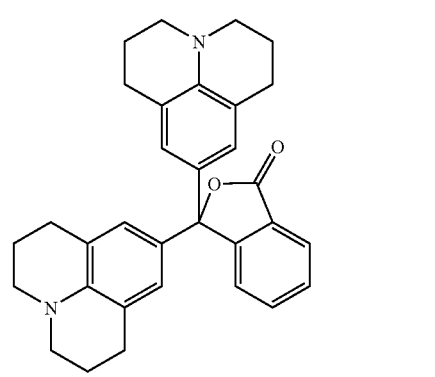

L-5

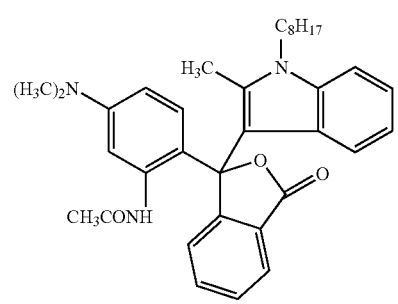

L-6

-continued

L-7
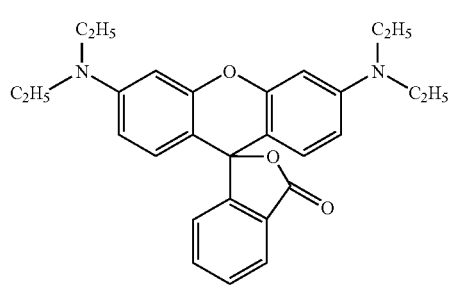

L-8
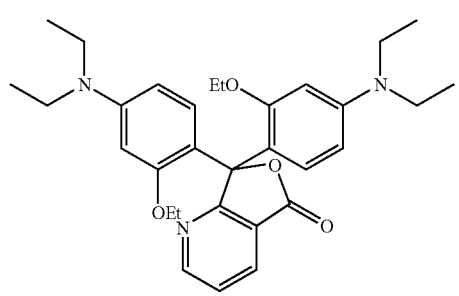

L-9
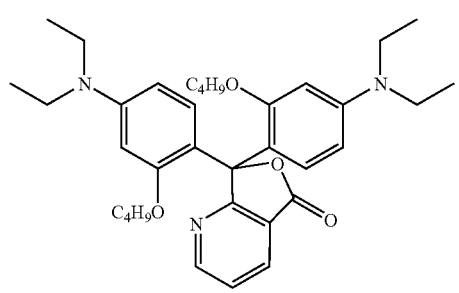

-continued

L-10
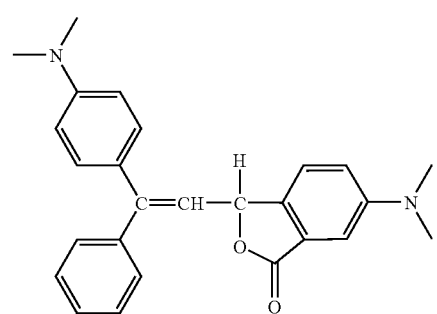

L-11
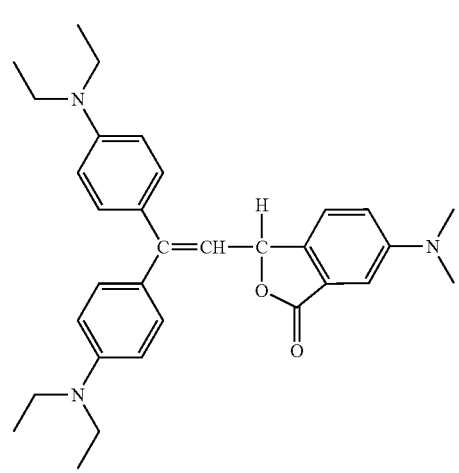

Also as the acid color-developable dye precursor of the invention, a cyanine base (leucocyanine dye) which performs a color development by an acid (proton) addition can also be employed advantageously. Preferred examples of the cyanine base are shown in the following, but the present invention is not limited to such examples.

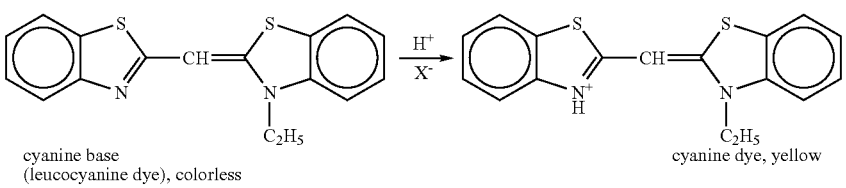

cyanine base
(leucocyanine dye), colorless cyanine dye, yellow

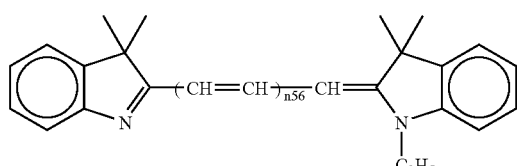

| | n56 |
|---|---|
| LC-1 | 0 |
| LC-2 | 1 |
| LC-3 | 2 |

-continued
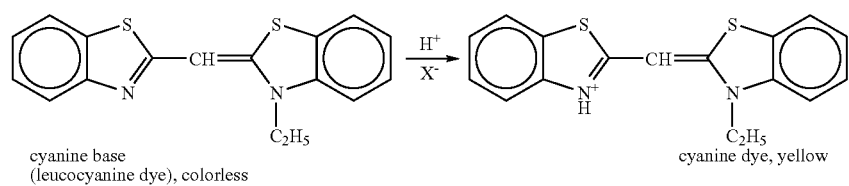
cyanine base
(leucocyanine dye), colorless
cyanine dye, yellow
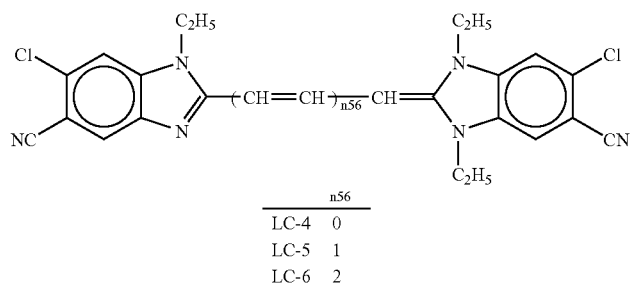
| | n56 |
|---|---|
| LC-4 | 0 |
| LC-5 | 1 |
| LC-6 | 2 |
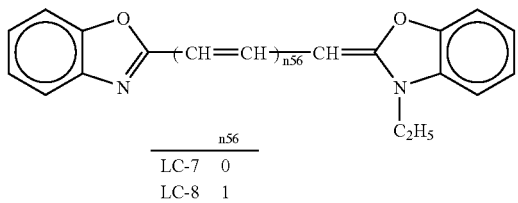
| | n56 |
|---|---|
| LC-7 | 0 |
| LC-8 | 1 |
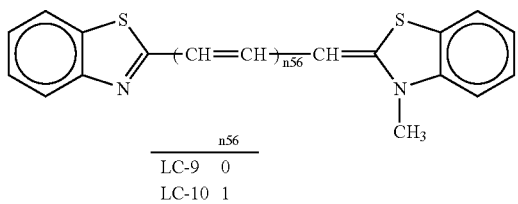
| | n56 |
|---|---|
| LC-9 | 0 |
| LC-10 | 1 |
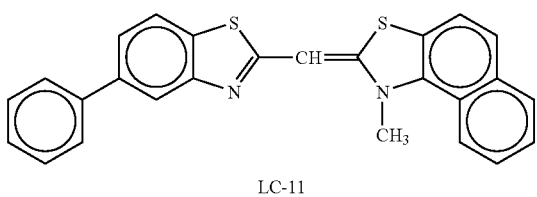
LC-11
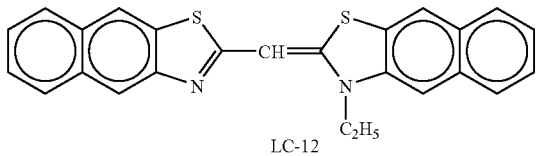
LC-12
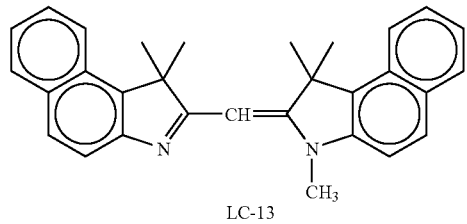
LC-13

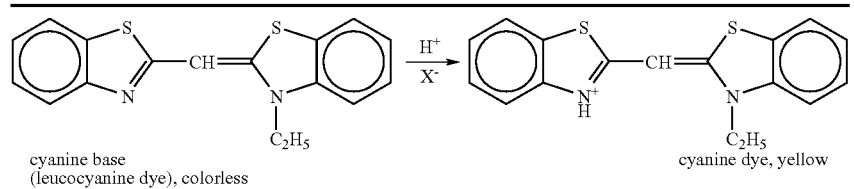

cyanine base
(leucocyanine dye), colorless cyanine dye, yellow

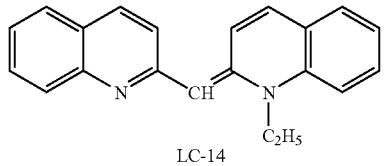

LC-14

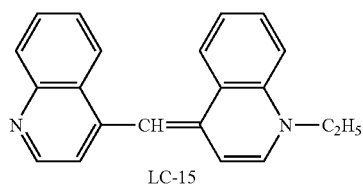

LC-15 ii) A combination including at least a base color-developable dye precursor, as a dye precursor, and a base generator, the combination if necessary further including a base amplifier.

The base generator is preferably the base generator (anionic polymerization initiator) mentioned above, and the base color-developable dye precursor can be a non-dissociated substance of a dissociable azo dye, a dissociable azomethine dye, a dissociable oxonol dye, a dissociable xanthene dye, a dissociable fluoran dye, or a dissociable triphenylmethane dye.

Particularly preferable examples of the base color-developable dye precursor are shown in the following, but the present invention is not limited to such examples.

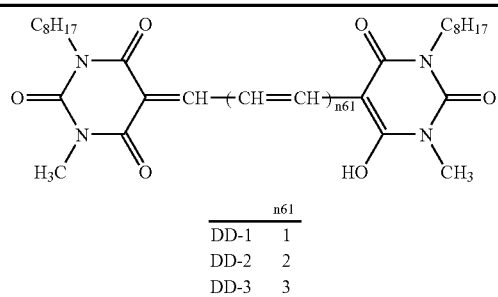

| | n61 |
|---|---|
| DD-1 | 1 |
| DD-2 | 2 |
| DD-3 | 3 |

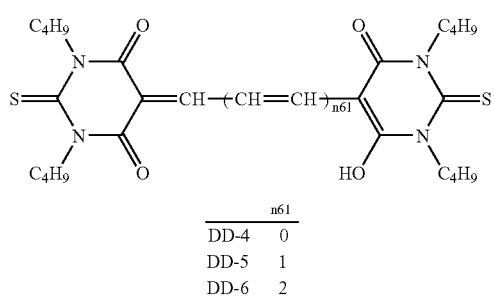

| | n61 |
|---|---|
| DD-4 | 0 |
| DD-5 | 1 |
| DD-6 | 2 |

-continued

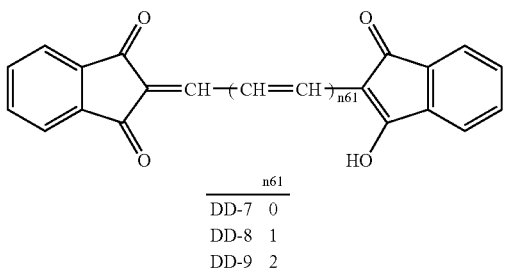

| | n61 |
|---|---|
| DD-7 | 0 |
| DD-8 | 1 |
| DD-9 | 2 |

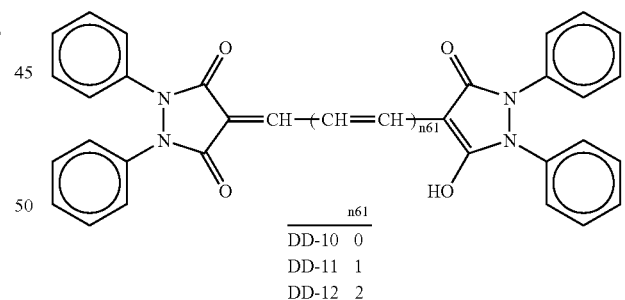

| | n61 |
|---|---|
| DD-10 | 0 |
| DD-11 | 1 |
| DD-12 | 2 |

| | n62 |
|---|---|
| DD-13 | 0 |
| DD-14 | 1 |

-continued
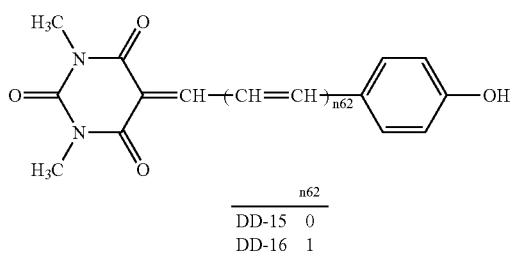
| | n62 |
|---|---|
| DD-15 | 0 |
| DD-16 | 1 |
DD-17
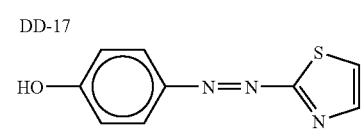
DD-18
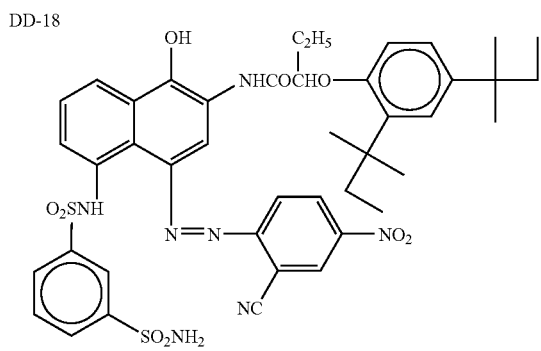
DD-19
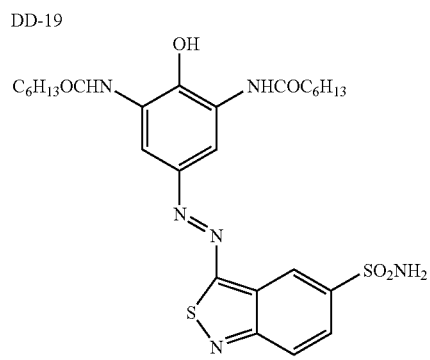
DD-20
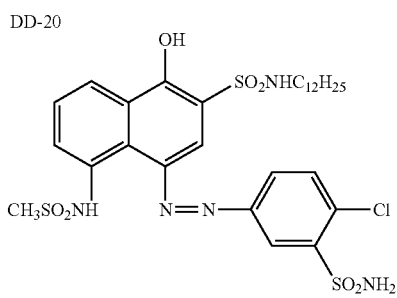
-continued
DD-21
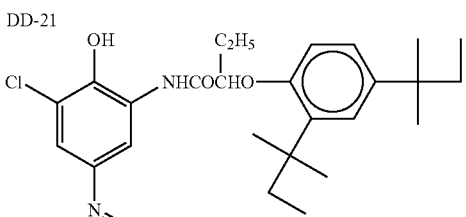
DD-22
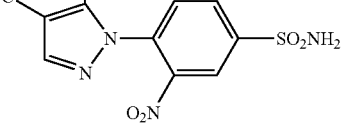
DD-23
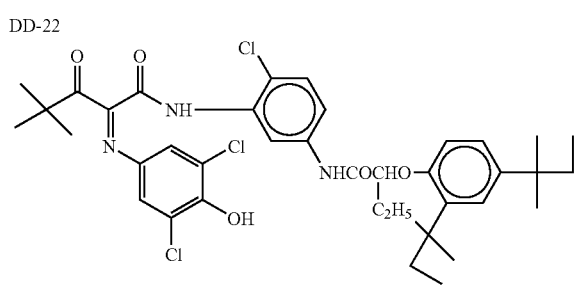
DD-24
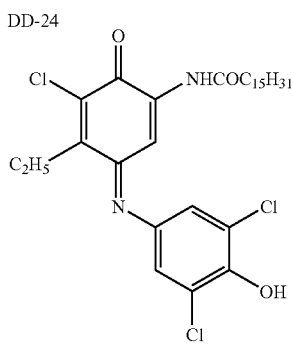

-continued

DD-25
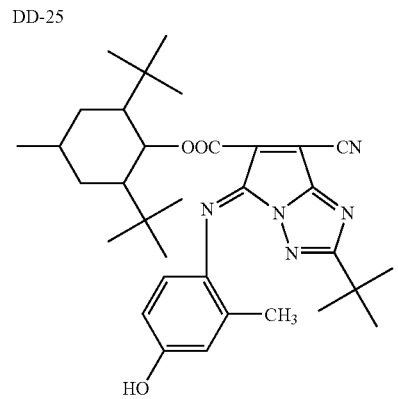

DD-26
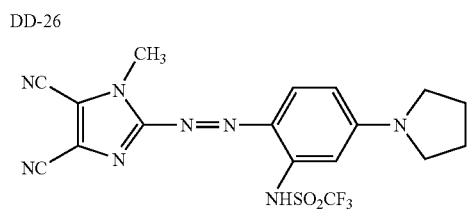

DD-27
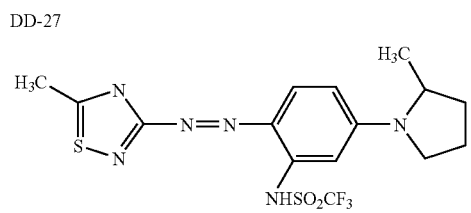

DD-28
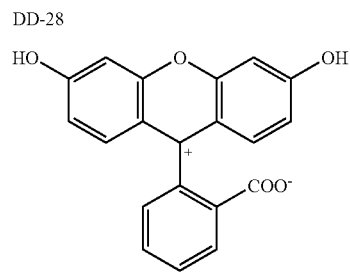

-continued

DD-29
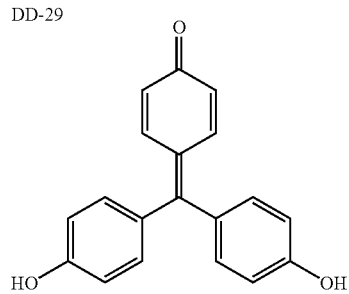

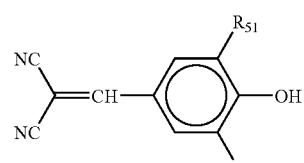

| | $R_{51}$ | $R_{52}$ |
|---|---|---|
| DD-30 | —H | —H |
| DD-31 | —Cl | —H |
| DD-32 | —Cl | —Cl |

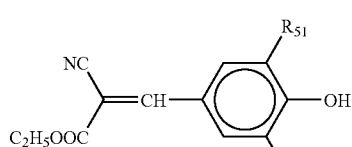

| | $R_{51}$ | $R_{52}$ |
|---|---|---|
| DD-33 | —H | —H |
| DD-34 | —Cl | —H |
| DD-35 | —Cl | —H |
| DD-36 | —H | —OCH$_3$ |
| DD-37 | —CH$_3$ | —CH$_3$ |
| DD-38 | —C$_3$H$_7$-i | —C$_3$H$_7$-i |

DD-39
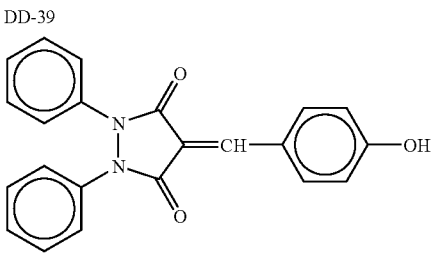

iii) A case of containing a compound, in which an organic compound site having a function of cleaving a covalent bond by an electron transfer or an energy transfer with an excited state of the sensitizing dye, and an organic compound site capable of forming a color developed substance when covalent bonded and when released, are covalent bonded. A base may be included further if necessary. Particularly preferable examples are shown in the following, but the present invention is not limited to such examples.

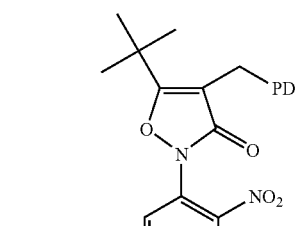
| | PD |
|---|---|
| E-1 | PD-1 |
| E-2 | PD-2 |
| E-3 | PD-22 |
| E-4 | PD-27 |
| E-5 | PD-8 |
| E-6 | PD-10 |
| E-7 | PD-12 |
| E-8 | PD-13 |
| E-9 | PD-16 |
| E-10 | PD-18 |
| E-11 | PD-19 |
| E-12 | PD-20 |
| E-13 | PD-24 |
| E-14 | PD-25 |
| E-15 | PD-29 |
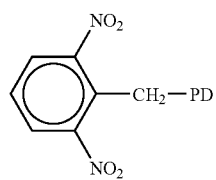
| | PD |
|---|---|
| E-16 | PD-22 |
| E-17 | PD-2 |
| E-18 | PD-27 |
| E-19 | PD-7 |
| E-20 | PD-8 |
| E-21 | PD-11 |
| E-22 | PD-14 |
| E-23 | PD-15 |
| E-24 | PD-17 |
| E-25 | PD-18 |
| E-26 | PD-20 |
| E-27 | PD-23 |
| E-28 | PD-25 |
| E-29 | PD-26 |
| E-30 | PD-29 |
PD-1
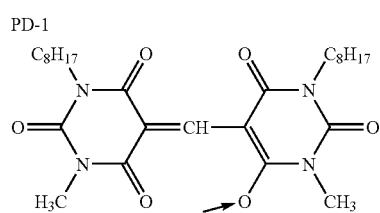
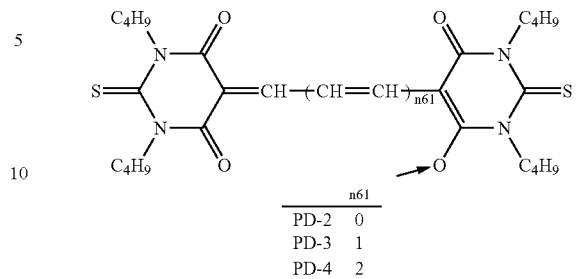
| | n61 |
|---|---|
| PD-2 | 0 |
| PD-3 | 1 |
| PD-4 | 2 |
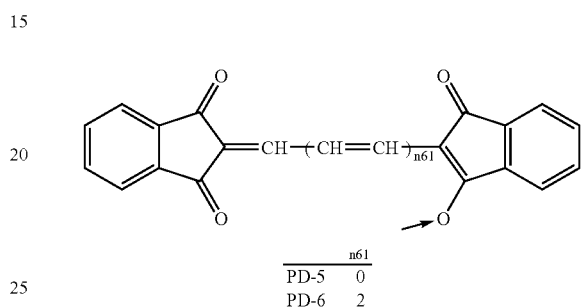
| | n61 |
|---|---|
| PD-5 | 0 |
| PD-6 | 2 |
PD-7
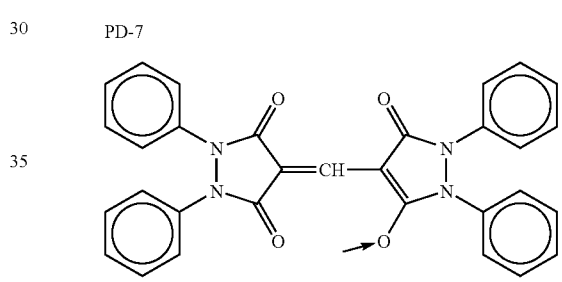
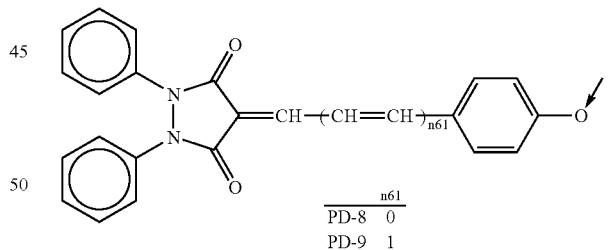
| | n61 |
|---|---|
| PD-8 | 0 |
| PD-9 | 1 |
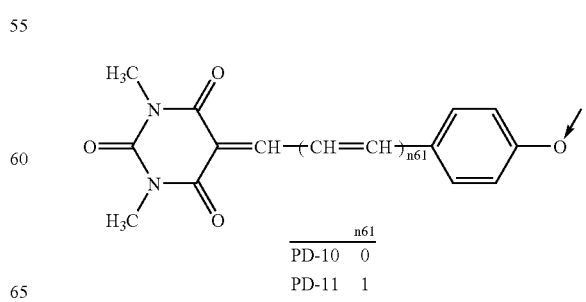
| | n61 |
|---|---|
| PD-10 | 0 |
| PD-11 | 1 |

PD-12
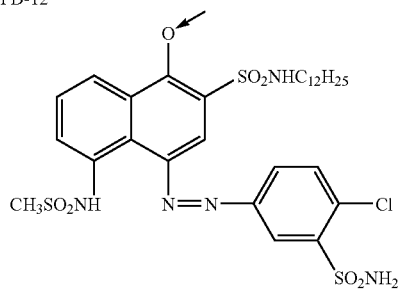
PD-13
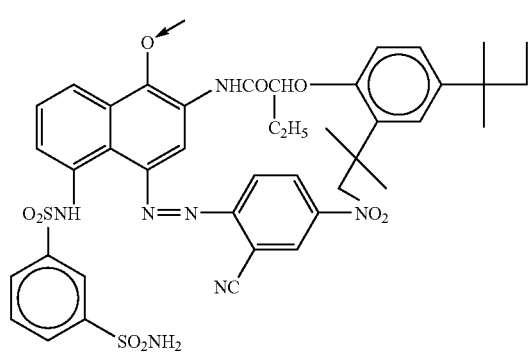
PD-14
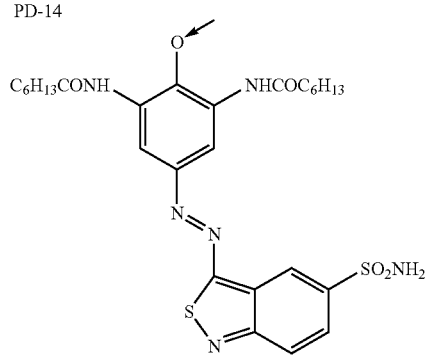
PD-15
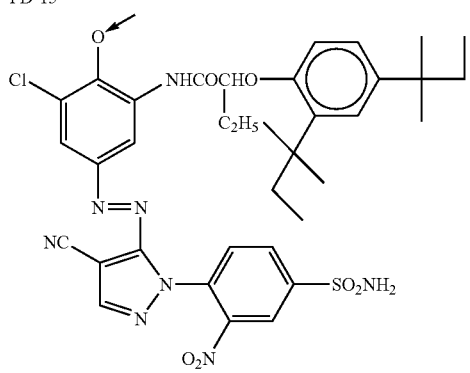
PD-16
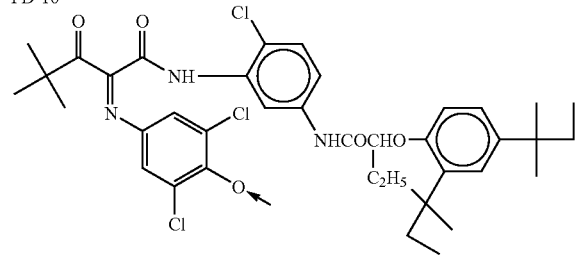
PD-17
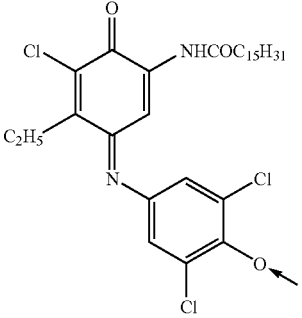
PD-18
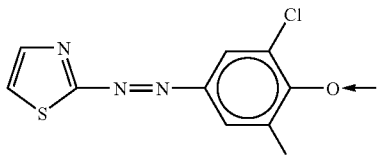
PD-19
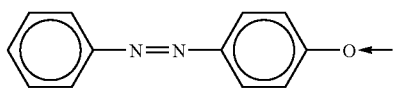
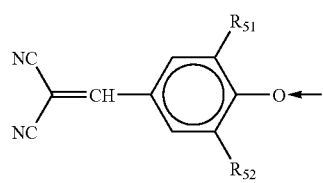
|       | R$_{51}$ | R$_{52}$ |
|-------|------|------|
| PD-20 | —H   | —H   |
| PD-21 | —Cl  | —H   |
| PD-22 | —Cl  | —Cl  |
| PD-23 | —Cl  | —COOC$_2$H$_5$ |
| PD-24 | —Cl  | —CN  |

-continued

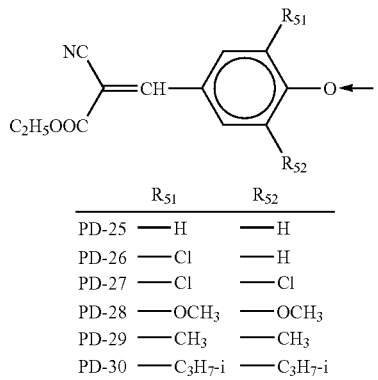

| | $R_{51}$ | $R_{52}$ |
|---|---|---|
| PD-25 | —H | —H |
| PD-26 | —Cl | —H |
| PD-27 | —Cl | —Cl |
| PD-28 | —OCH$_3$ | —OCH$_3$ |
| PD-29 | —CH$_3$ | —CH$_3$ |
| PD-30 | —C$_3$H$_7$-i | —C$_3$H$_7$-i | iv) A case of containing a compound capable of a reaction by an electron transfer with an excited state of the sensitizing dye thereby causing a change in the absorption. So-called electrochromic compound can be employed advantageously.

It is more preferable to include a binder polymer, of which preferred examples include those described in the aforementioned (1) polymerization reaction and those described in Japanese Patent Application No. 2004-238077.

3) Interference Fringe Recording by a Color Developing Reaction Amplified by a Self-Sensitization with a Color Developed Substance of a Latent Image (a Color Developing-Latent Image)

It is a hologram recording method characterized by including at least a first step of generating a color developed substance, having no absorption in a wavelength of a hologram reproducing light, as a latent image by a holographic exposure, and a second step of irradiating the latent image of the color developed substance with light of a wavelength region, which is different from that of the holographic exposure and in which the sensitizing dye has a molar absorption coefficient of 5,000 or less, to generate a color developed substance by a self-sensitized amplification thereby recording interference fringes providing a refractive index modulation, and performing these steps in a dry process, and the method is advantageous in a high-speed writing and a reproduction with a high S/N ratio.

A "latent image" means "a refractive index difference preferably ½ or less of a refractive index difference formed after the second step" (namely an amplification of preferably 2 times or more being performed in the second step), more preferably an image formed by a refractive index difference of ⅕ or less, further preferably ⅒ or less and most preferably ⅟30 or less (namely an amplification of more preferably 5 times or more, further preferably 10 times or more and most preferably 30 times or more being performed in the second step).

The second step is preferably performed by a light irradiation and/or a heat application, more preferably by a light irradiation, and the light irradiation is preferably performed by an exposure on the entire surface (so-called flush exposure, blanket exposure or non-imagewise exposure).

A preferred light source to be employed can be a visible light laser, an ultraviolet light laser, an infrared light laser, a carbon arc lamp, a high-pressure mercury lamp, a xenon lamp, a metal halide lamp, a fluorescent lamp, a tungsten lamp, an LED or an organic EL. It is also preferable to employ a sharp-cut filter, a band-pass filter or a diffraction grating if necessary, in order to perform the light irradiation in a specified wavelength region.

A hologram recording material capable of such hologram recording method preferably includes at least:

1) a sensitizing dye capable of absorbing light upon holographic exposure thereby generating an excited state thereof, and
2) an interference fringe-recording component containing a dye precursor capable of forming a color developed substance having an absorption shifted to a longer wavelength than in an original state and having no absorption in a wavelength of a hologram reproducing light, and capable of recording interference fringes providing a refractive index modulation through a color development by an electron or energy transfer from an excited state of the sensitizing dye or the color developed substance.

Preferred examples of the sensitizing dye and the interference fringe-recording component are same as those described in 2) color developing reaction.

In the wavelength region of the irradiating light in the second step, the sensitizing dye more preferably has a molar absorption coefficient of linear absorption of 1000 or less, further preferably 500 or less.

Also in the wavelength region of the irradiating light in the second step, the color developed substance preferably has a molar absorption coefficient of 1000 or higher.

In the following, there will be explained the concept of "color developing reaction amplified by a self-sensitization with a color developed substance of a color developing-latent image".

As an example, a light of 532 nm of a YAG-SHG laser irradiates a hologram recording material and is absorbed by the sensitizing dye to generate an excited state. An energy transfer or an electron transfer is caused from the excited state of the sensitizing dye to an interference fringe-recording component to change a dye precursor, contained therein, to a color developed substance, thereby forming a latent image by the color development (foregoing being first step). Then a light of a wavelength region of 350-420 nm is irradiated to cause an absorption in the color developed substance, which is amplified by a self sensitization (foregoing being second step). In dark parts of the interference, the latent image is not much generated in the first step, so that the self-sensitized color developing reaction scarcely takes place in the second step. As a result, a large modulation in the refractive index can be formed between light part and dark part of the interference thereby enabling a recording of interference fringes. The hologram recording material thus recorded, when irradiated again with the laser light of 532 nm, can reproduce the recorded information or image or can function as a desired optical material.

Preferred examples of the color developing reaction amplified by a self-sensitization with a color developed substance of a color developing-latent image include those described in Japanese Patent Application No. 2004-238427.

4) Interference Fringe Recording by a Polymerization Reaction Sensitized with a Color Developed Substance of a Latent Image (a Color Developing-Latent Image)

Preferably, it is a hologram recording method characterized by including at least a first step of generating a color developed substance, having no absorption in a wavelength of a hologram reproducing light, as a latent image upon holographic exposure, and a second step of irradiating the latent image of the color developed substance with light of a wavelength region, which is different from that of the holographic exposure, to initiate a polymerization thereby recording interference fringes providing a refractive index modulation, and performing these steps in a dry process, and the method is advantageous in a high-speed writing and a storability.

A method in which, in the second step, the polymerization is initiated while the color developed substance is generated by a self-sensitization amplification is also preferred.

A hologram recording material capable of such hologram recording method preferably includes at least:

1) a sensitizing dye capable of absorbing light upon holographic exposure in the first step thereby generating an excited state thereof;
2) a group of dye precursors capable of forming a color developed substance having an absorption shifted to a longer wavelength than in an original state, also having an absorption in a wavelength region in which the sensitizing dye has a molar absorption coefficient of 5,000 or less and having no absorption in a wavelength of a hologram reproducing light, by an electron transfer or an energy transfer from an excited state of the sensitizing dye in the first step or from an excited state of the color developed substance in the second step;
3) a polymerization initiator capable of initiating a polymerization of a polymerizable compound by an electron transfer or an energy transfer from an excited state of the sensitizing dye in the first step or from an excited state of the color developed substance in the second step;
4) a polymerizable compound; and
5) a binder.

In this case, components 2)-5) constitute the interference fringe-recording components.

Preferred examples of the sensitizing dye and the interference fringe-recording component are the same as those described in 2) color developing reaction.

Preferred examples of the polymerization initiator, the polymerizable compound and the binder are the same as those described in 1) polymerization reaction.

In the wavelength region of the irradiating light in the second step, the sensitizing dye more preferably has a molar absorption coefficient of linear absorption of 1000 or less, further preferably 500 or less.

Also in the wavelength region of the irradiating light in the second step, the color developed substance preferably has a molar absorption coefficient of 1000 or higher.

In the hologram recording method of the invention and the hologram recording material capable of such hologram recording method, it is preferable, for the storability and for the non-destructive reproduction, to perform a fixation by decomposing the sensitizing dye in any one of the first step, the second step and the subsequent fixing step by a light irradiation and/or a heat application, and more preferably to perform a fixation by decomposing the sensitizing dye in any one of the first step, the second step and a subsequent fixing step by a light irradiation and/or a heat application, and decomposing the color developed substance in any one of the second step and the subsequent fixing step by a light irradiation and/or a heat application.

In the following, there will be explained the concept of "polymerization reaction sensitized with a color developed substance of a color developing-latent image".

As an example, a light of 532 nm of a YAG-SHG laser irradiates a hologram recording material and is absorbed by the sensitizing dye to generate an excited state. An energy transfer or an electron transfer is caused from the excited state of the sensitizing dye to the interference fringe-recording component to change a dye precursor, contained therein, to a color developed substance, thereby forming a latent image by the color development (foregoing being first step). Then a light of a wavelength region of 350-420 nm is irradiated to cause an absorption in the color developed substance, thereby causing an electron transfer or an energy transfer to the polymerization initiator, thus inducing an activation thereof and initiating a polymerization reaction. A part where the polymerization takes place shows a high refractive index because of a localization of the polymerizable compound, in the case the polymerizable compound has a refractive index larger than that of the binder (foregoing being second step). In dark parts of the interference, the latent image is not much generated in the first step, so that the polymerization does not proceed much in the second step and a ratio of the binder becomes higher. As a result, a large modulation in the refractive index can be formed between light part and dark part of the interference thereby enabling a recording of interference fringes. A hologram recording material excellent in a non-destructive reproducibility and a storability can be obtained by decomposing and color-erasing of the sensitizing dye and the color developed substance in the first step, or the second step or a subsequent fixing step.

The hologram recording material thus recorded, when irradiated again with the laser light of 532 nm, can reproduce the recorded information or image or can function as a desired optical material.

Preferred examples of the polymerization reaction sensitized with a color developed substance formed of a color developing-latent image include those described in Japanese Patent Application No. 2004-238392.

5) Interference Fringe Recording by an Alignment Change in a Compound Having a Specific Birefringence It is a hologram recording method of causing an alignment change in a compound having a specific birefringence by holographic exposure and fixing such alignment by a chemical reaction, thereby recording interference fringes providing an unrewritable refractive index modulation. The compound having a specific birefringence is preferably a liquid crystalline compound, more preferably a low-molecular liquid crystalline compound and further preferably a low-molecular liquid crystalline compound having a polymerizable group. Preferred examples include those described in Japanese Patent Application No. 2003-327594.

6) Interference Fringe Recording by a Color Erasing Reaction of a Dye

It is a hologram recording method employing at least a color-erasable dye and utilizing a color erasure of the color-erasable dye by holographic exposure thereby forming interference fringes providing a refractive index modulation.

In the invention, a color-erasable dye generally means a dye which has an absorption in a region of ultraviolet, visible and infrared light of 200-2,000 nm, and which causes, directly or indirectly by light irradiation, a shift of $\lambda_{max}$ to a shorter wavelength or a decrease in the molar absorption coefficient of the absorption, and more preferably a dye causing both of such changes. The color erasing reaction more preferably takes place within a wavelength region of 200-1,000 nm, and further preferably within a wavelength region of 300-900 nm.

Also preferred combinations include:

(A) a hologram recording method characterized in that the color-erasable dye is a sensitizing dye having an absorption at a wavelength of a holographic exposure, and absorbs light upon holographic exposure to cause a self color erasure thereby recording interference fringes by a refractive index modulation; and
(B) a hologram recording method characterized by utilizing at least a sensitizing dye having an absorption at a wavelength of holographic exposure, and a color-erasable dye having a molar absorption coefficient of 1,000 or less, preferably 100 or less at a wavelength of a hologram reproducing light, and in that the sensitizing dye absorbs light upon the holographic exposure and causes a color erasure of the color-erasable dye by an electron transfer or an energy transfer utilizing an excitation energy, thereby forming interference fringes providing a refractive index modulation; and the method (B) is more preferable.

In this case, the color-erasable dye constitutes an interference fringe-recording component.

There is also preferred a hologram recording method utilizing a color-erasing agent precursor in addition to a color-erasable dye and a sensitizing dye, in which, after an excited state is generated by the sensitizing dye or the color-erasable dye by holographic exposure, an energy transfer or an electron transfer is performed with the color-erasing agent precursor to generate a color-erasing agent therefrom, which causes a color erasure of the color-erasable dye thereby forming interference fringes providing a refractive index modulation.

In such case the color-erasing agent is preferably a radical, an acid, a base, a nucleophilic agent, an electrophilic agent, or a singlet oxygen, and the color-erasing agent precursor is therefore preferably a radical generator, an acid generator, a base generator, a nucleophilic agent generator, an electrophilic agent generator or a triplet oxygen. The color-erasing agent precursor is more preferably a radical generator, an acid generator, or a base generator.

In this case, the color-erasable dye and the color-erasing agent precursor constitute the interference fringe-recording component.

Also in any case, there is more preferably included a binder polymer, of which examples include those described in the aforementioned (1) polymerization reaction and those described in Japanese Patent Application No. 2004-238077.

In the following, there will be given a detailed description, in the "dye color erasing reaction method", on the color-erasable dye employed for forming a refractive index difference between light parts and dark parts of the interference fringes.

In the aforementioned method (A), as the color-erasable dye also serves as the sensitizing dye, preferred examples of the color-erasable dye can be those of the aforementioned sensitizing dye. The sensitizing dye or the color-erasable dye preferably has $\lambda_{max}$ within a wavelength region from a wavelength of the hologram recording light to a wavelength shorter than the wavelength of the hologram recording light by 100 nm.

On the other hand, the aforementioned method (B) utilizes a color-erasable dye in addition to a sensitizing dye. In this case, the color-erasable dye preferably has a molar absorption coefficient of 1,000 or less at the wavelength of the hologram recording light, more preferably 100 or less, and most preferably 0. The color-erasable dye preferably has $\lambda_{max}$ within a wavelength region from a wavelength of the hologram recording light to a wavelength shorter than the wavelength of the hologram recording light by 200 nm.

In the method (B), the color-erasable dye is preferably a cyanine dye, a squarilium cyanine dye, a styryl dye, a pyrilium dye, a merocyanine dye, an arylidene dye, an oxonol dye, a coumarin dye, a pyran dye, a xanthene dye, a thioxanthene dye, a phenothiazine dye, a phenoxazine dye, a phenazine dye, a phthalocyanine dye, an azaporphiline dye, a porphiline dye, a condensed-ring aromatic dye, a perylene dye, an azomethine dye, an azo dye, an anthraquinone dye, or a metal complex dye, more preferably a cyanine dye, a styryl dye, a merocyanine dye, an arylidene dye, an oxonol dye, a coumarin dye, a xanthene dye, an azomethine dye, an azo dye or a metal complex dye.

Particularly in the case the color-erasing agent is an acid, the color-erasable dye is preferably a dissociated substance of a dissociable arylidene dye, a dissociable oxonol dye, a dissociable xanthene dye, or a dissociable azo dye, more preferably a dissociable arylidene dye, a dissociable oxonol dye, or a dissociable azo dye. A dissociable dye generally means a dye having an active hydrogen with a pKa range of about 2-14 such as —OH, —SH, —COOH, —NHSO$_2$R or —CONHSO$_2$R and showing an absorption change to a longer wavelength or a higher $\epsilon$ value by a proton dissociation. Therefore, by treating a dissociable dye with a base in advance to form a dissociated state, there can be obtained a dye with an absorption of a longer wavelength or a higher $\epsilon$ value, which can be changed by a photoacid generation to a non-dissociable type and can be color erased (absorption changed to a shorter wavelength or a lower $\epsilon$ value).

Also in the case the color-erasing agent is a base, a color developed substance of an acid-color developing dye such as a triphenyl methane dye, a xanthene dye or a fluoran dye, prepared by an acid treatment in advance, may be employed as the color-erasable dye, which can be changed by a photobase generation to a substance without a proton addition and can be color erased (absorption changed to a shorter wavelength or a lower $\epsilon$ value).

In the following, specific examples of the color-erasable dye of the invention are shown, but the present invention is not limited to such examples.

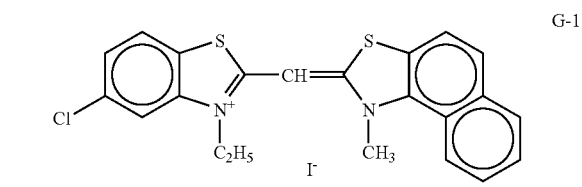

G-1

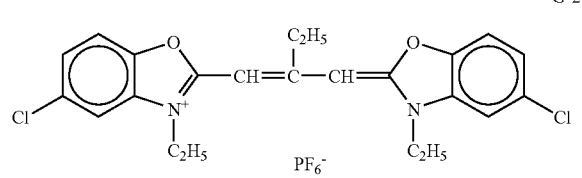

G-2

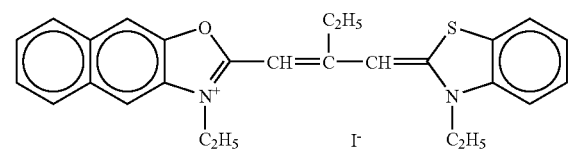

G-3

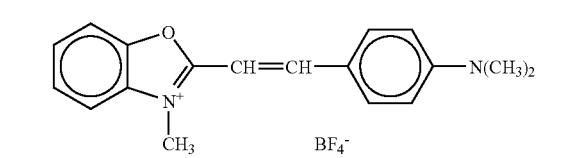

G-4

-continued
G-5
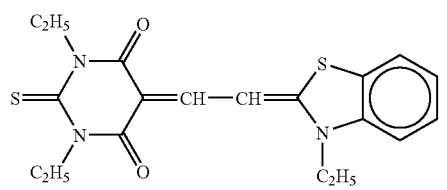
G-6
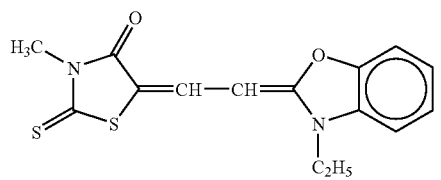
G-7
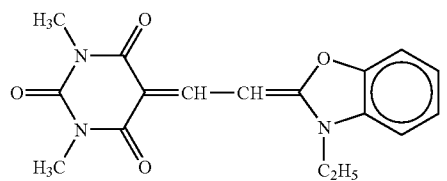
G-8
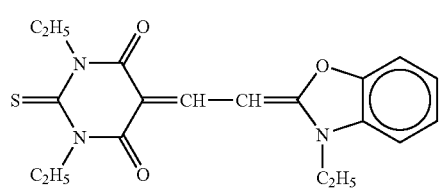
G-9
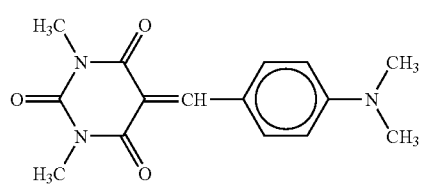
G-10
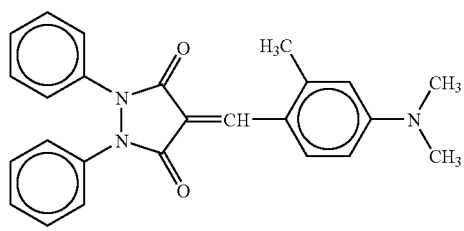
G-11
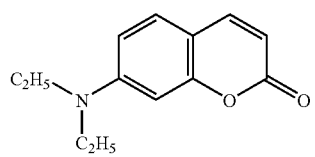
G-12
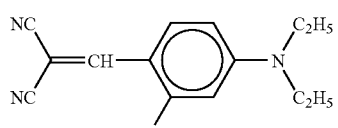
<Dissociated Member of Dissociable Dye, Color Erasable Principally with Acid>
G-13
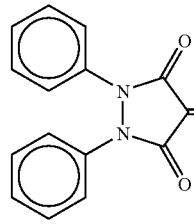
G-14
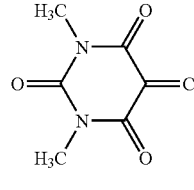
G-15
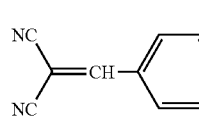
G-16
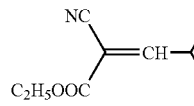
G-17
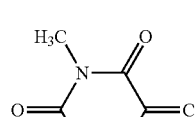
G-18
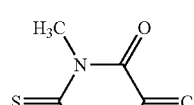
G-19
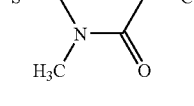
G-20
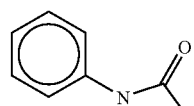
G-21
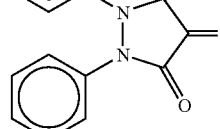

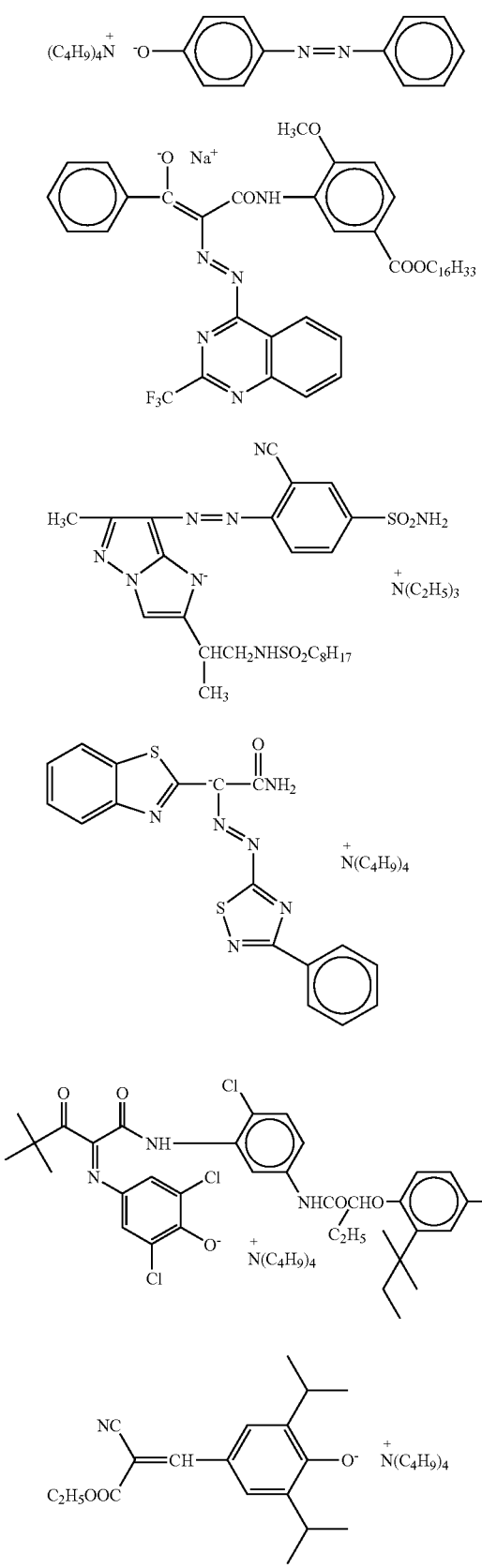
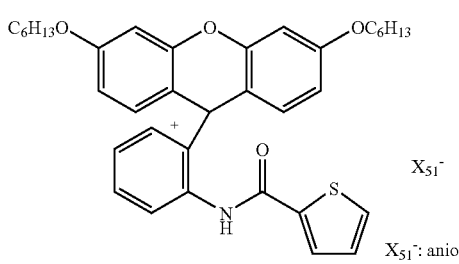
<Color Developed Substance of Acid-Color Developable Dye, Color Erasable Principally with Base>
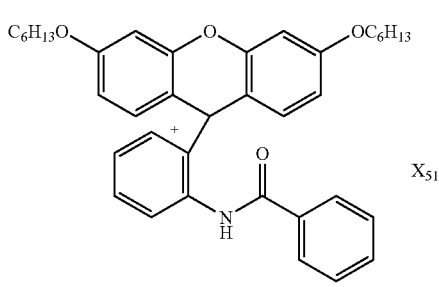
$X_{51}^-$: anion
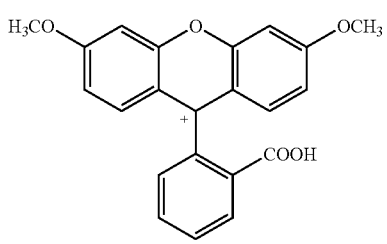
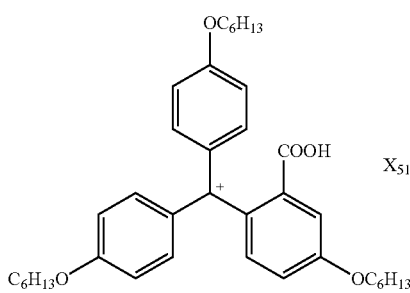

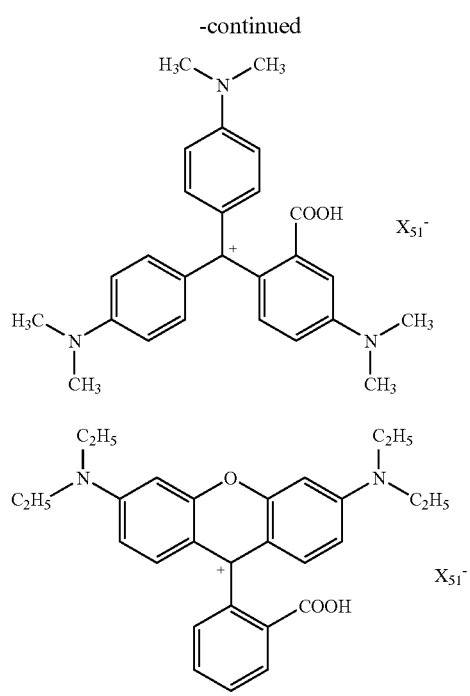

G-33

G-34

<Acid-Color Developed Substance of Cyanine Base, Color Erasable Principally with Base>

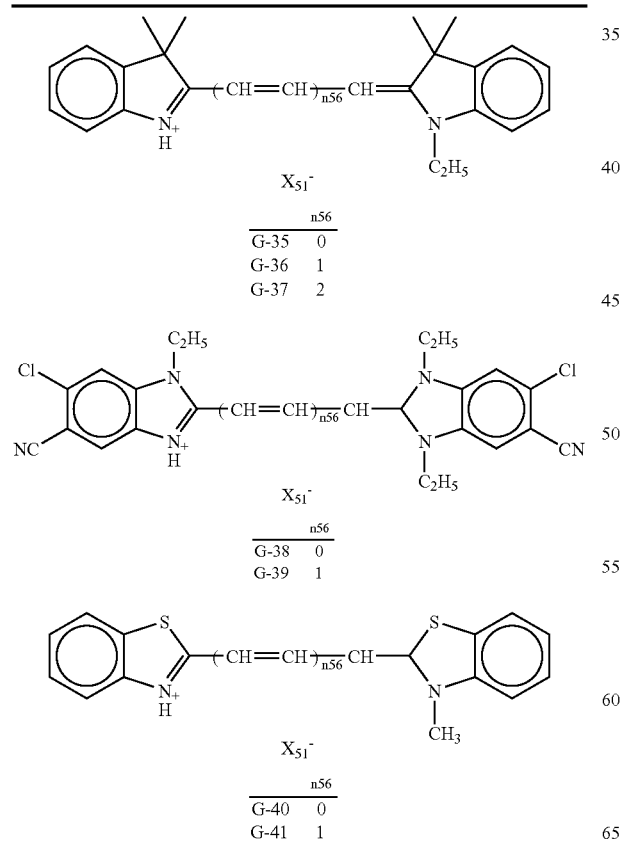

| | n56 |
|---|---|
| G-35 | 0 |
| G-36 | 1 |
| G-37 | 2 |

| | n56 |
|---|---|
| G-38 | 0 |
| G-39 | 1 |

| | n56 |
|---|---|
| G-40 | 0 |
| G-41 | 1 |

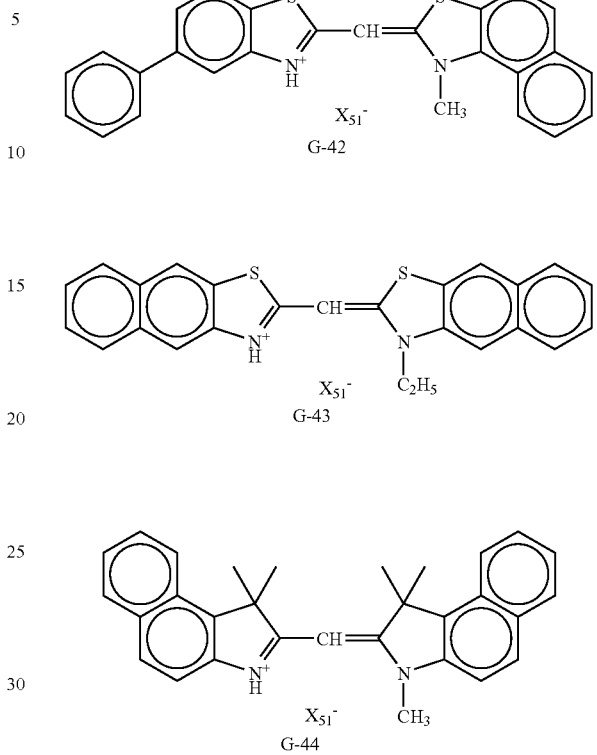

G-42

G-43

G-44

G-45

G-46

Also as the color-erasable dye of the invention, there can also be employed following color-erasable dyes in which a bond is cleaved by an electron transfer from an excited state of the sensitizing dye generated by the holographic exposure, thereby causing a color erasure.

Such color-erasable dye is originally a cyanine dye, which changes to a cyanine base (leucocyanine dye) by a bond cleavage by an electron transfer, thereby causing an erasure of an absorption or a shift to a shorter wavelength thereof.

<Color Erasure by Bond Cleavage by Electron Transfer>

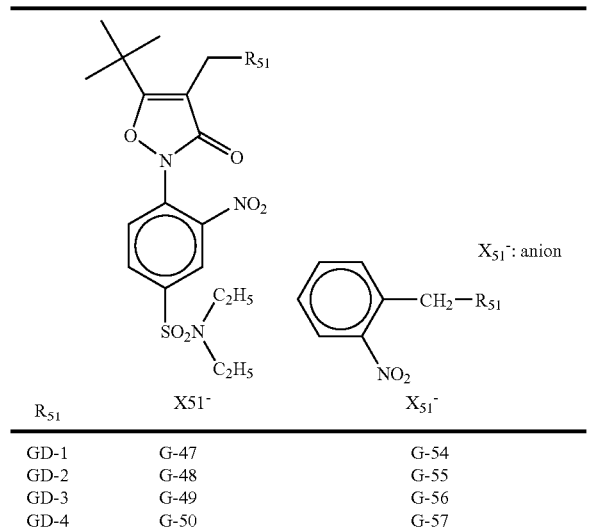

| $R_{51}$ | $X_{51}^-$ | $X_{51}^-$ |
|---|---|---|
| GD-1 | G-47 | G-54 |
| GD-2 | G-48 | G-55 |
| GD-3 | G-49 | G-56 |
| GD-4 | G-50 | G-57 |
| GD-5 | G-51 | G-58 |
| GD-6 | G-52 | G-59 |
| GD-7 | G-53 | G-60 |

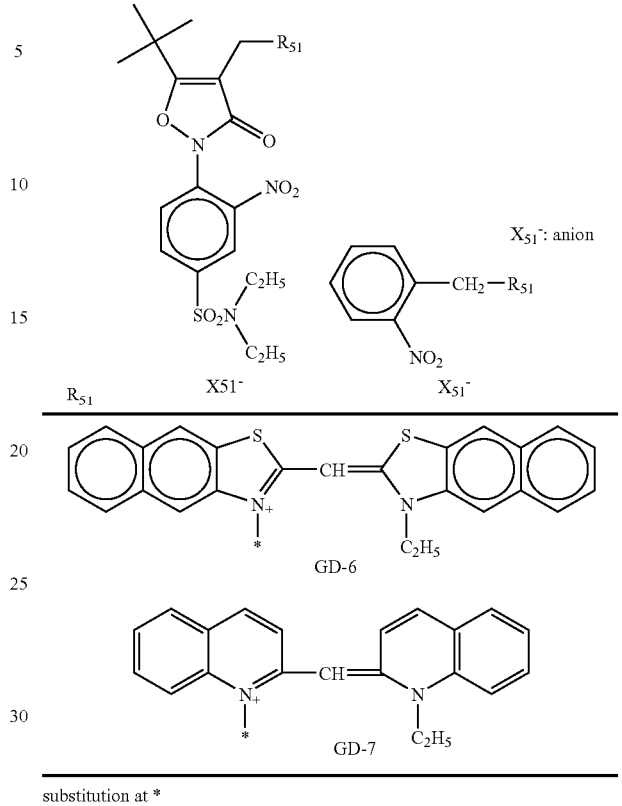

substitution at *

In the case the color-erasing agent precursor is an acid generator, preferred examples thereof can be those for the aforementioned cationic polymerization initiator. Also in the case it is a radical generator, preferred examples thereof can be those for the aforementioned radical polymerization initiator. In the case it is a base generator, preferred examples thereof can be those for the aforementioned anionic polymerization initiator.

Preferred examples of the dye color erasing reaction can be those described in Japanese Patent Application No. 2004-88790.

7) Interference Fringe Recording by a Latent Image-Sensitized Polymerization Reaction Sensitized by a Latent Image of a Residual of a Color-Erasable Dye (a Residual Color-Erasable Dye)

It is a hologram recording method characterized by including at least a first step in which a sensitizing dye having an absorption at a wavelength of holographic exposure absorbs light upon the holographic exposure thereby generating an excited state thereof, and performs, utilizing an excitation energy thereof, a color erasure of a color-erasable dye having a molar absorption coefficient of 1,000 or less at a wavelength of a hologram reproducing light, preferably 100 or less and most preferably 0, thereby forming a latent image of the residual color-erasable dye which is not color erased, and a second step of irradiating the latent image of the residual color-erasable dye with light of a wavelength region, which is different from that of the holographic exposure, to cause a polymerization thereby recording interference fringes providing a refractive index modulation, and the method is superior in a high-speed recording, a multiplex recordability and a storability after recording.

There is also preferred a hologram recording method characterized by including at least a first step in which a sensitizing dye having an absorption at a wavelength of holographic exposure absorbs light upon the holographic exposure thereby generating an excited state, and performs an energy transfer or an electron transfer with the color-erasing agent precursor described in 6), thereby generating, from the color-erasing agent precursor, a color-erasing agent which erases the color-erasable dye thereby forming a latent image of the residual color-erasable dye which is not color erased, and a second step of irradiating the latent image of the residual colorerasable dye with light of a wavelength region, which is different from that of the holographic exposure, to activate a polymerization initiator by an energy transfer or an electron transfer thereby causing a polymerization and recording interference fringes providing a refractive index modulation.

Also a group of compounds capable of performing such hologram recording method preferably includes at least:
1) a sensitizing dye capable of absorbing light upon holographic exposure in the first step thereby generating an excited state;
2) a color-erasable dye having a molar absorption coefficient of 1,000 or less at a wavelength of a hologram reproducing light, capable of a color erasure as a result, in the first step, of an electron transfer directly from the excited state of the sensitizing dye or of generation of the color-erasing agent by an energy transfer to the color-erasing agent precursor;
3) a polymerization initiator (eventually serving also as the color-erasing agent precursor in 2)) capable of initiating a polymerization of a polymerizable compound by an electron transfer or an energy transfer in the second step from an excited state of the residual color-erasable dye;
4) a polymerizable compound; and
5) a binder.

In the case of performing an energy transfer or an electron transfer to the color-erasing agent precursor in 2), there is preferably included also:
6) a color-erasing agent precursor capable of generating a color-erasing agent by an electron transfer or an energy transfer from the excited state of the sensitizing dye in the first step.

In this case, components 2)-6) constitute the interference fringe-recording components.

Preferred examples of the sensitizing dye are same as those described in 2) color developing reaction.

Preferred examples of the polymerization initiator, the polymerizable compound and the binder are same as those described in 1) polymerization reaction.

In the wavelength region of the irradiating light in the second step, the sensitizing dye more preferably has a molar absorption coefficient of linear absorption of 1000 or less, further preferably 500 or less.

Also in the wavelength region of the irradiating light in the second step, the color-erasable dye preferably has a molar absorption coefficient of 1000 or higher.

In the "latent image-sensitized polymerization reaction sensitized by a latent image of a residual color-erasable dye" of the invention, it is also preferable that the color-erasing agent precursor and the polymerization initiator are partly or entirely same and serve for both functions.

In the case of adding a color-erasable dye in addition to the sensitizing dye and in the case the color-erasing agent precursor is different from the polymerization initiator (for example the color-erasing agent precursor being an acid generator or a base generator, and the polymerization initiator being a radical polymerization initiator, or the color-erasing agent precursor being a radical generator or a nucleophilic agent generator, and the polymerization initiator being an acid generator or a base generator), it is preferable that the sensitizing dye is capable of performing a sensitization by an electron transfer only to the color-erasing agent precursor and that the polymerization initiator can be sensitized by an electron transfer only by the color-erasable dye.

In the hologram recording method of the invention and the hologram recording material capable of such a hologram recording method, it is preferable, for the storability and for the non-destructive reproduction, to perform a fixation by decomposing the sensitizing dye in any one of the first step, the second step and a subsequent fixing step by a light irradiation and/or a heat application, and more preferably to perform a fixation by decomposing the sensitizing dye in any one of the first step, the second step and the subsequent fixing step by a light irradiation and/or a heat application, and decomposing the residual color-erasable dye in any one of the second step and the subsequent fixing step by a light irradiation and/or a heat application.

In the following, there will be explained the concept of "latent image-sensitized polymerization reaction sensitized by a latent image of a residual color-erasable dye".

As an example, a light of 532 nm of a YAG-SHG laser irradiates a hologram recording material and is absorbed by the sensitizing dye to generate an excited state. An energy transfer or an electron transfer is caused from the excited state of the sensitizing dye to the color-erasing agent precursor to generate a color-erasing agent, thereby causing a color erasure of the color-erasable dye. As a result, a latent image is formed by the residual color-erasable dye (foregoing being first step). Then a light of a wavelength region of 350-420 nm is irradiated to cause an absorption in the latent image of the residual color-erasable dye, thereby causing an electron transfer or an energy transfer to the polymerization initiator, thus inducing an activation thereof and initiating a polymerization reaction. A part where the polymerization takes place shows a low refractive index because of a localization of the polymerizable compound, in the case the polymerizable compound has a refractive index smaller than that of the binder (foregoing being second step). In light parts of the interference in the first step, the residual color-erasable dye constituting the latent image is present in a low amount, so that the polymerization does not proceed much in the second step and a ratio of the binder becomes higher. As a result, a large modulation in the refractive index can be formed between light part and dark part of the interference thereby enabling a recording of interference fringes. A hologram recording material excellent in a non-destructive reproducibility and a storability can be obtained by decomposing and color-erasing of the sensitizing dye and the residual color-erasable dye in the first step, the second step or the subsequent fixing step.

The hologram recording material thus recorded, when irradiated again with the laser light of 532 nm, can reproduce the recorded information or image or can function as a desired optical material.

Preferred examples of the latent image-sensitized polymerization reaction sensitized by a latent image of a residual color-erasable dye include those described in Japanese Patent Application No. 2004-88790.

The hologram recording material of the invention may include, in addition to the sensitizing dye, the interference fringe-recording component, the polymerization initiator, the polymerizable compound, the binder, the color-erasable dye, and the color-erasing agent precursor described in the foregoing, additives if necessary, such as an electron-donating compound, an electron-accepting compound, a chain transfer agent, a crosslinking agent, a thermal stabilizer, a plasticizer, a solvent and the like.

An electron-donating compound has an ability of reducing a radical cation of the sensitizing dye or the color developed substance, while an electron accepting compound has an ability of oxidizing a radical anion of the sensitizing dye or the color developed substance, and both have a function of regenerating the sensitizing dye or the color developed substance. Preferred examples include those described in Japanese Patent Application No. 2004-238077.

In particular, an electron-donating compound is useful for achieving a high sensitivity, as it can promptly regenerate the sensitizing dye or the radical cation of the color developed substance after the electron transfer to the dye precursors. The electron-donating compound preferably has an oxidation potential baser than that of the sensitizing dye and the color developed substance. In the following, there are shown preferred examples of the electron-donating compound, but the present invention is not limited to such examples.

<Examples of Electron-Donating Compound for Regenerating Sensitizing Dye>

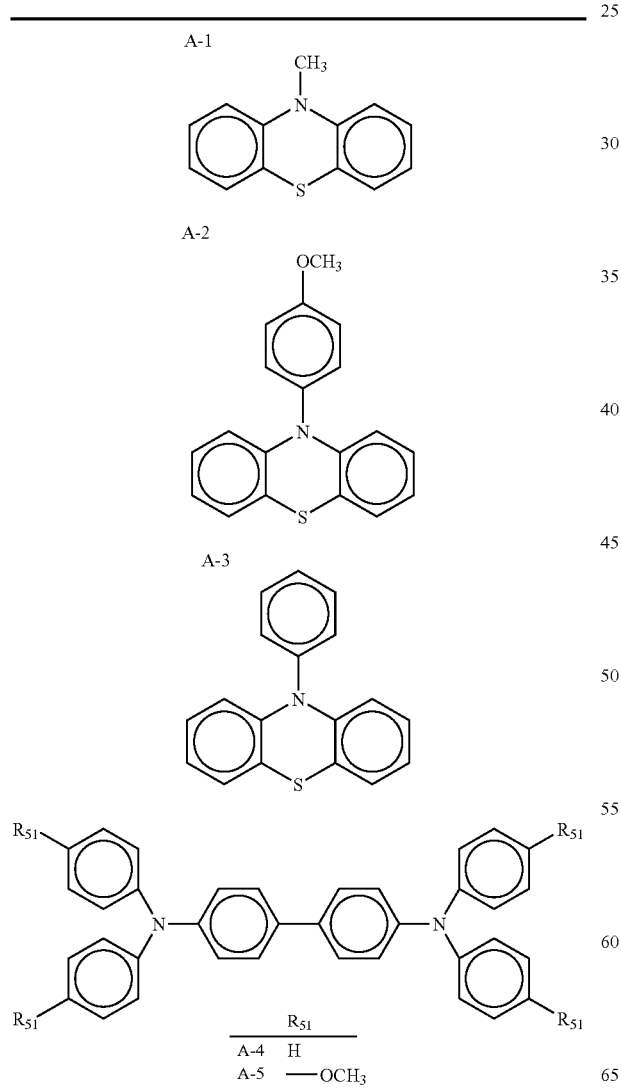

-continued

A-14

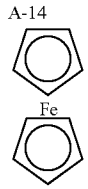

For the electron-donating compound, there is preferred a phenothiazine compound (such as 10-methylphenothiazine, or 10-(4'-methoxyphenyl)phenothiazine), a triphenylamine compound (such as triphenylamine, or tri(4'-methoxyphenyl) amine), or a TPD compound (such as TDP), more preferably a phenothiazine compound and most preferably N-methylphenothiazine.

Preferred examples of the chain transfer agent, crosslinking agent, thermal stabilizer, plasticizer, solvent and the like are those described in Japanese Patent Application No. 2004-238392.

The chain transfer agent is preferably a thiol, such as 2-mercaptobenzoxazol, 2-mercaptobenzthiazole, 2-mercaptobenzimidazole, 4-methyl-4H-1,2,4-triazole-3-thiol, p-bromobenzenethiol, thiocyanuric acid, 1,4-bis(mercaptomethyl) benzene, or p-toluenethiol.

In particular, the chain transfer agent is advantageously employed in the case the polymerization initiator is 2,4,5-triphenylimidazolyl dimer.

In the hologram recording material of the invention, a thermal stabilizer may be added for improving storability in storage.

A useful thermal stabilizer can be hydroquinone, phenidone, p-methoxyphenol, an alkyl- or aryl-substituted hydroquinone or quinone, cathecol, t-butylcathecol, pyrogallol, 2-naphthol, 2,6-di-t-butyl-p-cresol, phenothiazine, or chloranile.

A plasticizer is employed for varying various mechanical properties such as an adhesion property, a flexibility, a hardness and the like of the hologram recording material. The plasticizer can be, for example, triethylene glycol dicaprylate, triethylene glycol bis(2-ethylhexanoate), tetraethylene glycol diheptanoate, diethyl sebacate, dibutyl suberate, tris(2-ethylhexyl) phosphate, tricresyl phosphate, dibutyl phthalate, an alcohol or a phenol.

The hologram recording material of the invention can be prepared by an ordinary method.

For example, the hologram recording material of the invention can be prepared by a film forming method such as dissolving the binder and the components in a solvent and coating such solution with a spin coater or a bar coater.

A preferred solvent in such operation can be, for example, a ketone solvent such as methyl ethyl ketone, methyl isobutyl ketone, acetone, or cyclohexanone; an ester solvent such as ethyl acetate, butyl acetate, ethylene glycol diacetate, ethyl lactate, or cellosolve acetate; a hydrocarbon solvent such as cyclohexane, toluene or xylene; an ether solvent such as tetrahydrofuran, dioxane or diethyl ether; a cellosolve solvent such as methyl cellosolve, ethyl cellosolve, butyl cellosolve, or dimethyl cellosolve; an alcohol solvent such as methanol, ethanol, n-propanol, 2-propanol, n-butanol, or diacetone alcohol; a fluorinated solvent such as 2,2,3,3-tetrafluoropropanol; a halogenated hydrocarbon solvent such as dichloromethane, chloroform or 1,2-dichloroethane; an amide solvent such as N,N-dimethylformamide; or a nitrile solvent such as acetonitrile or propionitrile.

The hologram recording material of the invention can be directly coated on a substrate by a spin coater, a roll coater or a bar coater, or cast as a film and laminated on a substrate by an ordinary method, thereby forming a hologram recording material.

The "substrate" means an arbitrary natural or synthetic support member, preferably such member that can assume a form of a flexible or rigid film, sheet or plate.

The substrate is preferably polyethylene terephthalate, polyethylene terephthalate undercoated with a resinous material, polyethylene terephthalate subjected to a flame treatment or an electrostatic discharge treatment, cellulose acetate, polycarbonate, polymethyl methacrylate, polyester, polyvinyl alcohol or glass.

The employed solvent may be eliminated by evaporation in a drying operation. The elimination by evaporation may be performed by heating or under a reduced pressure.

The hologram recording material of the invention may also be formed into a film by melting a binder, containing the components, at a temperature equal to or higher than a glass transition temperature or a melting temperature of the binder and performing a melt extrusion or an injection molding. In such case, the film strength may be increased by employing a reactive crosslinking binder and curing the film by a crosslinking after the extrusion or molding. In such a case, for the crosslinking reaction, there can be utilized a radical polymerization reaction, a cationic polymerization reaction, a condensation polymerization reaction, or an addition polymerization reaction. Also there can be utilized methods described in JP-A-2000-250382 and JP-A-2000-172154.

Also there can be advantageously employed a method of dissolving the components in a monomer solution for forming a binder, and thermally or optically polymerizing the monomer to obtain a polymer serving as the binder. Also for such polymerization, there can be utilized a radical polymerization reaction, a cationic polymerization reaction, a condensation polymerization reaction, or an addition polymerization reaction.

On the hologram recording material, a protective layer may be provided for intercepting oxygen. The protective layer can be formed by adhering a plastic film or plate for example of a polyolefin such as polypropylene or polyethylene, polyvinyl chloride, polyvinylidene chloride, polyvinyl alcohol, polyethylene terephthalate or cellophane by an electrostatic adhesion or by a lamination by an extruder, or by coating a solution of such polymer. Also a glass plate may be adhered. Also an adhesive material or a liquid material may be provided, for the purpose of improving the air tightness, between the protective layer and the photosensitive film and/or between the substrate and the photosensitive film.

In the case of employing the hologram recording material of the invention for a holographic memory, the hologram recording material is preferably free from a shrinkage between before and after the hologram recording, in order to improve an S/N ratio at the signal reproduction.

For this purpose, in the hologram recording material of the invention, there can be advantageously employed an inflating agent described in JP-A-2000-86914 or a binder resistant to shrinkage described in JP-A-2000-250382, JP-A-2000-172154 and JP-A-11-344917.

It is also preferable to regulate the spacing of the interference fringes by employing a diffusing element described for example in JP-A-3-46687, JP-A-5-204288 and JP-A-9-506441.

In the case of a multiplex recording with an ordinary known polymer as described in JP-A-6-43634, JP-A-2-3082, JP-A-3-50588, JP-A-5-107999, JP-A-8-16078, JP-T-2001-523842 and JP-T-11-512847, the recording in a latter stage of the multiplex recording is performed in a portion where the polymerization has already proceeded considerably, thereby requiring a longer exposure time (a lower sensitivity) for recording a same signal, in comparison with an initial stage of the multiplex recording, thus creating a serious difficulty in the system design. Stated differently, a very narrow range of linear increase of the refractive index modulation as a function of the exposure amount has been a major difficulty.

On the other hand, the recording method of the present invention by 2) a color developing reaction, 3) a color developing reaction amplified by a self-sensitization with a color developed substance of a color developing-latent image, or 6) a color erasing reaction of a dye, does not involve a polymerization in the interference fringe recording, and the recording method by 4) a polymerization reaction sensitized with a color developed substance of a color developing-latent image or 7) a latent image-sensitized polymerization reaction sensitized by a latent image of a residual color-erasable dye scarcely involves a polymerization reaction in the holographic exposure (first step) and performs a refractive index modulation by a collective polymerization by the flush exposure in the second step. Therefore, in any of the methods of 2)-4), the multiplex recording can be performed by a large number of times and with a constant exposure amount in any recording operation (i.e., each holographic exposure), namely with a linear increase of the refractive index modulation as a function of the exposure amount, thereby enabling to obtain a wide dynamic range. Thus, the recording methods of 2)-4), 6) and 7) of the invention, utilizing a color developing process or a latent image amplifying process, are very advantageous for the multiplex recordability as described above.

Such property is also advantageous for achieving a high density (high capacity), a simplification of a recording system and an improvement in S/N ratio.

Also the sensitizing dye meeting the requirements of the present invention allows to obtain a high transmittance for a recording light and a high sensitivity even in a thick hologram recording material of a film thickness of 100 μm or larger, or even 500 μm or larger, thereby providing a novel recording material and a novel recording method which can fundamentally resolve the aforementioned drawbacks and particularly can realize a high sensitivity, a satisfactory storability, a dry processability and a multiplex recordability (high recording density) at the same time. In particular, there is attained, in a high-density optical recording medium (holographic memory), an increase in the recording density by multiplex recording of a large number.

The hologram recording material of the invention is applicable, in addition to the optical recording medium, also to a three-dimensional display hologram, a holographic optical element (HOE such as a head-up display (HUD) for an automobile, a pickup lens for an optical disk, a head-mount display, a color filter for a liquid crystal display, a reflecting plate for a reflective liquid crystal display, a lens, a diffraction grating, an interference filter, a coupler for an optical fiber, a photodeflector for a facsimile, and a window pane material for a building), a front cover of books and magazines, a display such as POP, a gift item, or also a credit card, a banknote, a package, etc. for the purpose of antiforging.

EXAMPLES

In the following there will be shown examples of the present invention based on experimental results, but the invention is not limited to such examples.

Example 1

Hologram Recording Method by Polymerization Method

A sensitizing dye DEAW (compound S-31), described in JP-A-6-43634, example 1, has a molar absorption coefficient of 17,600 at 532 nm in a film of a composition of the example 1, and is therefore not included in the present invention for a hologram recording wavelength of 532 nm. However, the S-31 can become a sensitizing dye meeting the requirements of the invention at a suitable hologram recording wavelength other than 532 nm.

On the other hand, cyanine sensitizing dyes S-92 and S-93 in the composition film of the example 1 respectively have molar absorption coefficients of 2,800 and 1,400 and therefore constitute sensitizing dyes meeting the requirements of the invention for a hologram recording wavelength of 532 nm.

As described in JP-A-6-43634, example 1, there were employed a radical polymerization initiator I-2 by 1.20 mass %, a chain transfer agent MBO by 1.80 mass %, a monomer POEA by 46.5 mass %, cellulose acetate butyrate CAB531-1 as a binder by 50.5 mass %. A sensitizing dye DEAW, S-92 or S-93 was employed, by a calculation in a molar concentration so as to obtain a transmittance of 80% at 500 μm and at a hologram recording wavelength of 532 nm and by multiplication with the molecular weight, and used in a respective amount of 0.0046, 0.035 or 0.065 mass % with respect to the aforementioned solids. These components were dissolved in methylene chloride of a triple amount (2-butanone and acetone employed in combination when necessary) to obtain compositions for the hologram recording material of Comparative Example 1 and Samples 101, 102 of the invention.

Similarly, as in JP-A-6-43634, example 1, there were employed a radical polymerization initiator I-2 by 1.20 mass %, a chain transfer agent MBO by 1.80 mass %, a monomer POEA by 46.5 mass %, cellulose acetate butyrate CAB531-1 as a binder by 50.5 mass %. A sensitizing dye DEAW, S-92 or S-93 was employed, at a fixed molar concentration of 1.42 mmol/l, in a respective amount of 0.057 mass %, 0.069 mass % or 0.065 mass % (corresponding to the sample 102) with respect to the aforementioned solids. These components were dissolved in methylene chloride of a triple amount (2-butanone and acetone employed in combination when necessary) to obtain compositions for the hologram recording material of Comparative Example 2 and Samples 103, 102 of the invention. The Comparative Example 2, and the Samples 103, 102 of the invention respectively had a transmittance at a film thickness of 500 μm of 6%, 63% and 80%.

Each of the compositions for the hologram recording material of Comparative Example 1, Samples 101, 102 of the invention, Comparative Example 2 and Sample 103 of the invention was coated (coated plural times if necessary) on a glass substrate with a blade so as to obtain a thickness of about 500 μm thereby forming a photosensitive layer, and the solvent was evaporated by drying at 40° C. for 3 minutes. Then the photosensitive layer was covered with a TAC film (cellulose triacetate film) to obtain hologram recording materials of Comparative Example 1, Samples 101, 102 of the invention, Comparative Example 2 and Sample 103 of the invention.

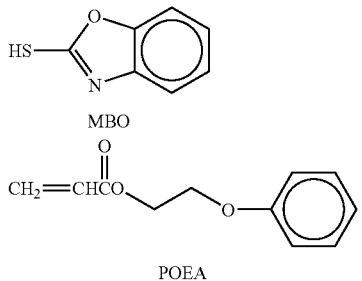

The hologram recording material was recorded by an exposure on a two-beam optical system for transmission hologram recording as shown in the FIGURE, utilizing a second harmonic wave of a YAG laser (532 Nm, output 2 W) as a light source. An angle between the object light and the reference light was 30°. The beam had a diameter of 0.6 cm and an intensity of 8 mW/cm$^2$, and the exposure was made by changing the exposure time within a range of 0.1 to 200 seconds (irradiation energy within a range of 1.2-1600 mJ/cm$^2$). During the holographic exposure, a He—Ne laser beam of 632 Nm was passed at Bragg's angle through the center of the exposure area, and a ratio of the diffracted light to the incident light (relative diffraction efficiency) was measured on real-time basis.

In comparison with the Comparative Example 1 of the hologram recording material in which an exposure energy, corresponding to a half of the maximum diffraction efficiency, was taken as 1, the Samples 101 and 102 of the invention having a transmittance of 80% at a thickness of 500 μm showed an exposure energy respectively of 0.34 and 0.21, smaller than in Comparative Example 1 and indicating higher sensitivities. It was therefore found that the sensitizing dye meeting the requirements of the invention had a higher sensitivity than in the sensitizing dye already known in the polymerization process (photopolymer process) and not meeting the requirements of the invention. Also the relative diffraction efficiency in these samples was respectively 91, 92 and 92%, and was advantageously as high as in Comparative Example 1.

Also in comparison with the Comparative Example 1 of the hologram recording material in which an exposure energy, corresponding to a half of the maximum diffraction efficiency, was taken as 1, the Comparative Example 2 and the Samples 103 and 102 of the invention having a same molar concentration of the sensitizing dye showed an exposure energy respectively of 2.2, 0.37 and 0.21. Thus, while the Samples 103, 102 of the invention had a high sensitivity with a lower exposure energy, the Comparative Example 2 showed a lower sensitivity than in the Comparative Example 1. Also the relative diffraction efficiency was respectively 35%, 92% and 92%, indicating high values for the Samples 103, 102 of the invention but a significant loss for the Comparative Example 2.

This is because the sensitizing dye S-92 or S-93 of the invention, showing a small molar absorption coefficient at 532 nm, remains within the preferable transmittance range of the invention even in a thick film as large as 500 μm, while DEAW (S-31) having a large molar absorption coefficient at 532 nm results in an excessively high absorption at 532 nm when added in a same molar concentration as S-92 or S-93, thereby significantly reducing the transmittance out of the preferred transmittance range of the invention.

It was thus clarified that a hologram recording was made possible with a higher sensitivity and a higher diffraction efficiency, by employing the sensitizing dye which meets the requirements of the invention on the molar absorption coefficient in the hologram recording wavelength in the hologram recording material so as to satisfy the condition for the preferred transmittance of the invention, in comparison with the sensitizing dye known in the polymerization process (photopolymer process) and not meeting the requirements of the invention.

Also similar effects could be obtained by changing the sensitizing dye to S-1, S-6, S-11, S-23, S-71, S-75, S-81, S-88, S-91, S-94, S-95, or S-96.

Example 2

Hologram Recording Method by Color Developing Method

In a color developing method of the invention shown in the following, a sensitizing dye DEAW (compound S-31), described in JP-A-6-43634, example 1, has a molar absorption coefficient of 18,300 at 532 nm in a film of a composition of the example 1, and is therefore not included in the present invention for a hologram recording wavelength of 532 nm. However, the S-31 can become a sensitizing dye meeting the requirements of the invention at a suitable hologram recording wavelength other than 532 nm.

Also a sensitizing dye S-67, described in JP-A-11-512847, example 1, has a molar absorption coefficient of 13,000 at 532 nm in a film of a composition of the example 1, and is therefore not included in the present invention for a hologram recording wavelength of 532 nm. However, the S-67 can also become a sensitizing dye meeting the requirements of the invention at a suitable hologram recording wavelength other than 532 nm.

On the other hand, cyanine sensitizing dyes S-92 and S-93 in the composition film of the example 1 of JP-A-6-43634 respectively have molar absorption coefficients of 2,600 and 1,300 and therefore constitute sensitizing dyes meeting the requirements of the invention for a hologram recording wavelength of 532 nm. Also S-92 and S-93 in the hologram recording material have $\lambda_{max}$ at 500 nm and 493 nm, which are shorter than the hologram recording wavelength of 532 nm respectively by 32 nm and 39 nm, and have a molar absorption coefficient at 532 nm corresponding to $1/53$ and $1/106$ of the molar absorption coefficient at respective $\lambda_{max}$, thereby satisfying all the requirements for the preferred sensitizing dye in the invention.

Compositions 201-204 for the hologram recording material and compositions 21-24 for Comparative Examples were prepared by dissolving, under a red light, a sensitizing dye, an electron-donating compound, an interference fringe-recording component, an additive, and a binder PMMA-EA (poly (methyl methacrylate-5% ethyl acrylate) copolymer, Mw: 101,000) in methylene chloride of 2-4 times amount (in combination with acetone and acetonitrile if necessary) as shown in Table 1. In Table 1, percentage is represented by mass % to the binder PMMA-EA.

Also each sample was added with a sensitizing dye so as to obtain a transmittance of 71% at a film thickness of 500 μm.

TABLE 1

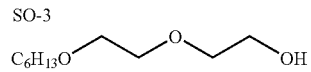

SO-3

| Sample | Sensitizing dye | Electron-donating compound | Interference fringe-recording component | Additive |
| --- | --- | --- | --- | --- |
| 201 | S-92 0.053% | A-1 42% | I-5 50% + L-2 10% | SO-3 8% |
| 202 | S-93 0.10% | " | " | " |
| Comp. Ex. 21 | S-31 0.0062% | " | " | " |
| Comp. Ex. 22 | S-67 0.0093% | " | " | " |
| 203 | S-93 0.082% | " | PB-2 20% + DD-33 10% | – |
| Comp. Ex. 23 | S-31 0.0051% | " | " | – |
| 204 | S-93 0.084% | " | E-4 25% | trioctyl-amine 10% |
| Comp. Ex. 24 | S-31 0.0052% | " | " | " |

Each of the sample compositions 201-204 for the hologram recording material and the comparative samples 21-24 was coated (coated plural times if necessary) on a glass substrate with a blade so as to obtain a thickness of about 500 μm thereby forming a photosensitive layer, and the solvent was evaporated by drying at 40° C. for 3 minutes. Then the photosensitive layer was covered with a TAC film to obtain samples 201-204 of the hologram recording materials of the invention, and Comparative Examples 21-24.

The hologram recording material was recorded by an exposure on a two-beam optical system for transmission hologram recording as shown in FIG. 1, utilizing a second harmonic wave of a YAG laser (532 Nm, output 2 W) as a light source. An angle between the object light and the reference light was 30°. The beam had a diameter of 0.6 cm and an intensity of 8 mW/cm$^2$, and the exposure was made by changing the exposure time within a range of 0.1 to 400 seconds (irradiation energy within a range of 0.8-3200 mJ/cm$^2$). During the holographic exposure, a He—Ne laser beam of 632 Nm was passed at Bragg's angle through the center of the exposure area, and a ratio of the diffracted light to the incident light (relative diffraction efficiency) was measured on real-time basis.

Table 2 shows results of evaluation of a maximum diffraction efficiency and a shrinkage on the samples 201-204 of the hologram recording materials of the invention and the Comparative Examples 21-24. The shrinkage was determined from a thickness change between before and after the exposure. Also an exposure energy, corresponding to a half of the maximum diffraction efficiency in the Comparative Example 21, was taken as 1 and was used for representing corresponding exposure amounts of the samples 201, 202 of the hologram recording material of the invention and that of the Comparative Example 22. Similarly an exposure energy, corresponding to a half of the maximum diffraction efficiency in the Comparative Example 23, was taken as 1 and was used for representing a corresponding exposure amount of the sample 203 of the hologram recording material of the invention. Also an exposure energy, corresponding to a half of the maximum diffraction efficiency in the Comparative Example 24, was taken as 1 and was used for representing a corresponding exposure amount of the sample 204 of the hologram recording material of the invention.

Thus, a smaller value means a higher sensitivity. Also results on a hologram recording material of a radical polymerized photopolymer process of the Comparative Example 1 in Example 1 (JP-A-6-43634, example 1) are also shown.

TABLE 2

| Sample | Max. Diffraction efficiency η | Shrink rate | Exposure amount (invention/comp. Ex.) |
| --- | --- | --- | --- |
| 201 | 88 | <0.01% | 0.20 (sensitivity 5 times) |
| 202 | 89 | " | 0.17 (sensitivity 5.9 times) |
| 21 (Comp. Ex.) | 82 | " | |
| 22 (Comp. Ex.) | 79 | " | 1.10 (sensitivity 0.91 times) |
| 203 | 86 | " | 0.25 (sensitivity 4 times) |
| 23 (Comp. Ex.) | 80 | " | |
| 204 | 83 | " | 0.20 (sensitivity 5 times) |
| 24 (Comp. Ex.) | 77 | " | |
| 1 (Comp. Ex.) | 91 | 5.1% | |

Based on the results of Table 2, the known Comparative Example 1 described in JP-A-6-43634, through having a high diffraction efficiency, resulted in a large shrinkage exceeding 5% because of a photopolymer process involving a radical polymerization, and is unsuitable for a holographic memory because of an extremely lowered S/N ratio. On the other hand, the samples 201-204 of the hologram recording material of the invention and the Comparative Examples 21-24, relying on a method of hologram recording by a refractive index modulation based on a color developing reaction, without utilizing a material transfer or a polymerization, is completely different from the methods in the known hologram recording materials, and could achieve a high diffraction efficiency and an extremely low shrink rage less than 0.01% at the same time, thus being particularly suitable for a holographic memory.

Also the hologram recording materials 201-204 employing the sensitizing dyes S-92, S-93, satisfying the requirements of the invention and having a small molar absorption coefficient at the hologram recording wavelength of 532 nm, showed a sensitivity of 4-6 times, thus being favorable in the recording speed, in comparison with the Comparative Examples 21-24 which do not satisfy the requirements of the invention because of a high molar absorption coefficient at the hologram recording wavelength of 532 nm. This is presumably because the sensitizing dye could be added in a larger amount.

Also the diffraction efficiency was favorably improved in comparison with the Comparative Examples 21-24.

Also the hologram recording material of the invention showed an increase of Δn (amount of refractive index modulation in the interference fringes, calculated by Kugelnik's equation from the diffraction efficiency and the film thickness) substantially linearly with an exposure amount (mJ/cm$^2$), and is therefore advantageous for multiplex recording.

The hologram recording material of the invention was subjected to multiplex hologram recording of 50 times (i.e., 50 holographic exposures) on a same position, with an exposure amount of 1/50 of the exposure amount providing the aforementioned maximum diffraction efficiency and by changing the angle of the reference light by 0.5° each time, and it was confirmed that each object light could be reproduced by changing the irradiating angle of the reproducing light by 0.5° each time. It was thus confirmed that hologram recording material of the invention was capable of multiplex recording with a same exposure amount and had a property suitable for multiple recordings. Therefore, the hologram recording material of the invention is capable of a high-density (high-capacity) recording by such multiplex recording of a large number.

In contrast, the hologram recording material of known photopolymer system, as described for example in JP-A-643634, was identified to show a slower movement of the monomer necessary for recording because of a progressed polymerization of the photopolymer in the latter stage of the multiplex recording, thereby requiring a larger irradiating light amount for performing a same recording, in comparison with the initial stage and constituting a difficulty in increasing the level of multiplicity or the recording density.

Similar results could be obtained in the samples 201-204, by changing the sensitizing dye to S-1, S-6, S-11, S-23, S-71, S-75, S-81, S-88, S-91, S-94, S-95, or S-96.

Also similar results could be obtained in the samples 201 and 202, by changing the acid generator of the interference fringe-recording component to I-3, I-4, I-6, I-7, I-8, I-9, I-10, tris(4-methylphenyl)sulfonium tetra(pentafluorophenyl)borate, triphenylsulfonium perfluoropentanoate, bis(1-(4-diphenylsulfonium)phenyl sulfide ditriflate, dimethylphenacylsulfonium perfluorobutane sulfonate, benzoin tosylate, I-22 or I-23, or by changing, in the samples 201 and 202, the acid-color developing dye precursor of the interference fringe-recording component to L-1, L-3, LC-1, LC-4, LC-9, LC-11, LC-12 or LC-13.

Also similar results could be obtained in the sample 203 by changing the base generator of the interference fringe-recording component to PB-3, PB-4, PB-5, PB-6, PB-7, PB-8 or PB-9, or by changing, in the sample 203, the base-color developing dye precursor (non-dissociated substance of dissociable dye) to DD-1, DD-13, DD-15, DD-17, DD-22, DD-30, DD-31, DD-32, DD-34, DD-35, DD-36, DD-37 or DD-38.

Also similar results could be obtained in the sample 204 by changing the interference fringe-recording component to E-3, E-5, E-9, E-10, E-11, E-12, E-13, E-14, E-15, E-16, E-18, E-20, E-25, E-26, E-27, E-28, E-29 or E-30.

Also similar results could be obtained in the samples 201-204 by changing the electron-donating compound to A-2, A-3, A-4, A-5, A-6, A-9, A-10 or A-11.

Also similar results could be obtained in the samples 201-204 by changing the binder to polymethyl methacrylate (Mw: 996,000, 350,000, 120,000), poly(methyl methacrylate-butyl acrylate) copolymer (Mw: 75,000), polyvinyl acetal (mW: 83,000), polycarbonate or cellulose acetate butyrate.

Example 3

Hologram Recording Method by Color Erasing Method (Sensitizing Dye+Color-Erasable Dye)

In a color erasing method of the invention shown in the following, a sensitizing dye DEAW (compound S-31), described in JP-A-6-43634, example 1, has a molar absorption coefficient of 18,000 at 532 nm in a film of a composition of the example 1, and is therefore not included in the present invention for a hologram recording wavelength of 532 nm. However, the S-31 can become a sensitizing dye meeting the requirements of the invention at a suitable hologram recording wavelength other than 532 nm.

Also a sensitizing dye S-67, described in JP-A-11-512847, example 1, has a molar absorption coefficient of 14,000 at 532 nm in a film of a composition of the example 1, and is therefore not included in the present invention for a hologram recording wavelength of 532 nm. However, the S-67 can also become a sensitizing dye meeting the requirements of the invention at a suitable hologram recording wavelength other than 532 nm.

On the other hand, cyanine sensitizing dyes S-92 and S-93 in the composition film of the example 1 of JP-A-6-43634 respectively have molar absorption coefficients of 5,200 and 2,700 and therefore constitute sensitizing dyes meeting the requirements of the invention for a hologram recording wavelength of 532 nm. Also S-92 and S-93 in the hologram recording material have $\lambda_{max}$ at 501 nm and 494 nm, which are shorter than the hologram recording wavelength of 532 nm respectively by 31 nm and 38 nm, and have a molar absorption coefficient at 532 nm corresponding to 1/27 and 1/53 of the molar absorption coefficient at respective $\lambda_{max}$, thereby satisfying all the requirements for the preferred sensitizing dye in the invention.

Compositions 301-303 for the hologram recording material and compositions 31-33 for Comparative Examples were prepared by dissolving, under a red light, a sensitizing dye, an electron-donating compound, a color-erasing agent precursor, a color-erasable dye and a binder PMMA-EA (poly(m-ethyl methacrylate-5% ethyl acrylate) copolymer, Mw: 101,000) in methylene chloride of 2-4 times mass (in combination with acetone and acetonitrile if necessary) as shown in Table 3. In Table 3, percentage is represented by mass % to the binder PMMA-EA.

Also each sample was added with a sensitizing dye so as to obtain a transmittance of 56% at a film thickness of 500 μm.

TABLE 3

| Sample | Sensitizing dye | | Electron-donating compound | | Color-erasing agent precursor | | Color-erasable dye | |
|---|---|---|---|---|---|---|---|---|
| 301 | S-92 | 0.053% | A-1 | 42.0% | I-5 | 50% | G-16 | 18% |
| 302 | S-93 | 0.10% | A-1 | 42.0% | I-5 | 50% | G-28 | 18% |
| Comp. Ex. 31 | S-31 | 0.018% | A-1 | 42.0% | I-5 | 50% | G-16 | 18% |
| Comp. Ex. 32 | S-67 | 0.017% | A-1 | 42.0% | I-5 | 50% | G-16 | 18% |
| 303 | S-93 | 0.081% | A-1 | 42.0% | PB-2 | 20% | G-35 ($X_{51}$: $PF_6$) | 8% |
| Comp. Ex. 33 | S-31 | 0.015% | A-1 | 42.0% | PB-2 | 20% | G-35 | 8% |

Each of the sample compositions 301-303 for the hologram recording material and the Comparative Examples 31-33 was coated (coated plural times if necessary) on a glass substrate with a blade so as to obtain a thickness of about 500 μm thereby forming a photosensitive layer, and the solvent was evaporated by drying at 40° C. for 3 minutes. Then the photosensitive layer was covered with a TAC film to obtain samples 301-303 of the hologram recording materials of the invention, and Comparative Examples 31-33.

The hologram recording material was recorded by an exposure on a two-beam optical system for transmission hologram recording as shown in FIG. 1, utilizing a second harmonic wave of a YAG laser (532 Nm, output 2 W) as a light source. An angle between the object light and the reference light was 30°. The beam had a diameter of 0.6 cm and an intensity of 8 mW/cm$^2$, and the exposure was made by changing the exposure time within a range of 0.1 to 400 seconds (irradiation energy within a range of 0.8-3200 mJ/cm$^2$). During the holographic exposure, a He—Ne laser beam of 632 nm was passed at Bragg's angle through the center of the exposure area, and a ratio of the diffracted light to the incident light (relative diffraction efficiency) was measured on real-time basis.

Table 4 shows results of evaluation of a maximum diffraction efficiency and a shrinkage on the samples 301-303 of the hologram recording materials of the invention and the Comparative Examples 31-33. The shrinkage was determined from a thickness change between before and after the exposure. Also an exposure energy, corresponding to a half of the maximum diffraction efficiency in the Comparative Example 31, was taken as 1 and was used for representing corresponding exposure amounts of the samples 301, 302 of the hologram recording material of the invention and that of the Comparative Example 32. Similarly an exposure energy, corresponding to a half of the maximum diffraction efficiency in the Comparative Example 33, was taken as 1 and was used for representing a corresponding exposure amount of the sample 303 of the hologram recording material of the invention.

Thus, a smaller value means a higher sensitivity. Also results on a hologram recording material of a radical polymerized photopolymer process of the Comparative Example 1 in Example 1 (JP-A-6-43634, example 1) are also shown.

TABLE 4

| Sample | Max. Diffraction efficiency η | Shrink rate | Exposure amount (invention/comp. Ex.) |
|---|---|---|---|
| 301 | 91 | <0.01% | 0.24 (sensitivity 4.2 times) |
| 302 | 93 | " | 0.20 (sensitivity 5 times) |
| 31 (Comp. Ex.) | 84 | " | |
| 32 (Comp. Ex.) | 81 | " | 1.20 (sensitivity 0.83 times) |
| 303 | 86 | " | 0.33 (sensitivity 3 times) |
| 33 (Comp. Ex.) | 80 | " | |
| 1 (Comp. Ex.) | 91 | 5.1% | |

Based on the results of Table 4, the known Comparative Example 1 described in JP-A-6-43634, through having a high diffraction efficiency, resulted in a large shrinkage exceeding 5% because of a photopolymer process involving a radical polymerization, and is unsuitable for a holographic memory because of an extremely lowered S/N ratio. On the other hand, the samples 301-303 of the hologram recording material of the invention and the Comparative Examples 31-33, relying on a method of hologram recording by a refractive index modulation based on a color erasing reaction, without utilizing a material transfer or a polymerization, is completely different from the methods in the known hologram recording materials, and could achieve a high diffraction efficiency and an extremely low shrink rage less than 0.01% at the same time, thus being particularly suitable for a holographic memory.

Also the hologram recording materials 301-303 employing the sensitizing dyes S-92, S-93, satisfying the requirements of the invention and having a small molar absorption coefficient at the hologram recording wavelength of 532 nm, showed a sensitivity of 3-5 times, thus being favorable in the recording speed, in comparison with the Comparative Examples 31-33 which do not satisfy the requirements of the invention because of a high molar absorption coefficient at the hologram recording wavelength of 532 nm. This is presumably because the sensitizing dye could be added in a larger amount.

Also the diffraction efficiency was favorably improved in comparison with the Comparative Examples 31-33.

Also the hologram recording material of the invention showed an increase of Δn (amount of refractive index modulation in the interference fringes, calculated by Kugelnik's equation from the diffraction efficiency and the film thickness) substantially linearly with an exposure amount (mJ/cm$^2$), and is therefore advantageous for multiplex recording.

The hologram recording material of the invention was subjected to multiplex hologram recordings of 50 times on a same position, with an exposure amount of ⅕₀ of the exposure amount providing the aforementioned maximum diffraction efficiency and by changing the angle of the reference light by 0.5° each time, and it was confirmed that each object light could be reproduced by changing the irradiating angle of the reproducing light by 0.5° each time. It was thus confirmed that hologram recording material of the invention was capable of multiplex recording with a same exposure amount and had a property suitable for multiple recordings. Therefore, the hologram recording material of the invention is capable of a high-density (high-capacity) recording by such multiplex recording of a large number.

In contrast, the hologram recording material of known photopolymer system, as described for example in JP-A-6-43634, was identified to show a slower movement of the monomer necessary for recording because of a progressed polymerization of the photopolymer in the latter stage of the multiplex recording, thereby requiring a larger irradiating light amount for performing a same recording, in comparison with the initial stage and constituting a difficulty in increasing the level of multiplicity or the recording density.

Similar results could be obtained in the samples 301 and 302, by changing the sensitizing dye to S-1, S-6, S-11, S-23, S-71, S-75, S-81, S-88, S-91, S-94, S-95, or S-96.

Also similar results could be obtained in the samples 301 and 302, by changing the color-erasing agent precursor (acid generator, serving in certain case also as cationic or radical polymerization initiator) to I-3, I-4, I-6, I-7, I-8, I-9, I-10, tris(4-methylphenyl)sulfonium tetra(pentafluorophenyl) borate, triphenylsulfonium perfluoropentanoate, bis(1-(4-diphenylsulfonium)phenyl sulfide ditriflate, dimethylphenacylsulfonium perfluorobutane sulfonate, benzoin tosylate, I-22 or I-23, or by changing, in the samples 301 and 302, the acid-color erasing dye to G-14, G-17, G-21, G-22, G-26 or G-27.

Also similar results could be obtained in the sample 303 by changing the color-erasing agent precursor (base generator, serving also in certain cases as anionic polymerization initiator) to PB-3, PB-4, PB-5, PB-6, PB-7, PB-8 or PB-9, or by changing, in the sample 303, the base-color-erasable dye to G-29, G-32, G-38, G-40, G-42, G-43, G-44 or G-45.

Also similar results could be obtained in the samples 301-303 by changing the electron-donating compound to A-2, A-3, A-4, A-5, A-6, A-9, A-10 or A-11.

Also similar results could be obtained in the samples 301-303 by changing the binder to polymethyl methacrylate (Mw: 996,000, 350,000, 120,000), poly(methyl methacrylate-butyl acrylate) copolymer (Mw: 75,000), polyvinyl acetal (mW: 83,000), polycarbonate or cellulose acetate butyrate.

While the invention has been described in detail and with reference to specific embodiments thereof, it will be apparent to one skilled in the art that various changes and modifications can be made therein without departing from the spirit and scope thereof.

The entire disclosure of each and every foreign patent application from which the benefit of foreign priority has been claimed in the present application is incorporated herein by reference, as if fully set forth herein.

What is claimed is:

1. A hologram recording material comprising:
a sensitizing dye capable of absorbing light having a hologram recording wavelength to generate an excited state thereof; and
an interference fringe-recording component capable of recording interference fringes providing a refractive index modulation by an electron or energy transfer from the excited state,
the hologram recording material has a thickness of 500 μm or larger,
wherein the sensitizing dye in the hologram recording material comprises at least one of a cyanine dye and a merocyanine dye, and has a molar absorption coefficient within a range of 1 to 10,000 at the hologram recording wavelength; and
the interference fringe-recording component is a component capable of recording the interference fringes providing a refractive index modulation by a latent image-sensitized polymerization reaction sensitized by a latent image of a residual of a color-erasable dye, and
the component records the interference fringes by a method comprising:
a first step in which:
the sensitizing dye absorbs light upon holographic exposure to generate the excited state thereof,
a color of a color-erasable dye is erased by at least one of: an energy or electron transfer from the excited state of the sensitizing dye directly to the color-erasable dye; and a color-erasing agent formed by an energy or electron transfer from the excited state of the sensitizing dye to a color-erasing agent precursor, the color-erasing agent precursor comprising at least one of a radical generator, an acid generator, a base generator, a nucleophilic agent generator, an electrophilic agent generator or a triplet oxygen, and
a residual of the color-erasable dye forms a latent image; and
a second step of irradiating the latent image of the residual of the color-erasable dye with light of a wavelength region, which is different from that of the holographic exposure, to cause a polymerization reaction by activating a polymerization initiator as a result of an energy or electron transfer from the residual of the color-erasable dye.

2. The hologram recording material according to claim 1, wherein the sensitizing dye in the hologram recording material has a molar absorption coefficient within a range of 5 to 2,500 at the hologram recording wavelength.

3. The hologram recording material according to claim 1, wherein the sensitizing dye in the hologram recording material has an absorption maximum within a region shorter in wavelength than the hologram recording wavelength by 20 to 100 nm.

4. The hologram recording material according to claim 1, wherein the sensitizing dye in the hologram recording material has a molar absorption coefficient equal to or less than 1/10 of the molar absorption coefficient at an absorption maximum thereof.

5. The hologram recording material according to claim 1, wherein the sensitizing dye in the hologram recording material has a molar absorption coefficient equal to or less than 1/20 of the molar absorption coefficient at the absorption maximum thereof.

6. The hologram recording material according to claim 1, wherein the sensitizing dye is a cyanine dye represented by formula (1):

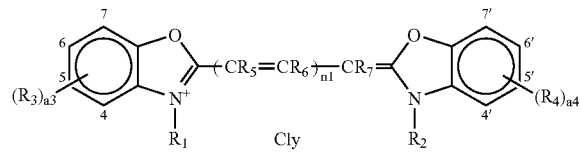

wherein $R_1$ and $R_2$ each independently represents an alkyl group, an alkenyl group, an alkynyl group or a cycloalkyl group; $R_3$ and $R_4$ each independently represents a substituent; and a3 and a4 each independently represents an integer of 0 to 4, and in a case a3 or a4 is 2 or larger, plural $R_3$s or $R_4$s are mutually same or different and may be mutually bonded to form a ring; $R_5$, $R_6$ and $R_7$ each independently represents a hydrogen atom or a substituent, and may be mutually bonded to form a ring; n1 represents an integer of 0 to 2; CI represents a charge neutralizing ion; and y represents a number required for neutralizing the charge.

7. The hologram recording material according to claim 6, wherein a3 and a4 are both zero, n1 is 1, and the hologram recording wavelength is 532 nm.

8. The hologram recording material according to claim 1, wherein the sensitizing dye is a merocyanine dye represented by formula (2):

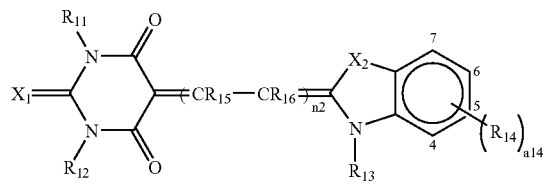

wherein $X_1$ represents O or S; $X_2$ represents —O—, —S—, —$NR_{17}$—, or —$CR_{18}R_{19}$—; $R_{11}$ and $R_{12}$ each independently represents a hydrogen atom, an alkyl group, an alkenyl group, an alkynyl group, a cycloalkyl group, an aryl group or a heterocyclic group; $R_{17}$, $R_{18}$ and $R_{19}$ each independently represents an alkyl group, an alkenyl group, an alkynyl group, a cycloalkyl group, an aryl group or a heterocyclic group; $R_{13}$ represents an alkyl group, an alkenyl group, an alkynyl group, or a cycloalkyl group; $R_{14}$ represents a substituent; a14 represents an integer of 0 to 4, and in case a14 is 2 or larger, plural $R_{14}$s are mutually same or different or may be mutually bonded to form a ring; $R_{15}$ and $R_{16}$ each independently represents a hydrogen atom or a substituent, and may be mutually bonded to form a ring; and n2 represents an integer of 0 to 2.

9. The hologram recording material according to claim 8, wherein n2 is 1, and the hologram recording wavelength is 532 nm.

10. The hologram recording material according to claim 1, which has the sensitizing dye in such an amount as to have an optical transmittance of 30 to 90% when the hologram recording material is irradiated with the light having the hologram recording wavelength.

11. The hologram recording material according to claim 1, wherein the sensitizing dye absorbs the light upon holographic exposure in the first step to generate the excited state thereof, and the hologram recording material further comprises:

a color-erasable dye capable of erasing a color thereof in the first step as a result of at least one of: an energy or electron transfer directly from the excited state of the sensitizing dye; and an generation of the color-erasing agent by an energy or electron transfer from the excited state of the sensitizing dye to the color-erasing agent precursor, the color-erasable dye having a molar absorption coefficient of 1,000 or less at a wavelength of a hologram reproducing light;

a polymerizable compound;

a polymerization initiator capable of initiating a polymerization of the polymerizable compound by an electron or energy transfer from the excited state of the residual of the color-erasable dye in the second step; and a binder.

12. The hologram recording material according to claim 1, wherein the interference fringes are unrewritable.

13. An optical recording medium comprising a hologram recording material according to claim 1.

14. The optical recording medium according to claim 13, wherein the hologram recording material is stored in a light-shielding cartridge.

15. A hologram recording method comprising recording interference fringes providing a refractive index modulation in a hologram recording material by at least one of 1) a polymerization reaction, 2) a color developing reaction, 3) a color developing reaction amplified by a self-sensitization with a color developed substance of a latent image, 4) a polymerization reaction sensitized with a color developed substance of a latent image, 5) an alignment change in a compound having a specific birefringence, and 6) a color erasing reaction of a dye, and a latent image-sensitized polymerization reaction sensitized by a latent image of a residual of a color-erasable dye, and the recording of the interference fringes comprising:

a first step in which:

the sensitizing dye absorbs light upon holographic exposure to generate the excited state thereof, a color of a color-erasable dye is erased by at least one of: an energy or electron transfer from the excited state of the sensitizing dye directly to the color-erasable dye; and a color-erasing agent formed by an energy or electron transfer from the excited state of the sensitizing dye to a color-erasing agent precursor, the color-erasing agent precursor comprising at least one of a radical generator, an acid generator, a base generator, a nucleophilic agent generator, an electrophilic agent generator or a triplet oxygen, and a residual of the color-erasable dye forms a latent image; and a second step of irradiating the latent image of the residual of the color-erasable dye with light of a wavelength region, which is different from that of the holographic exposure, to cause a polymerization reaction by activating a polymerization initiator as a result of an energy or electron transfer from the residual of the color-erasable dye, wherein the hologram recording material comprising:

a sensitizing dye capable of absorbing light having a hologram recording wavelength to generate an excited state thereof; and an interference fringe-recording component capable of recording interference fringes providing a refractive index modulation by an electron or energy transfer from the excited state, the hologram recording material has a thickness of 500 μm or larger, wherein the sensitizing dye in the hologram recording material comprises at least one of a cyanine dye and a merocyanine dye, and has a molar absorption coefficient within a range of 1 to 10,000 at the hologram recording wavelength.

16. The hologram recording method according to claims 15, wherein a multiplex hologram recording is performed by effecting the holographic exposure 10 times or more.

17. The hologram recording method according to claim 16, wherein the multiplex hologram recording is performed under a common exposure amount in each holographic exposure.

* * * * *